United States Patent
Hirasawa et al.

(10) Patent No.: US 9,203,054 B2
(45) Date of Patent: Dec. 1, 2015

(54) OPTICAL SHEET AND LIGHT EMITTING APPARATUS

(71) Applicant: Panasonic Intellectual Property Management Co., Ltd., Osaka (JP)

(72) Inventors: Taku Hirasawa, Kyoto (JP); Yasuhisa Inada, Osaka (JP); Akira Hashiya, Osaka (JP); Yoshitaka Nakamura, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/560,702

(22) Filed: Dec. 4, 2014

(65) Prior Publication Data

US 2015/0171373 A1  Jun. 18, 2015

(30) Foreign Application Priority Data

Dec. 16, 2013 (JP) .................. 2013-258969
Dec. 25, 2013 (JP) .................. 2013-267665

(51) Int. Cl.
*H01L 35/24* (2006.01)
*H01L 51/00* (2006.01)
*H01L 51/52* (2006.01)
*G02B 5/02* (2006.01)
*G02B 5/18* (2006.01)

(52) U.S. Cl.
CPC .......... *H01L 51/5268* (2013.01); *G02B 5/0252* (2013.01); *G02B 5/1866* (2013.01); *H01L 51/5275* (2013.01)

(58) Field of Classification Search
CPC .................. H01L 51/5268; G02B 5/0252

USPC ............................................ 257/40
See application file for complete search history.

(56) References Cited

U.S. PATENT DOCUMENTS

| 5,513,025 | A | 4/1996 | Watanabe et al. |
| 5,755,501 | A | 5/1998 | Shinohara et al. |
| 2007/0242475 | A1 | 10/2007 | Minobe et al. |
| 2008/0112052 | A1 | 5/2008 | Taira et al. |

(Continued)

FOREIGN PATENT DOCUMENTS

| EP | 2704527 | 3/2014 |
| JP | 10-163525 | 6/1998 |

(Continued)

OTHER PUBLICATIONS

The Extended European Search Report dated May 13, 2015 for the related European Patent Application No. 14195818.1.

(Continued)

*Primary Examiner* — David S Blum
(74) *Attorney, Agent, or Firm* — Renner, Otto, Boisselle & Sklar, LLP

(57) ABSTRACT

An optical sheet includes a light scattering layer that scatters at least a part of light incident thereon by diffraction and that includes first and second areas. Each first area is a projection. Each second area is a recess. Each of at least the projections or the recesses has a tapered shape. When a center wavelength of the light incident on the light scattering layer is $\lambda$ and a refractive index of a layer that is in contact with the light scattering layer at a light emission side is n, spatial frequency components of a pattern formed by the first and second areas have a maximum peak at a spatial frequency in a range of $0.068/(\lambda \times n)$ or more and $2.8/(\lambda \times n)$ or less.

17 Claims, 68 Drawing Sheets

(56) References Cited

U.S. PATENT DOCUMENTS

| | | |
|---|---|---|
| 2008/0304153 A1 | 12/2008 | Amako et al. |
| 2009/0008672 A1 | 1/2009 | Osawa et al. |
| 2009/0152533 A1 | 6/2009 | Chan et al. |
| 2010/0014314 A1 | 1/2010 | Inokuma et al. |
| 2010/0046236 A1 | 2/2010 | Nishiwaki |
| 2010/0188747 A1 | 7/2010 | Amako et al. |
| 2011/0180823 A1* | 7/2011 | Usami .................. 257/88 |
| 2013/0299796 A1 | 11/2013 | Masuyama et al. |
| 2014/0042426 A1 | 2/2014 | Nishimura et al. |

FOREIGN PATENT DOCUMENTS

| | | |
|---|---|---|
| JP | 2004-311419 | 11/2004 |
| JP | 2007-165596 | 6/2007 |
| JP | 2007-220970 | 8/2007 |
| JP | 2008-268339 | 11/2008 |
| JP | 2009-015305 | 1/2009 |
| JP | 2009-086613 | 4/2009 |
| JP | 2009-210750 | 9/2009 |
| JP | 2009-231257 | 10/2009 |
| JP | 2011-118327 | 6/2011 |
| JP | 2011-118328 | 6/2011 |
| WO | 2004/086821 | 10/2004 |
| WO | 2009/063636 | 5/2009 |
| WO | 2012/147759 | 11/2012 |
| WO | 2014/020901 | 2/2014 |

OTHER PUBLICATIONS

The Extended European Search Report dated Jul. 7, 2015 for the related European Patent Application No. 13826518.6.

* cited by examiner

FIG. 57D  FROM LOWER LEFT

TO UPPER RIGHT

FIG. 61D  FROM LOWER LEFT

TO UPPER RIGHT

FIG. 63D  FROM LOWER LEFT

TO UPPER RIGHT

LXIVB          LXIVB 700
500
600

FIG. 65D  FROM LOWER LEFT

TO UPPER RIGHT

INCIDENT LIGHT

US 9,203,054 B2

OPTICAL SHEET AND LIGHT EMITTING APPARATUS

This Application claims priority to Japanese Patent Applications No. 2013-258969, filed on Dec. 16, 2013 and No. 2013-267665, filed Dec. 25, 2013, the contents of each of which are hereby incorporated by reference.

BACKGROUND

1. Technical Field

The present disclosure relates to an optical sheet and a light emitting apparatus including a light scattering layer that scatters at least a part of light incident on the light scattering layer by diffraction.

2. Description of the Related Art

In general, when light tries to propagate from a medium having a high refractive index to a medium having a low refractive index, total reflection of the light occurs when the incident angle of the light is greater than a critical angle. Therefore, in a light emitting apparatus, such as an organic electroluminescence apparatus, there may be a problem that light is totally reflected by an interface between stacked materials and confined in the light emitting apparatus as a result. Accordingly, light emitting apparatuses including an optical sheet for extracting light incident on the optical sheet at an incident angle greater than the critical angle to the outside has been proposed.

For example, Japanese Patent No. 4346680 (hereinafter referred to as Patent Document 1) discloses an optical sheet in which small projections and recesses are randomly arranged. When this optical sheet is assembled in a light emitting apparatus, at least a part of light incident on the optical sheet at an incident angle greater than a critical angle can be scattered as a result of the phenomenon of light diffraction, and thereby extracted to the outside.

SUMMARY

The present disclosure provides an optical sheet and a light emitting apparatus with which light extraction efficiency can be increased, a method for manufacturing the optical sheet, and a method for manufacturing the light emitting apparatus.

An optical sheet according to an aspect of the present disclosure includes a light scattering layer that scatters at least a part of light incident on the light scattering layer by diffraction and that includes first areas and second areas. Each of the first areas is a projection and each of the second areas is a recess. Each of at least the projections or the recesses has a tapered shape. When a center wavelength of the light incident on the light scattering layer is λ and a refractive index of a layer that is in contact with the light scattering layer at a light emission side is n, spatial frequency components of a pattern formed by the first areas and the second areas have a maximum peak at a spatial frequency in a range of $0.068/(\lambda \times n)$ or more and $2.8/(\lambda \times n)$ or less.

Comprehensive or specific aspects may be realized in the form of an apparatus, a system, a method, or any combination of a member, an apparatus, a system, and a method.

According to the optical sheet of the present disclosure, light incident on a light scattering layer at an incident angle greater than a critical angle can be efficiently extracted to the outside, and the light extraction efficiency can be increased.

BRIEF DESCRIPTION OF THE DRAWINGS

FIG. 41A illustrates the manner in which light is incident while the side walls are vertical and not inclined and FIG. 41B illustrates the manner in which light is incident while the side walls are inclined.

FIG. 42A illustrates the manner in which light is incident while the side walls are vertical and not inclined and FIG. 42B illustrates the manner in which light is incident while the side walls are inclined.

FIGS. 57A to 57F are diagrams illustrating a method for manufacturing the organic EL panel according to the sixteenth embodiment.

FIGS. 61A to 61F are diagrams illustrating a method for manufacturing the organic EL panel according to the seventeenth embodiment.

FIGS. 63A to 63F are diagrams illustrating a method for manufacturing the organic EL panel according to the eighteenth embodiment.

FIGS. 65A to 65F are diagrams illustrating a method for manufacturing the organic EL panel according to the nineteenth embodiment.

FIG. 66D illustrates a light distribution (light distribution D) expressed in polar coordinates.

FIG. 66E illustrates a light distribution (light distribution E) expressed in polar coordinates.

FIG. 67 is a graph showing the amount of extracted light in the case where light with a wide-angle distribution is used in the sixteenth embodiment.

FIG. 68 illustrates the structure in which an organic EL panel is sealed with a transparent resin.

FIG. 69 is a diagram for describing a cross section of a projection or a recess.

FIG. 70A illustrates an irregular structure in which projections and recesses have the same cross-sectional area, FIG. 70B illustrates an irregular structure in which the cross-sectional area of the projections is greater than that of the recesses, and FIG. 70C illustrates an irregular structure in which the cross-sectional area of the projections is smaller than that of the recesses.

FIG. 71A illustrates an example of an irregular structure according to a twenty-first embodiment.

FIG. 71B illustrates an example of an irregular structure according to the twenty-first embodiment.

FIG. 72A illustrates the structure in which the cross-sectional area is not changed, FIG. 72B illustrates the structure in which a gap is provided between two adjacent projections, and FIG. 72C illustrates the structure in which no gap is provided between two adjacent projections.

FIG. 73 illustrates another example of an irregular structure according to the twenty-first embodiment.

FIGS. 74A to 74C are diagrams for describing a difference in light transmission efficiency caused when the cross-sectional area is increased or reduced.

FIG. 75 is a graph showing the incident angle dependence of the intensity of light transmitted through three types of irregular structures having different cross-sectional areas.

Figure 76:
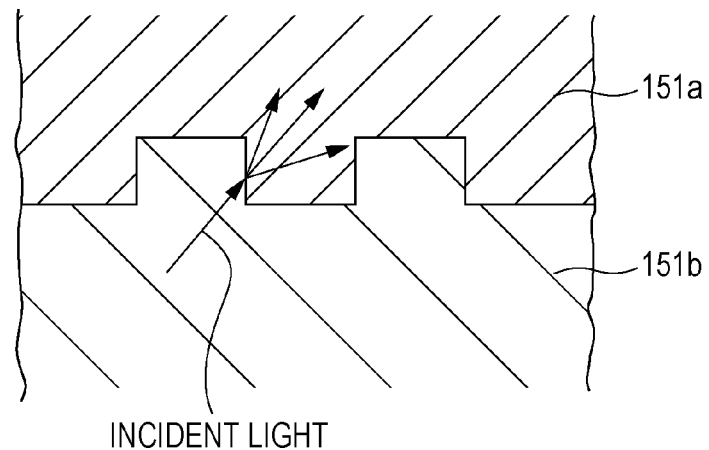

FIG. 76 illustrates the manner in which light is incident on a medium having a relatively low refractive index from a medium having a relatively high refractive index.

Figure 77:
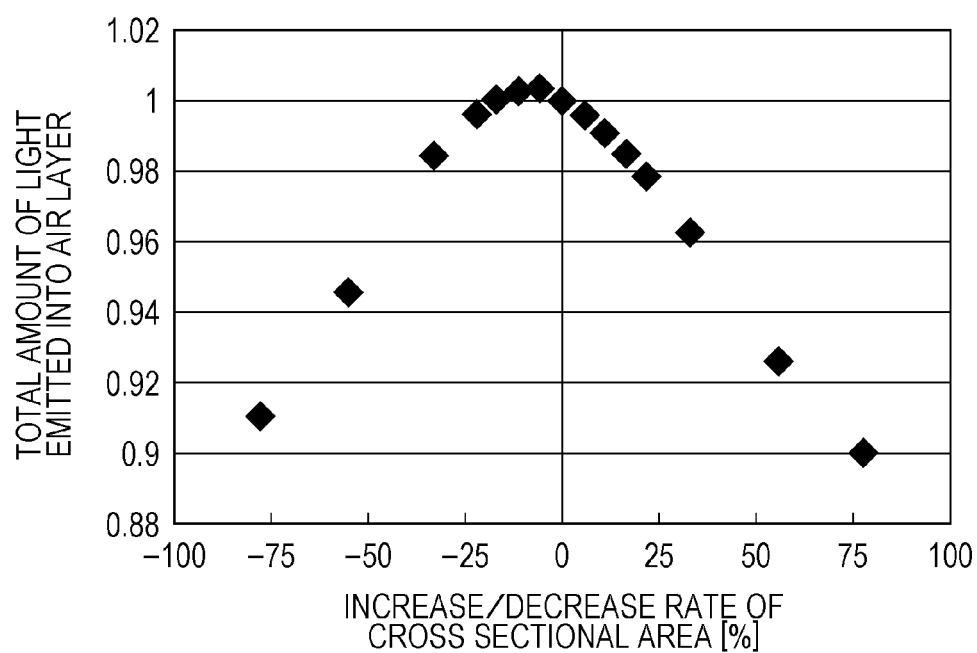

FIG. 77 is a graph showing the dependence of the total amount of light on the increase/decrease rate of the cross-sectional area.

Figure 78:
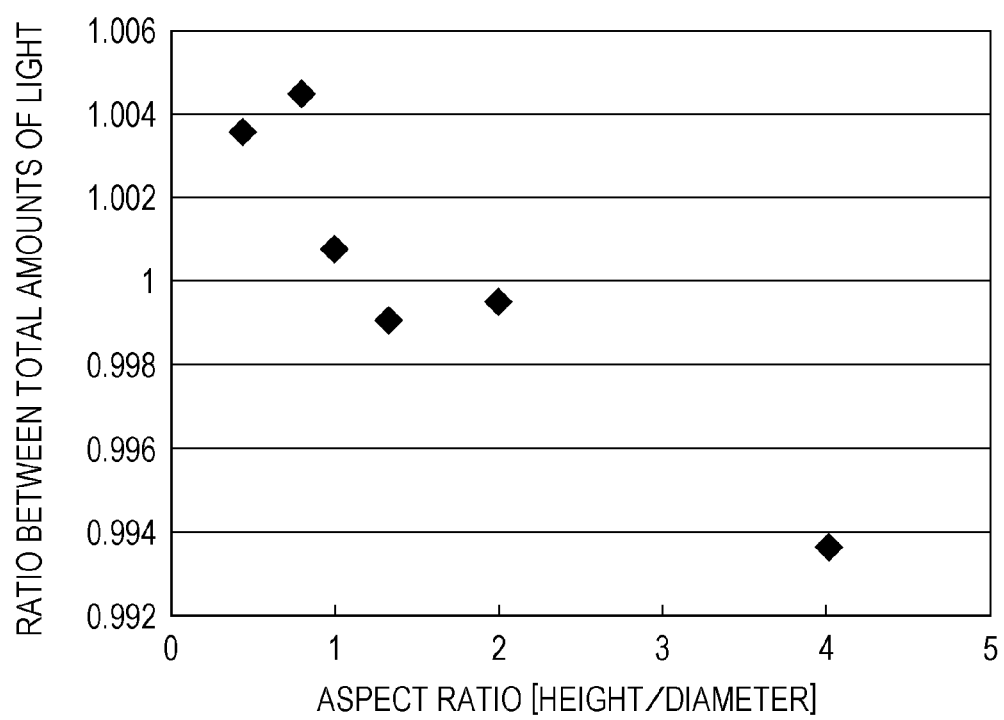

FIG. 78 is a graph showing the dependence of the total amount of light on the aspect ratio.

FIGS. 79A to 79G illustrate irregular structures according to modifications.

Figure 80:
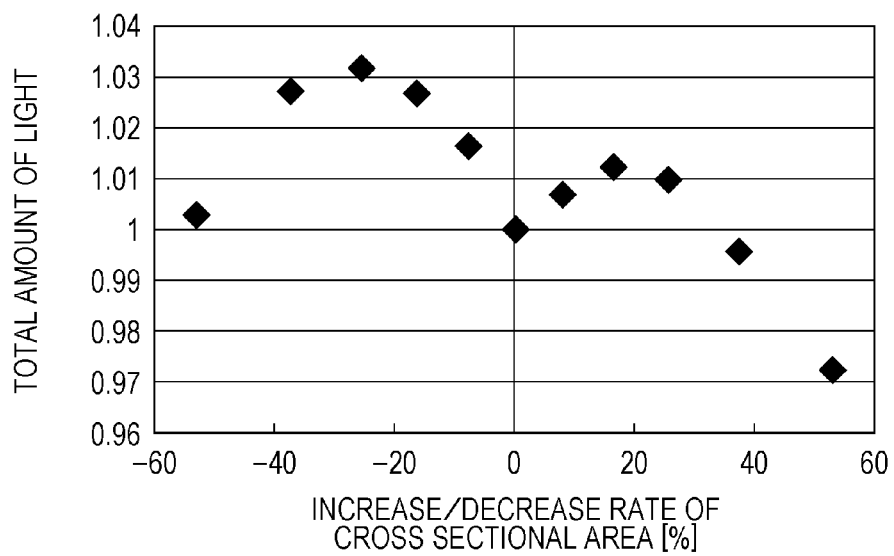

FIG. 80 is a graph showing the dependence of the total amount of light on the increase/decrease rate of the cross-sectional area according to a modification.

Figure 81A:
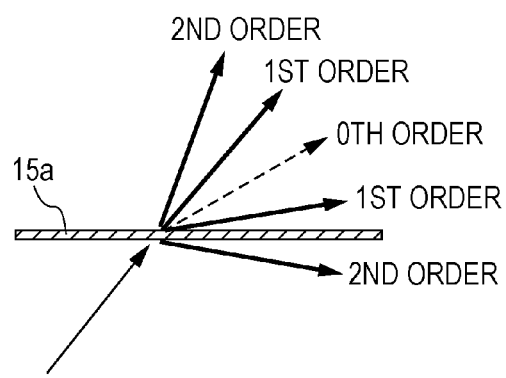
Figure 81B:
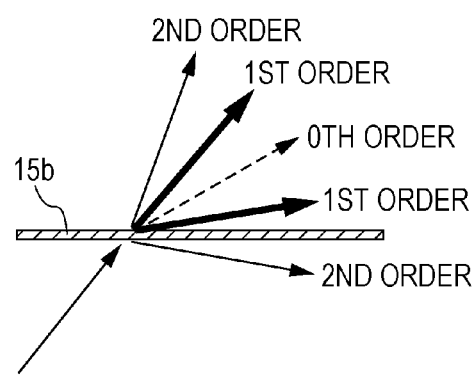

FIGS. 81A and 81B are schematic diagrams illustrating diffracted light in the case where light is incident on a light scattering layer at an intermediate incident angle.

Figure 82A:
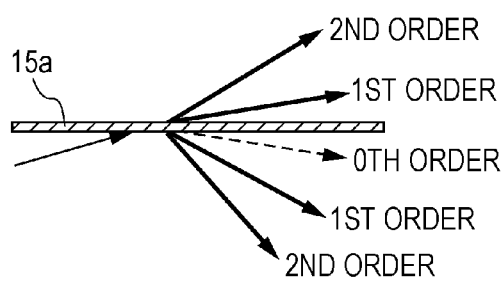
Figure 82B:
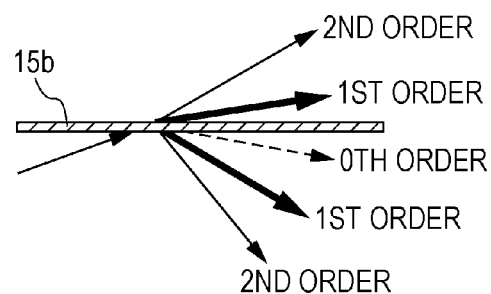

FIGS. 82A and 82B are schematic diagrams illustrating diffracted light in the case where light is incident on the light scattering layer at a large incident angle.

Figure 83:
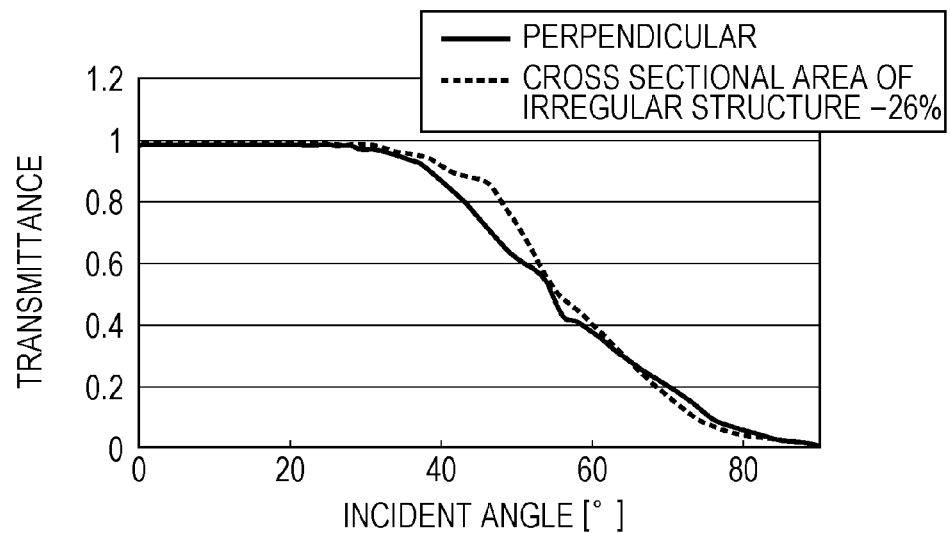

FIG. 83 is a graph showing that the incident angle dependence of the transmittance differs between the case where side walls of an irregular structure are perpendicular to a layer surface and the case where the side walls are inclined.

Figure 84:
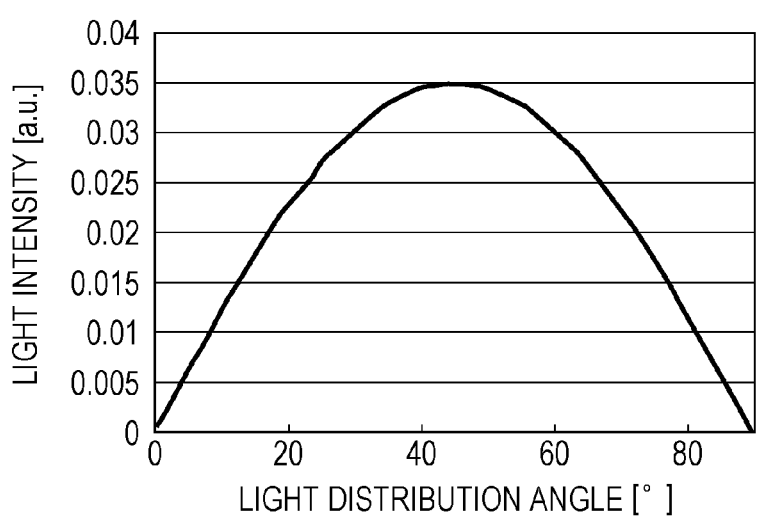

FIG. 84 is a graph showing the dependence of light intensity on the light distribution angle in the case of Lambertian light distribution.

Figure 85:
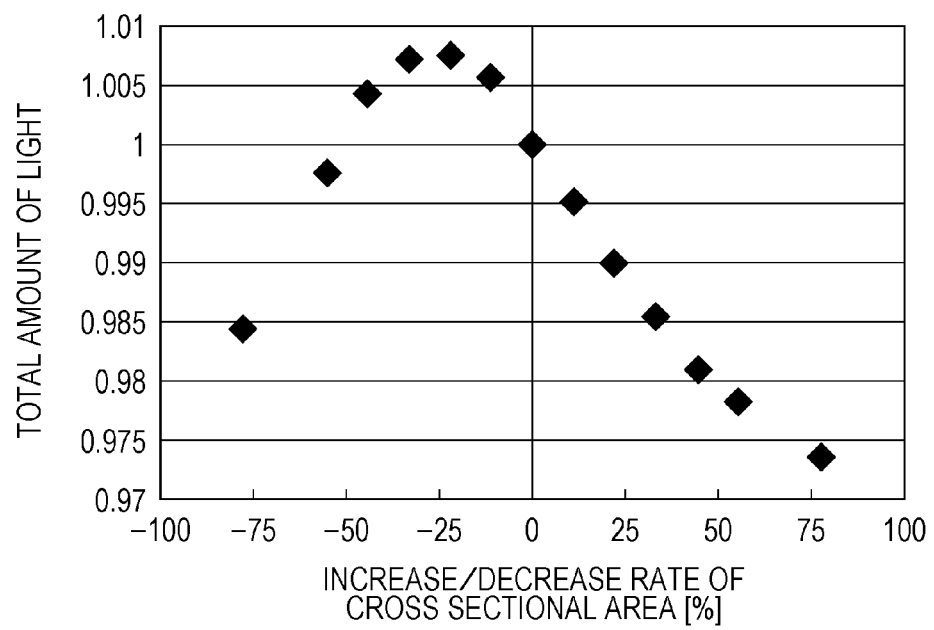

FIG. 85 is a graph showing the dependence of the total amount of light on the increase/decrease rate of the cross-sectional area in the case of Lambertian light distribution.

Figure 86:
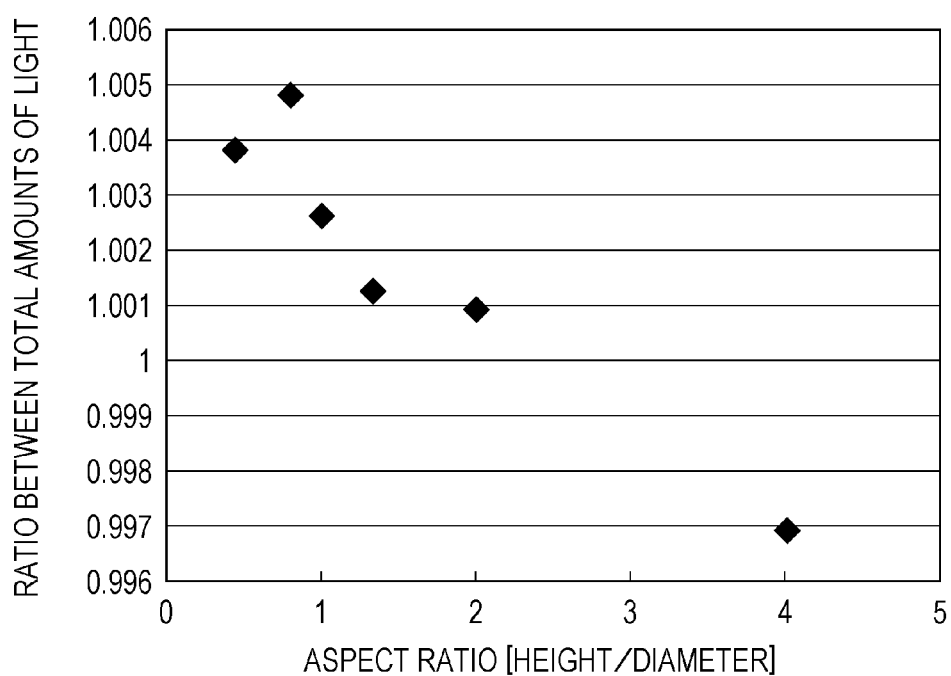

FIG. 86 is a graph showing the dependence of the total amount of light on the aspect ratio in the case of Lambertian light distribution.

DETAILED DESCRIPTION OF THE EMBODIMENTS

Underlying Knowledge Forming Basis of the Present Disclosure

The present inventors have found that an optical sheet described in the Description of the Related Art section has problems described below.

Figure 37A:
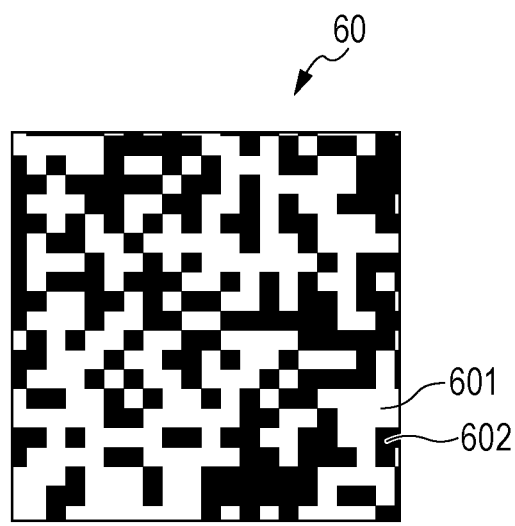
FIG. 37A is a plan view of an optical sheet that differs from the optical sheet of the present embodiment.

FIG. 37A is a plan view of an optical sheet 60 that differs from optical sheets according to embodiments of the present disclosure. As illustrated in FIG. 37A, in the optical sheet 60, a plurality of first small areas 601 (white rectangular regions in FIG. 37A) and a plurality of second small areas 602 (black rectangular regions in FIG. 37A) are randomly arranged to form a random pattern. Each of the first small areas 601 is a projection, and each of the second small areas 602 is a recess.

Figure 37B:
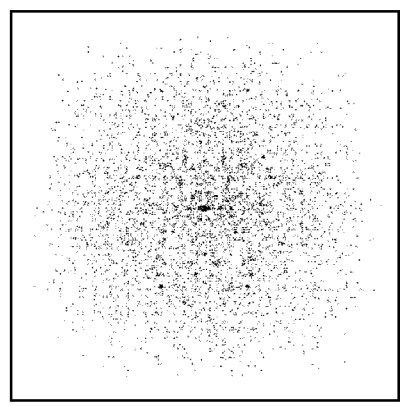
FIG. 37B illustrates the amplitudes of spatial frequency components obtained by taking the Fourier transform of a random pattern of the optical sheet illustrated in FIG. 37A.

FIG. 37B illustrates the amplitudes of spatial frequency components obtained by taking the Fourier transform of the random pattern of the optical sheet 60 illustrated in FIG. 37A. The center of FIG. 37B shows the component at which the spatial frequency is 0 (direct current component). In FIG. 37B, the spatial frequency increases as the distance from the center increases. As is clear from FIG. 37B, in the random pattern of the optical sheet 60 illustrated in FIG. 37A, there exist a relatively large amount of low-spatial-frequency components.

Figure 38A:
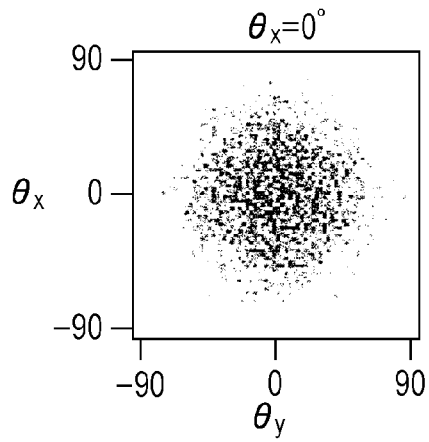
FIG. 38A illustrates the calculation result of a scattering pattern of light emitted from the optical sheet when light is incident on the optical sheet at an incident angle of θx=0°.
Figure 38B:
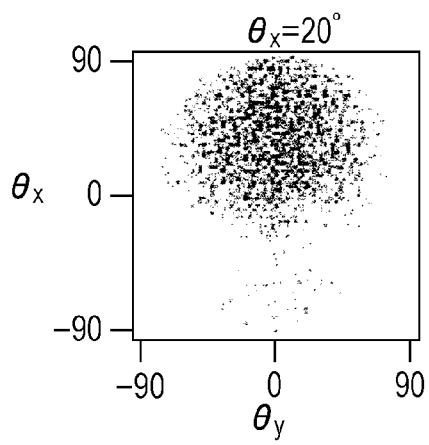
FIG. 38B illustrates the calculation result of a scattering pattern of light emitted from the optical sheet when light is incident on the optical sheet at an incident angle of θx=20°.
Figure 38C:
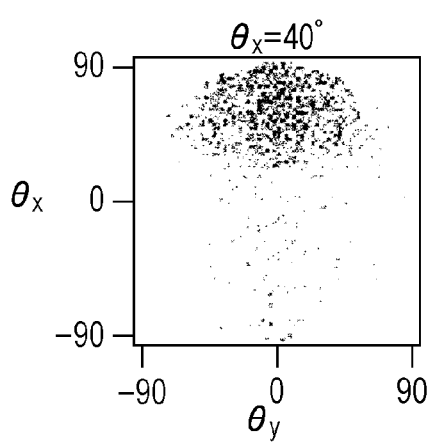
FIG. 38C illustrates the calculation result of a scattering pattern of light emitted from the optical sheet when light is incident on the optical sheet at an incident angle of θx=40°.

FIGS. 38A, 38B, and 38C illustrate the calculation results of scattering patterns of light emitted from the optical sheet 60 in the cases where light is incident on the optical sheet 60 at an incident angle of θx=0°, 20°, and 40°, respectively. As is clear from FIGS. 38A, 38B, and 38C, scattered light emitted from the optical sheet 60 is scattered around an emission direction of non-scattered light, which is zeroth-order light, from the optical sheet 60.

Figure 39:
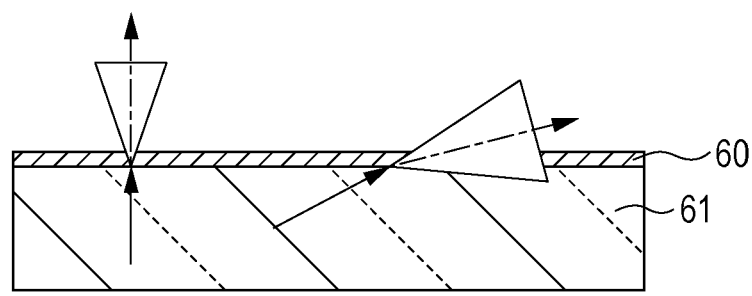
FIG. 39 is a schematic diagram illustrating scattered light emitted from an optical sheet that differs from the optical sheet of the present embodiment.

FIG. 39 is a schematic diagram illustrating the scattered light that is emitted from the optical sheet 60. As illustrated in FIG. 39, the optical sheet 60 is provided on a surface of a transparent substrate 61. Light from a light emitting portion (not shown) passes through the transparent substrate 61, and then is incident on the optical sheet 60. As described above, the scattered light emitted from the optical sheet 60 is scattered around the emission direction of the non-scattered light, which is zeroth-order light, from the optical sheet 60 (directions shown by the one-dot chain line arrows in FIG. 39). Therefore, when light is incident on the optical sheet 60 at an incident angle greater than the critical angle, only a part of the scattered light emitted from the optical sheet 60 can be extracted to the outside. Thus, there is a problem that the light extraction efficiency cannot be greatly increased.

To solve the above-described problem, an optical sheet according to an aspect of the present disclosure includes a light scattering layer that scatters at least a part of light incident on the light scattering layer by diffraction and that includes first areas and second areas. The first areas and the second areas may cause a phase difference between light that passes through each of the first areas and light that passes through each of the second areas. Each of the first areas is a projection and each of the second areas is a recess. Each of at least the projections or the recesses has a tapered shape. When a center wavelength of the light incident on the light scattering layer is λ and a refractive index of a layer that is in contact with the light scattering layer at a light emission side is n, spatial frequency components of a pattern formed by the first areas and the second areas have a maximum peak at a spatial frequency in a range of 0.068/(λ×n) or more and 2.8/(λ×n) or less.

According this aspect, light incident on the light scattering layer at an incident angle greater than a critical angle can be efficiently extracted to the outside, and the light extraction efficiency can be increased.

A material that forms the first areas and a material that forms the second areas may have different refractive indices.

Each of the first areas may be the projection having a flat surface and each of the second areas may be the recess having a flat surface. An average height from bottom parts of the recesses to top parts of the projections may be 1.5 μm or less.

Each of the projections may include an upper face, a lower face having an area larger than an area of the upper face, and a side face including a portion that is inclined with respect to a thickness direction of the light scattering layer.

In a cross section of each projection or each recess taken along a plane that is perpendicular to the light scattering layer and that passes through a center of the projection or the recess, a portion corresponding to a side face of the projection or the recess may be at least partially linear.

In a cross section of each projection or each recess taken along a plane that is perpendicular to the light scattering layer and that passes through a center of the projection or the recess, a portion corresponding to a side face of the projection or the recess may be at least partially curved.

In the cross section of each projection or each recess, at least one of a connecting portion that connects the portion corresponding to the side face and a portion corresponding to an upper face of the projection and a connecting portion that connects the portion corresponding to the side face and a portion corresponding to a lower face of the recess may be curved.

A cross-sectional area of each projection along a first plane that is perpendicular to the light scattering layer and that passes through a center of the projection may be equal to a cross-sectional area of each recess along a second plane that is parallel to the first plane and that passes through a center of the recess.

An optical sheet according to another aspect of the present disclosure includes a light scattering layer that scatters at least a part of light incident on the light scattering layer by diffraction and that includes first areas and second areas. Each of the first areas is a projection and each of the second areas is a recess. A first cross-sectional area, which is a cross-sectional area of each projection along a first plane that is perpendicular to the light scattering layer and that passes through a center of the projection, differs from a second cross-sectional area, which is a cross-sectional area of each recess along a second plane that is parallel to the first plane and that passes through a center of the recess. When a center wavelength of the light incident on the light scattering layer is λ and a refractive index of a layer that is in contact with the light scattering layer at a light emission side is n, spatial frequency components of a pattern formed by the first areas and the second areas have a maximum peak at a spatial frequency in a range of 0.068/(λ×n) or more and 2.8/(λ×n) or less.

The first cross-sectional area may be smaller than the second cross-sectional area.

The first cross-sectional area may be larger than the second cross-sectional area.

When a width of each of the projections and the recesses is w and a height from a bottom part of the recess to a top part of the projection is h, an aspect ratio h/w may be 2 or less.

The aspect ratio h/w may be 1 or less. A unit size of each of the first areas may be 250 nm or more and 0.6 μm or less, and a unit size of each of the second areas may be 250 nm or more and 0.6 μm or less.

A light emitting apparatus according to an aspect of the present disclosure includes a transparent substrate; a first electrode; a second electrode; an organic EL light emitting layer that is provided between the first electrode and the second electrode and that emits light; and a light scattering layer that is provided between the transparent substrate and the first electrode, that scatters at least a part of the light emitted from the organic EL light emitting layer by diffraction, and that includes first areas and second areas. Each of the first areas is a projection and each of the second areas is a recess. Each of at least the projections or the recesses has a tapered shape. When a center wavelength of the light that is emitted from the organic EL light emitting layer toward the light scattering layer is λ and a refractive index of a layer that is in contact with the light scattering layer at a light emission side is n, spatial frequency components of a pattern formed by the first areas and the second areas have a maximum peak at a spatial frequency in a range of 0.068/(λ×n) or more and 2.8/(λ×n) or less.

A first cross-sectional area, which is a cross-sectional area of each projection along a first plane that is perpendicular to the light scattering layer and that passes through a center of the projection, may differ from a second cross-sectional area, which is a cross-sectional area of each recess along a second plane that is parallel to the first plane and that passes through a center of the recess.

Embodiments will now be described with reference to the drawings. Each of the embodiments described below shows a comprehensive or specific example. Numerical values, shapes, materials, components, arrangement and connection of the components, steps, the order of the steps, etc., described in the following embodiments are merely examples, and are not intended to limit the scope of the present disclosure. Also, among the components described in the following embodiments, components that are not described in independent claims that describe the most generic concept are to be regarded as optional components.

First Embodiment

Structure of Light Emitting Apparatus

Figure 1:
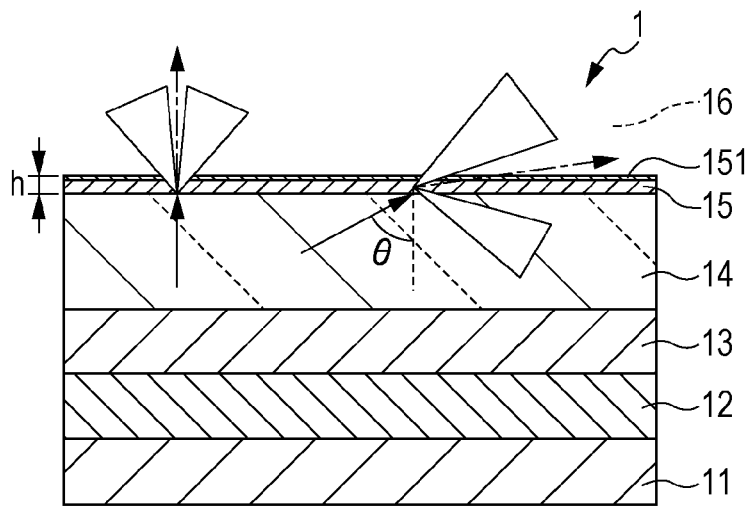
FIG. 1 is a sectional view of a light emitting apparatus according to a first embodiment.

FIG. 1 is a sectional view of a light emitting apparatus 1 according to a first embodiment. In the present embodiment, the light emitting apparatus 1 includes an electrode 11, a light emitting layer 12 (including a light emitting portion), a transparent electrode 13, a transparent substrate 14, and an optical sheet 15 (including a light scattering layer 151), which are stacked in that order. In the present embodiment, the light emitting apparatus 1 is, for example, an organic electroluminescent device or a light emitting diode (LED).

In the case where the electrode 11 is optically reflective, the electrode 11 has a function of causing light generated in the light emitting layer 12 to travel toward an air layer 16. In the case where the electrode 11 is optically transparent, a transmissive light emitting apparatus 1 can be obtained. In either case, an effect of increasing the light extraction efficiency can be obtained. Therefore, both cases are included in the scope of the present disclosure. In the following description, the case in which the electrode 11 is optically reflective will be described. The electrode 11 is, for example, an anode.

When a certain voltage is applied between the electrode 11 and the transparent electrode 13, electrons (or holes) are injected into the light emitting layer 12 from the electrode 11. The material of the electrode 11 may be, for example, silver (Ag), aluminum (Al), copper (Cu), magnesium (Mg), lithium (Li), or sodium (Na). The electrode 11 may instead be formed by stacking a transparent conductive material, such as indium tin oxide (ITO) or a mixture of polythiophene and polystyrene sulfonate (PEDOT:PSS), on the above-described metals.

The transparent electrode 13 is, for example, a Anode that is optically transparent. When a certain voltage is applied between the electrode 11 and the transparent electrode 13, holes (or electrons) are injected into the light emitting layer 12 from the transparent electrode 13. The material of the transparent electrode 13 may be, for example, indium tin oxide (ITO), indium zinc oxide (IZO), or a mixture of polythiophene and polystyrene sulfonate (PEDOT:PSS).

When, for example, the light emitting apparatus 1 is an organic electroluminescent device, an electron transport layer and a hole transport layer (not shown) may be provided on both sides of the light emitting layer 12. The electron transport layer is located at the electrode-11 side, and the hole transport layer is located at the transparent-electrode-13 side. In the case where the electrode 11 is a anode, the electron transport layer is located at the transparent-electrode-13 side, and the hole transport layer is located at the electrode-11 side. The material of the electron transport layer may be appropriately selected from a group of compounds having an electron transport property. Examples of this type of compounds include metal complexes known as electron transport materials, such as tris(8-quinolinolato)aluminum (Alq3), and heterocyclic compounds, such as phenanthroline derivatives, pyridine derivatives, tetrazine derivatives, and oxadiazole derivatives. However, the material of the electron transport layer is not limited to the above-mentioned materials, and any commonly known electron transport material may be used. In particular, a material having a high electron transport property is desirably used. The material of the hole transport layer may be appropriately selected from a group of compounds having a hole transport property. Examples of this type of compounds include triarylamine compounds, such as 4,4'-bis [N-(naphthyl)-N-phenyl-amino]biphenyl (α-NPD), N,N'-bis (3-methylphenyl)-(1,1'-biphenyl)-4,4'-diamine (TPD), 2-TNATA, 4,4',4''-tris(N-(3-methylphenyl)N-phenylamino) triphenylamine (MTDATA), 4,4'-N,N'-dicarbazolebiphenyl (CBP), spiro-NPD, spiro-TPD, spiro-TAD, and TNB, amine compounds containing a carbazole group, and amine compounds containing a fluorene derivative. However, the material of the hole transport layer is not limited to the abovementioned materials, and any commonly known hole transport material may be used.

The transparent substrate 14 is provided to hold the transparent electrode 13. The material of the transparent substrate 14 may be, for example, a transparent material such as glass or a resin. The transparent substrate 14 generally has a refractive index of about 1.45 to 1.65. The transparent substrate 14 may instead be a high-refractive-index substrate having a refractive index of about 1.65 to 2.0. In the case where it is not necessary to hold the transparent electrode 13, the transparent substrate 14 is not always necessary. For example, the transparent substrate 14 is not necessary when a substrate for holding the electrode 11 is provided or when the electrode 11 is sufficiently thick and does not need to be held.

The optical sheet 15 includes a light scattering layer 151 (described below) at least at a side at which the optical sheet 15 is in contact with the air layer 16. The optical sheet 15 is provided on a surface of the transparent substrate 14 at a side opposite to the side at which the transparent electrode 13 is provided. Alternatively, the light scattering layer 151 may be directly provided on the surface of the transparent substrate 14. In the case where the transparent substrate 14 is not provided, the optical sheet 15 including the light scattering layer 151, or the light scattering layer 151, is provided directly on the transparent electrode 13 so as to be adjacent to the transparent electrode 13. At least a part of light incident on the light scattering layer 151 is scattered by the diffraction phenomenon of light, and then is emitted from the light scattering layer 151. As described below, the scattered light emitted from the light scattering layer 151 is scattered around a direction different from an emission direction of the non-scattered light, which is zeroth-order light, from the light scattering layer 151 (i.e. direction shown by the one-dot chain line arrow in FIG. 1). Since the zeroth-order light is the light that passes through the light scattering layer 151 without being scattered, the emission angle of the zeroth-order light is determined by the Snell's law. More specifically, when the incident angle of the incident light is $\theta_0$, the refractive index of the medium at the incident side is $n_0$, and the refractive index of the medium at the emission side is $n_1$, the emission angle $\theta_1$ of the zeroth-order light can be expressed as follows:

$$n_0 \sin \theta_0 = n_1 \sin \theta_1 \quad (1)$$

Also when all of the incident light is scattered by the light scattering layer 151, the emission angle of the zeroth-order light can be calculated by Equation (1), and the structure in which the scattered light is scattered around directions different from the emission direction is included in the scope of the present disclosure. The detailed structure of the light scattering layer 151 will be described below. In the present embodiment, the optical sheet 15 or the light scattering layer 151 is arranged on the surface of the transparent substrate 14. However, the optical sheet 15 or the light scattering layer 151 may instead be arranged in the transparent substrate 14.

A part of the light generated in the light emitting layer 12 passes through the transparent electrode 13 and the transparent substrate 14 and then is incident on the light scattering layer 151. Another part of the light generated in the light emitting layer 12 is reflected by the electrode 11, passes through the transparent electrode 13 and the transparent substrate 14, and then is incident on the light scattering layer 151. At least a part of the light incident on the light scattering layer 151 is scattered by diffraction, and is thereby emitted into the air layer 16, which is outside the light emitting apparatus 1. The refractive index of the air layer 16 is, for example, 1.0.

Structure of Optical Sheet

Figure 2A:
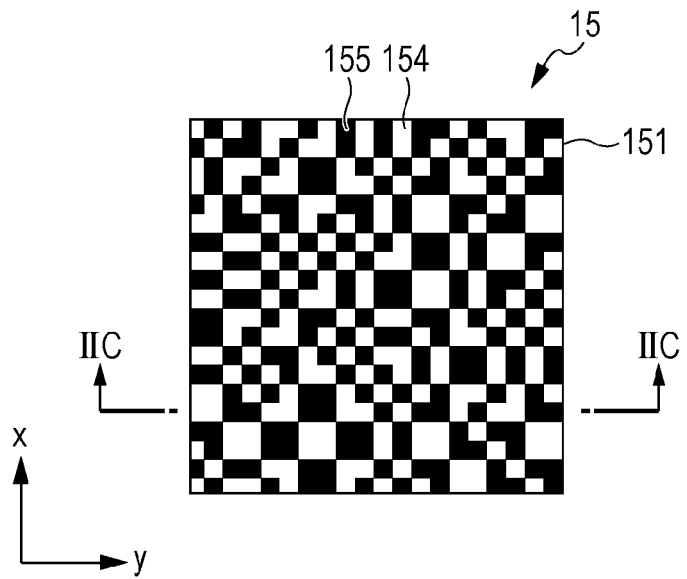
FIG. 2A is a plan view of an optical sheet according to the first embodiment.
Figure 2B:
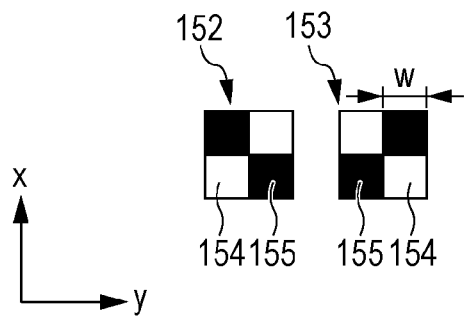
FIG. 2B is a plan view illustrating a first unit structure and a second unit structure included in the optical sheet illustrated in FIG. 2A.
Figure 2C:
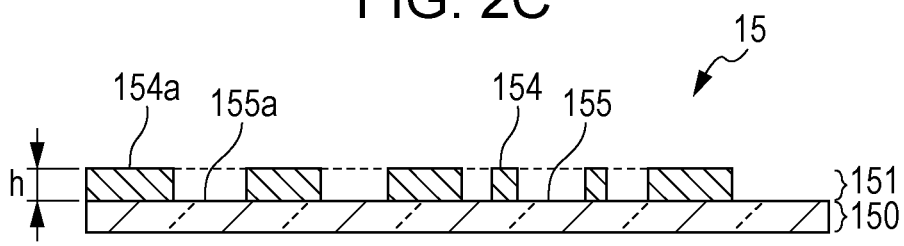
FIG. 2C is a sectional view of the optical sheet taken along line IIC-IIC in FIG. 2A.

FIG. 2A is a plan view of the optical sheet 15 according to the first embodiment. FIG. 2B is a plan view illustrating a first unit structure 152 and a second unit structure 153 included in the optical sheet 15 illustrated in FIG. 2A. FIG. 2C is a sectional view of the optical sheet 15 taken along line IIC-IIC in FIG. 2A.

As illustrated in FIG. 2A, the optical sheet 15 includes the light scattering layer 151 that scatters the incident light by diffraction. In the present embodiment, the light scattering layer 151 is located at a side at which the optical sheet 15 is in contact with the air layer 16 (that is, a layer that is in contact with the light-emission-side surface of the optical sheet 15). The light scattering layer 151 is formed by arranging a plurality of first unit structures 152 and a plurality of second unit structures 153, which are structured as illustrated in FIG. 2B.

Each first unit structure 152 is formed by arranging two first small areas 154 and two second small areas 155 in a first arrangement pattern. The first arrangement pattern is a pattern in which the two first small areas 154 are diagonally located, and the two second small areas 155 are also diagonally located. Each first unit structure 152 has a rectangular shape (for example, a square shape) in plan view.

Each second unit structure 153 is formed by arranging two first small areas 154 and two second small areas 155 in a second arrangement pattern that differs from the first arrangement pattern. The second arrangement pattern is a pattern in which the first small areas 154 and the second small areas 155 in the first arrangement pattern are inverted. Each second unit structure 153 has a rectangular shape (for example, a square shape) in plan view.

The first small areas 154 are white rectangular regions in FIG. 2B, and are formed of projections 154a that project toward the air layer 16. The projections 154a have flat surfaces that extend in a layer direction. Here, the flat surfaces are surfaces that are considered to be flat when structures that are so small that light cannot recognize (i.e. sufficiently smaller than the wavelength of light) are ignored. The second small areas 155 are black rectangular regions in FIG. 2B, and are formed as recesses 155a that are recessed toward the transparent substrate 14. The recesses 155a have flat surfaces that extend in the layer direction. The first small areas 154 and the second small areas 155 both have a rectangular shape (for example, a square shape) in plan view. With the above-described structure, a phase difference is generated between light that passes through the first small areas 154 and light that passes through the second small areas 155. For example, when the refractive index of the first small areas 154 is $n_1$, the refractive index of the second small areas 155 is $n_2$, the wavelength of light is $\lambda$, and the distance by which light passes through each of the first small areas 154 and the second small areas 155 is d, the phase difference is expressed as $(n_1-n_2) \times d/\lambda$. In the present embodiment, the phase difference is generated by the irregular structure. However, the phase difference may instead be generated by forming the first small areas 154 and the second small areas 155 by using materials having different refractive indices.

As illustrated in FIG. 2A, in the light scattering layer 151, the first small areas 154 and the second small areas 155 are arranged so as to form a pattern.

In the present embodiment, as illustrated in FIG. 2C, the heights from the bottom parts of the recesses 155a to top parts (i.e. top surfaces) of the projections 154a are substantially the same. As described below, the average height h from the bottom parts (i.e. bottom surfaces) of the recesses 155a to the top parts of the projections 154a is desirably 1.5 μm or less.

Manufacturing Method and Structure of Optical Sheet

In the present embodiment, the pattern of the light scattering layer 151 included in the optical sheet 15 is determined by the arrangement of the first unit structures 152 and the second unit structures 153. However, the pattern may instead be determined by methods described in embodiments described later. Alternatively, a pattern in which the spatial frequency is controlled may be determined by, for example, methods disclosed in Japanese Unexamined Patent Application Publication Nos. 2011-118327 and 2011-118328 (hereinafter referred to as Patent Documents 2 and 3). The entire contents of Patent Documents 2 and 3 are incorporated herein by reference.

The optical sheet 15 having the above-described pattern according to the present embodiment may be manufactured by, for example, a method including a semiconductor process or a cutting process, or a method of transferring, by nanoimprinting, a pattern of a mold formed by a semiconductor process, a cutting process, or the like.

In the case where the irregular shape is formed by directly processing a material by a semiconductor process or a cutting process, the optical sheet 15 is formed as illustrated in FIG. 2C. More specifically, as illustrated in FIG. 2C, the light scattering layer 151 is formed on a transparent substrate 150 so as to have the irregular shape. The substrate 150 and the first small areas 154 may be formed of the same material. A semiconductor process is effective for micromachining in the case where the pattern is controlled on the order of micrometers. In the case where a semiconductor process is performed, a stepped structure having flat surfaces, that is, a structure having discrete height levels, can be easily processed. For example, a structure having two height levels can be formed by performing an etching process once. By performing the etching process twice, a structure having three or four height levels can be formed.

Figure 2D:
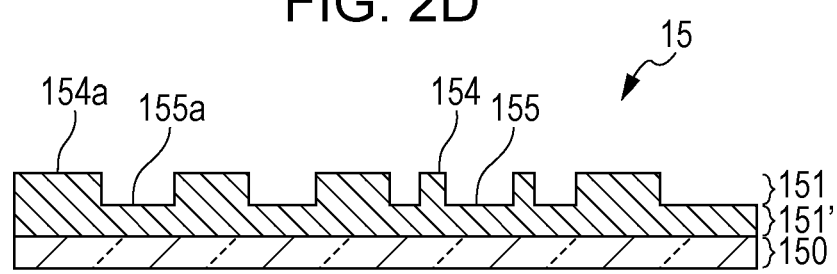
FIG. 2D is a sectional view of an optical sheet manufactured by nanoimprinting.

FIG. 2D is a sectional view of the optical sheet 15 in the case where the optical sheet 15 is manufactured by nanoimprinting. In the case where the optical sheet 15 is manufactured by nanoimprinting, first, a step of pressing a mold against a liquid resin is performed. Then, a step of curing the resin is performed. An irregular pattern formed on the mold is transferred to the liquid resin, so that the first small areas 154 and the second small areas 155 are formed. In this case, as illustrated in FIG. 2D, the resin includes a residual film portion 151' to which the irregular pattern on the mold is not transferred.

A transparent adhesive or the like may be used to retain the optical sheet 15 having either of the structures illustrated in FIGS. 2C and 2D adjacent to the transparent substrate 14.

Figure 2E:
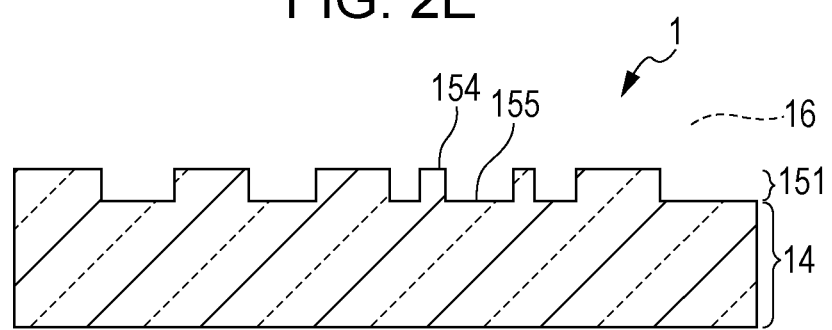
FIG. 2E is a sectional view of a part of the light emitting apparatus in the case where a light scattering layer is formed on a surface of a transparent substrate.

Structure in which Light Scattering Layer is Directly Formed on Surface of Transparent Substrate The pattern of the light scattering layer 151 is determined by a method similar to that in the above-described case in which the optical sheet 15 is provided on a surface of the transparent substrate 14. FIG. 2E is a sectional view of a part of the light emitting apparatus 1 in the case where the light scattering layer 151 is formed on a surface of the transparent substrate 14 by a semiconductor process or a cutting process.

Referring to FIG. 2E, to manufacture the light emitting apparatus 1, first, the small areas 154 and 155 having the irregular shape are formed on the transparent substrate 14. Then, the small areas 154 and 155 are embedded in a material having a refractive index that differs from that of the transparent substrate 14. In this manner, the light scattering layer 151 having the irregular shape can be formed directly on the surface of the transparent substrate 14.

All of the above-described manufacturing methods provide an effect of suppressing the total reflection of light at the light scattering layer 151 and increasing the light extraction efficiency, and are therefore included in the scope of the present disclosure.

In the case where the refractive index $n_1$ of the first small areas 154 and the refractive index $n_2$ of the second small areas 155 ($n_1 > n_2$) are both lower than the refractive index of the transparent substrate 14, light that is incident on the light scattering layer 151 at an incident angle greater than the critical angle is totally reflected by the interface between the transparent substrate 14 and the light scattering layer 151, and does not reach the first small areas 154 and the second small areas 155. Therefore, the refractive index $n_1$ of the first small areas 154 is desirably close to or higher than the refractive index of the transparent substrate 14. To generate an appropriate phase difference, the refractive index $n_2$ of the second small areas 155 is desirably lower than the refractive index $n_1$ of the first small areas 154, and close to the refractive index of the air layer 16. The material of the first small areas 154 may be a transparent material such as glass or a resin. The material of the second small areas 155 may be a transparent material such as air or a resin having a low refractive index.

Characteristics of Light Scattering Layer

Figure 3:
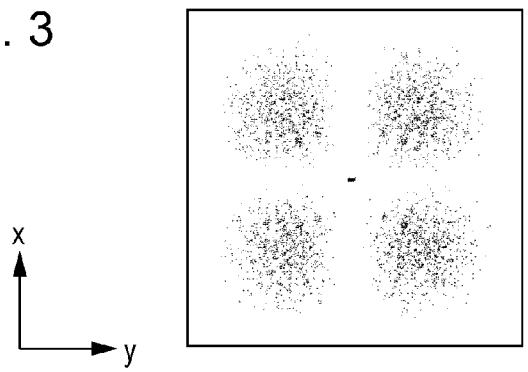
FIG. 3 illustrates the amplitudes of spatial frequency components obtained by taking the Fourier transform of a pattern of the light scattering layer illustrated in FIG. 2A.

FIG. 3 illustrates the amplitudes of spatial frequency components obtained by taking the Fourier transform of the pattern of the light scattering layer 151 illustrated in FIG. 2A. Here, "to take the Fourier transform of a pattern" means to take the Fourier transform in the case where the phase difference of light generated by the first small areas 154 and the second small areas 155 is expressed as a two-dimensional function of coordinates x and y on the plane of the light scattering layer 151. In the present embodiment, since the first small areas 154 are projections and the second small areas 155 are recesses, the Fourier transform of the pattern can be regarded as the Fourier transform of a two-dimensional distribution of the heights of the flat portions on the light scattering layer 151. In FIG. 3, similar to the coordinates in the real space, the coordinates in the frequency space are represented by x and y. The center of FIG. 3 shows the component at which the spatial frequency is 0 (direct current component). In FIG. 3, the spatial frequency increases as the distance from the center increases. As is clear from FIG. 3, in the pattern of the light scattering layer 151 illustrated in FIG. 2A, low-spatial-frequency components are suppressed.

Although the light extraction efficiency is not directly affected, as is clear from FIG. 3, the spatial frequency components are 0 in each of the x direction and y direction. This is because, in each of the first unit structure 152 and the second unit structure 153 illustrated in FIG. 2B, the integrated values of the phase difference in the x direction and the y direction are both 0. Therefore, in the pattern illustrated in FIG. 2A in which a plurality of the first unit structures 152 and a plurality of the second unit structures 153 are arranged, the spatial frequency components are 0 in each of the x direction and the y direction.

Figure 4A:
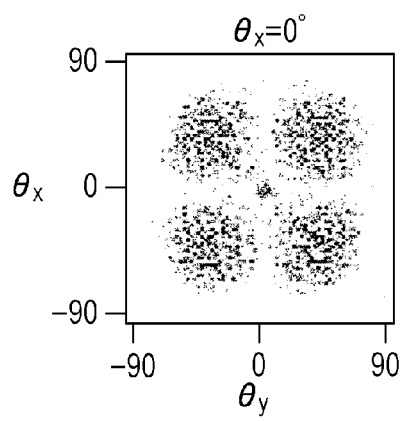
FIG. 4A illustrates the calculation result of a scattering pattern of light emitted from the light scattering layer when light is incident on the light scattering layer at an incident angle of $\theta x=0°$.
Figure 4B:
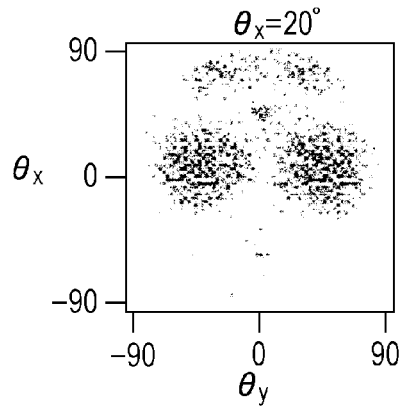
FIG. 4B illustrates the calculation result of a scattering pattern of light emitted from the light scattering layer when light is incident on the light scattering layer at an incident angle of $\theta x=20°$.
Figure 4C:
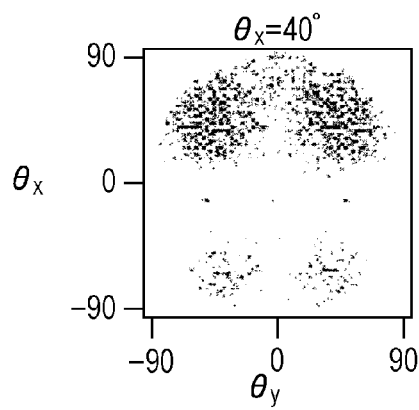
FIG. 4C illustrates the calculation result of a scattering pattern of light emitted from the light scattering layer when light is incident on the light scattering layer at an incident angle of $\theta x=40°$.

FIGS. 4A, 4B, and 4C illustrate the calculation results of a scattering pattern of light emitted from the light scattering layer 151 in the cases where light is incident on the light scattering layer 151 at an incident angle of θx=0°, 20°, and 40°, respectively. With regard to calculation conditions, the refractive index of the first small areas 154 and the refractive index of the transparent substrate 14 are both set to 1.5, the refractive index of the second small areas 155 and the refractive index of the air layer 16 are both set to 1.0, the wavelength of the light incident on the light scattering layer 151 is set to 550 nm, the unit size w of each of the first small areas 154 and the second small areas 155 is set to 0.6 μm, and the height h from the bottom parts of the areas 155 (recesses 155a) to the top parts of the first small areas 154 (projections 154a) is set to 0.6 μm. Here, the unit size w is the length of each side of the first small areas 154 and the second small areas 155 in plan view.

As is clear from FIG. 4A, the calculation result of the scattering pattern in the case where light is incident on the light scattering layer 151 at the incident angle θx of θx=0° is the same as the result of Fourier transform illustrated in FIG. 3. This is because the Fraunhofer diffraction image of light obtained when light is incident on the light scattering layer 151 is the same as the result of Fourier transform of the phase difference generated at the diffraction surface. Also, as is clear from FIGS. 4B and 4C, also when the incident angle is in the range of θx>0°, the scattered light emitted from the light scattering layer 151 is scattered around directions different from the emission direction of the non-scattered light, which is zeroth-order light, from the light scattering layer 151. It can be understood from the above-described results that, by suppressing the low-spatial-frequency components in the planar pattern as in the structure illustrated in FIG. 2A, light incident at any angle can be scattered around directions different from the emission direction of the non-scattered light, which is zeroth-order light.

Figure 5:
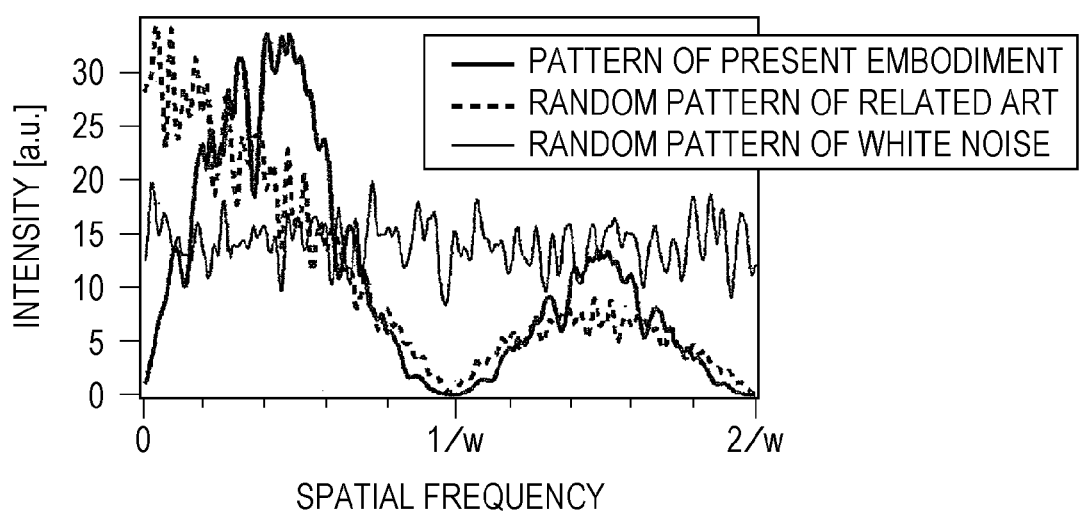
FIG. 5 is a graph showing a one-dimensional distribution in a certain direction of spatial frequency components obtained by taking the Fourier transform of a pattern of the light scattering layer.

Next, the pattern of the light scattering layer 151 will be discussed on the basis of the spatial frequency. FIG. 5 is a graph showing a one-dimensional distribution in a certain direction of spatial frequency components obtained by taking the Fourier transform of the pattern of the light scattering layer 151. In FIG. 5, the horizontal axis represents the spatial frequency of the pattern, and the vertical axis represents the intensity of the spatial frequency components in arbitrary unit. In the graph of FIG. 5, the thick solid line shows the one-dimensional distribution of the spatial frequency components of the pattern according to the present embodiment, the dashed line shows the one-dimensional distribution of the spatial frequency components of a random pattern that differs from the pattern of the present embodiment (for example, the pattern disclosed in Patent Document 1), and the thin solid line shows the one-dimensional distribution of the spatial frequency components of the pattern generally called white noise (for example, a pattern in which structures having random sizes are randomly arranged).

Referring to FIG. 5, the spatial frequency components of the pattern according to the present embodiment have a maximum peak (hereinafter also referred to simply as peak) at a spatial frequency around 1/(2 w). Although each of the curves illustrated in FIG. 5 has many small irregularities, these irregularities are noises generated as a result of calculation errors caused in the numerical calculation, and curves that smoothly connect these irregularities show the characteristics of the corresponding patterns. With the pattern according to the present embodiment, the spatial frequency components are suppressed with respect to the peak at high spatial frequencies around 1/w and low spatial frequencies around 0. In other words, the intensity distribution curve has an upwardly convex shape in which the spatial frequency components are suppressed at spatial frequencies around 1/w and 0 and have a peak at a spatial frequency around 1/(2 w). With regard to the width of the intensity distribution curve, the half-width of the intensity distribution curve is about 1/(2 w). The width of the intensity distribution curve is desirably greater than or equal to a spectrum width $\Delta\lambda$ of a light emission wavelength of a light emitting element at a spatial frequency around 1/(2 w), which corresponds to the peak. In other words, the intensity distribution curve desirably has a width of 1/(2 w±$\Delta\lambda$/2) or more. In this case, light components having different wavelengths emitted from the light emitting element can be effectively extracted. Here, w is the above-described unit size. Spatial frequencies greater than the reciprocal of the wavelength of light do not contribute to diffraction of the light. Thus, when the spatial frequency components at high spatial frequencies of around 1/w or more are suppressed with respect to the peak, a large part of the light incident on the light scattering layer 151 can be converted into scattered light. In addition, when the spatial frequency components at low spatial frequencies of around 0 are suppressed with respect to the peak, a part of the scattered light emitted from the light scattering layer 151 can be suppressed. The part of the scattered light is emitted in directions around the emission direction of the non-scattered light, which is zeroth-order light. In the random pattern that differs from the pattern of the present embodiment, a peak is at a low spatial frequency around 0. In the pattern of white noise, all of the spatial frequency components are within a predetermined amplitude range.

As described above, the characteristics of the light scattering layer 151 according to the present embodiment completely differ from those of, for example, the optical sheet 60 illustrated in FIG. 37A. As illustrated in FIG. 1, the scattered light emitted from the light scattering layer 151 according to the present embodiment is scattered around directions different from the emission direction of the non-scattered light, which is zeroth-order light from the light scattering layer 151. In contrast, as illustrated in FIG. 39, the scattered light emitted from the optical sheet 60, which differs from the optical sheet of the present embodiment, is scattered around the emission direction of the non-scattered light, which is zeroth-order light from the optical sheet 60. Accordingly, with the light scattering layer 151 according to the present embodiment, compared to the optical sheet 60, which differs from the optical sheet of the present embodiment, the light incident on the light scattering layer 151 at an angle that exceeds the critical angle can be more efficiently extracted to the outside.

Figure 6:
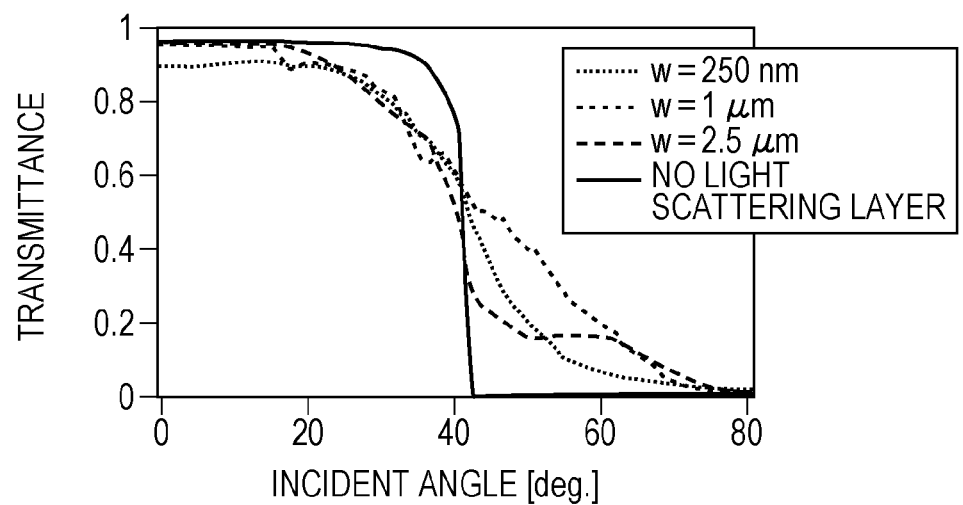
FIG. 6 is a graph showing the calculation result of the incident angle dependence of the light transmittance of the light scattering layer.

The incident angle dependence of the light transmittance of the light scattering layer 151 according to the present embodiment is calculated. FIG. 6 is a graph showing the calculation result of the incident angle dependence of the light transmittance of the light scattering layer 151. In FIG. 6, the horizontal axis represents the incident angle of the light incident on the light scattering layer 151, and the vertical axis represents the light transmittance of the light scattering layer 151. With regard to calculation conditions, in the structure illustrated in FIGS. 1 and 2A, the refractive index of the first small areas 154 and the refractive index of the transparent substrate 14 are both set to 1.5, the refractive index of the second small areas 155 and the refractive index of the air layer 16 are both set to 1.0, and the height h from the bottom parts of the second small areas 155 (i.e. recesses 155a) to the top parts of the first small areas 154 (i.e. projections 154a) is set to 1.0 µm. In FIG. 6, the three dashed lines show the calculation results in the cases where the unit size w of each of the first small areas 154 and the second small areas 155 is 250 nm, 1 µm, and 2.5 µm. The solid line shows the calculation result in the case where the light scattering layer 151 is not provided. As is clear from FIG. 6, in the case where the light scattering layer 151 is not provided, the transmittance is 0 when the incident angle exceeds the critical angle, which is about 42°. In contrast, in the case where the light scattering layer 151 is provided, the transmittance is higher than 0 even when the incident angle is greater than the critical angle of about 42°. Thus, in the case where the light scattering layer 151 according to the present embodiment is provided, light that is incident on the light scattering layer 151 at an incident angle that exceeds the critical angle can be efficiently extracted to the outside.

Figure 7:
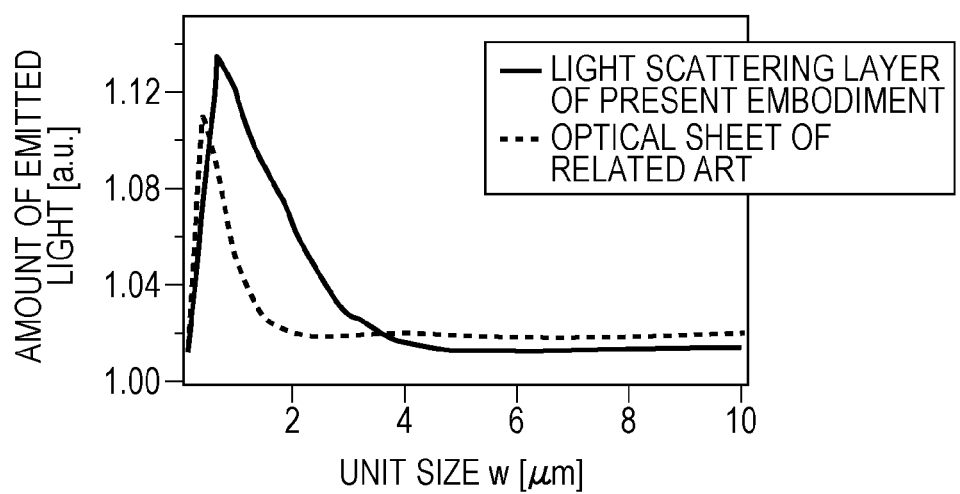
FIG. 7 is a graph showing the calculation result of the dependence of the total amount of light emitted into an air layer through the light scattering layer on a unit size w of each of first small areas and second small areas.

Next, assuming that light present in the transparent substrate 14 is isotropic, the dependence of the total amount of light emitted into the air layer 16 through the light scattering layer 151 on the unit size w of each of the first small areas 154 and the second small areas 155 is calculated. Here, "light is isotropic" means that the same amount of light travels in all directions. FIG. 7 is a graph showing the calculation result of the dependence of the total amount of light emitted into the air layer 16 through the light scattering layer 151 on the unit size w of each of the first small areas 154 and the second small areas 155. In FIG. 7, the horizontal axis represents the unit size w of each of the first small areas 154 and the second small areas 155, and the vertical axis represents the total amount of light that is emitted into the air layer 16 through the light scattering layer 151. With regard to calculation conditions, in the structure illustrated in FIGS. 1 and 2A, the refractive index of the first small areas 154 and the refractive index of the transparent substrate 14 are both set to 1.5, and the refractive index of the second small areas 155 and the refractive index of the air layer 16 are both set to 1.0. In FIG. 7, the solid line shows the calculation result for the light scattering layer 151 according to the present embodiment. The dashed line shows the calculation result for the optical sheet 60 that differs from the optical sheet of the present embodiment. As is clear from FIG. 7, when the unit size w is in the range of 100 nm to 250 nm, the light extraction efficiency obtained by the light scattering layer 151 according to the present embodiment is similar to that provided by the optical sheet 60 that differs from the optical sheet of the present embodiment. When the unit size w is in the range of 250 nm to 4 µm, the light extraction efficiency obtained by the light scattering layer 151 according to the present embodiment is higher than that obtained by the optical sheet 60 that differs from the optical sheet of the present embodiment.

Figure 8A:
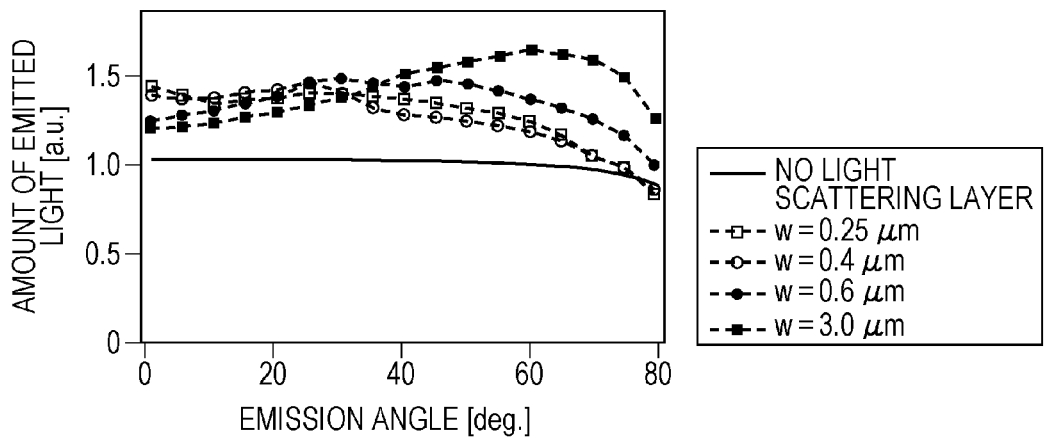
FIG. 8A is a graph showing the calculation result of the emission angle distribution of the amount of light emitted into the air layer through the light scattering layer according to the first embodiment.

Next, assuming that light present in the transparent substrate 14 is isotropic, the emission angle distribution of the amount of light emitted into the air layer 16 through the light scattering layer 151 is calculated. FIG. 8A is a graph showing the calculation result of the emission angle distribution of the amount of light emitted into the air layer 16 through the light scattering layer 151 according to the present embodiment. In FIG. 8A, the horizontal axis represents the emission angle at which light is emitted from the light scattering layer 151, and the vertical axis represents the amount of light emitted into the air layer 16 through the light scattering layer 151. With regard to calculation conditions, in the structure illustrated in FIGS. 1 and 2A, the refractive index of the first small areas 154 and the refractive index of the transparent substrate 14 are both set to 1.5, and the refractive index of the second small areas 155 and the refractive index of the air layer 16 are both set to 1.0. In FIG. 8A, the four dashed lines show the calculation results in the cases where the unit size w of each of the first small areas 154 and the second small areas 155 in the light scattering layer 151 according to the present embodiment is 0.25 µm, 0.4 µm, 0.6 µm, and 3.0 µm. The solid line shows the calculation result in the case where the light scattering layer 151 is not provided.

Figure 8B:
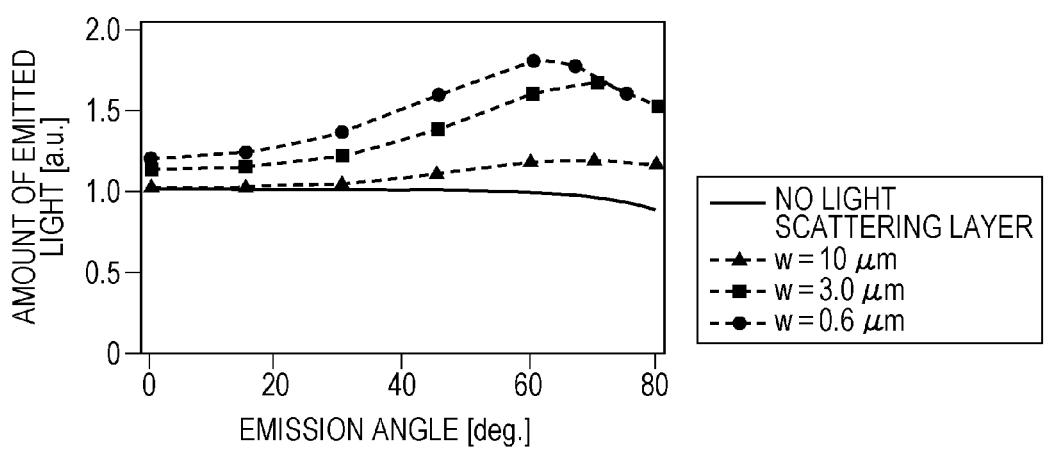
FIG. 8B is a graph showing the calculation result of distribution of the total amount of emitted light with respect to the emission angle, the light being emitted into the air layer through an optical sheet that differs from the optical sheet of the present embodiment.

FIG. 8B is a graph showing the calculation result of the emission angle distribution of the amount of light emitted into the air layer through the optical sheet 60 that differs from the optical sheet of the present embodiment. In FIG. 8B, the three dashed lines show the calculation results in the cases where the unit size of each of the first small areas 601 and the second small areas 602 in the optical sheet 60 that differs from the optical sheet of the present embodiment is 0.6 µm, 3.0 µm, and 10 µm. As is clear from FIGS. 8A and 8B, with the optical sheet 60 that differs from the optical sheet of the present embodiment, a large amount of light is extracted at the wide-angle side (that is, in a direction at which the emission angle is relatively large). In contrast, with the light scattering layer 151 according to the present embodiment, a large amount of light is extracted at the front side (that is, in a direction at which the emission angle is relatively small) when the unit size w is in the range of 0.25 µm (250 nm) to 0.6 µm.

Thus, it has been found that, to increase the light extraction efficiency with the pattern of the light scattering layer 151 according to the present embodiment, the unit size w is desirably in the range of 100 nm to 4 µm, and more desirably, in the range of 250 nm to 4 µm. Furthermore, to extract the light toward the front side with the increased light extraction efficiency, the unit size w is desirably in the range of 250 nm to 0.6 µm. These numerical ranges of the unit size w are for when the wavelength of the light is 550 nm. Since scattering of the light caused by the light scattering layer 151 is based on the diffraction phenomenon, the ranges of the unit size w are proportional to the wavelength of light. Therefore, in the case where the center wavelength of the light is $\lambda$, to increase the light extraction efficiency, the unit size w is desirably in the range of $0.18\lambda$ to $7.3\lambda$, and more desirably, in the range of $0.45\lambda$ to $7.3\lambda$. Furthermore, to extract the light toward the front side with the increased light extraction efficiency, the unit size w is desirably in the range of $0.45\lambda$ to $1.1\lambda$. The center wavelength $\lambda$ is a wavelength at which the total intensity of light having wavelengths above that wavelength is equal to the total intensity of light having wavelengths below that wavelength.

Advantages

As described above, the spatial frequency components of the pattern of the light scattering layer 151 according to the present embodiment have a peak at a spatial frequency around $1/(2w)$. Furthermore, the spatial frequency components of the pattern are suppressed at high spatial frequencies around $1/w$ and low spatial frequencies around 0. In other words, the intensity distribution has an upwardly convex shape in which the spatial frequency components are suppressed at spatial frequencies around $1/w$ and 0 and have a peak at a spatial frequency around $1/(2w)$. The intensity distribution curve has a half-width that is, for example, about $1/(2w)$. Accordingly, a large part of light incident on the light scattering layer 151 can be converted into scattered light, and a part of the scattered light can be suppressed. The part of the scattered light is emitted from the light scattering layer 151 in directions around the emission direction of the non-scattered light, which is zeroth-order light. The width of the intensity distribution curve around a spatial frequency around $1/(2w)$, which corresponds to the peak, is desirably greater than or equal to the spectrum width $\Delta\lambda$ of the light emission wavelength of the light emitting element. In other words, the intensity distribution curve desirably has a width of $1/(2w\pm\Delta\lambda/2)$ or more. In this case, light components having different wavelengths can be extracted from the light emitting element.

When the center wavelength of the light incident on the light scattering layer 151 is $\lambda$, the unit size w of each of the first small areas 154 and the second small areas 155 is desirably in the range of $0.18\lambda$ to $7.3\lambda$, and more desirably, in the range of $0.45\lambda$ to $7.3\lambda$. Therefore, the above-described conditions of the spatial frequency of the pattern can be expressed by using the center wavelength $\lambda$ as follows. That is, in the pattern of the present embodiment, the spatial frequency components are suppressed at the spatial frequencies around 0 and $1/w$, where w is desirably in the range of $0.18\lambda$ to $7.3\lambda$, and more desirably, in the range of $0.45\lambda$ to $7.3\lambda$. In addition, the spatial frequency corresponding to a maximum peak is desirably around $1/(2w)$. Therefore, the spatial frequency corresponding to the maximum peak is desirably in the range of $1/(2\times7.3\lambda)=0.068/\lambda$ or more and $1/(2\times0.18\lambda)=2.8/\lambda$ or less, and more desirably, in the range of $1/(2\times7.3\lambda)=0.068/\lambda$ or more and $1/(2\times0.45\lambda)=1.3/\lambda$ or less.

When the refractive index of the transparent substrate 14 is $n_1$ and the refractive index of the air layer 16 is $n_0$, the above-described conditions of the spatial frequency of the pattern may be expressed as follows. That is, assuming that light propagates from a medium having the refractive index $n_1$ to a medium having the refractive index $n_0$ and the light is diffracted at a spatial frequency of $1/w$, when $\theta_1$ is the incident angle of the light and $\theta_0$ is the emission angle of the light, the following equation is satisfied:

$$w(n_0 \sin\theta_0 - n_1 \sin\theta_1) = m\lambda \quad (2)$$

In Equation (2), m is an integer and $\lambda$ is the wavelength of light. Equation (2) can be rewritten into Equation (3) as follows:

$$\sin\theta_0 = (m\lambda/w + n_1 \sin\theta_1)/n_0 \quad (3)$$

In Equation (3), when the emission angle $\theta_0$ does not have a solution, the emission angle $\theta_0$ of the light does not vary, in other words, diffraction (scattering) of the light does not occur. When the first term on the right side of Equation (3) is absent, Equation (3) is the same as the Snell's law, and represents the case in which the light scattering layer 151 is not provided. When the value of $\lambda/w$, which is proportional to the spatial frequency component, is sufficiently small, that is, when the unit size w is sufficiently large, the first term on the right side of Equation (3) is sufficiently small. This is equivalent to the case in which the light scattering layer 151 is not provided. When the value of $\lambda/w$ is sufficiently large, that is, when the unit size w is sufficiently small, the first term on the right side of Equation (3) is sufficiently large. Therefore, the emission angle $\theta_0$ does not have a solution except for the case in which m=0. This is also substantially equivalent to the case in which the light scattering layer 151 is not provided.

Thus, the pattern of the light scattering layer 151 according to the present embodiment can be regarded as a scattering structure capable of effectively converting the emission angle $\theta_0$ of the light by suppressing the spatial frequency components at sufficiently high and sufficiently low spatial frequencies.

As is clear from Equation (3), the emission angle $\theta_0$ depends on the refractive index $n_0$ of the air layer 16. The above-described conditions of the spatial frequency of the pattern are inverse proportional to the refractive index $n_0$ of the air layer 16, and can therefore be expressed as follows. That is, in the pattern, the spatial frequency components are suppressed at the spatial frequencies around 0 and $1/w$, where w is desirably in the range of $0.18n_0\times\lambda$ to $7.3n_0\times\lambda$, and more desirably, in the range of $0.45n_0\times\lambda$ to $7.3n_0\times\lambda$. In addition, the spatial frequency corresponding to a maximum peak is desirably around $1/(2w)$. Therefore, the spatial frequency corresponding to the maximum peak is desirably in the range of $1/(2\times7.3n_0\lambda)=0.068/(n_0\times\lambda)$ or more and $1/(2\times0.18n_0\lambda)=2.8/$ ($n_0 \times \lambda$) or less, and more desirably, in the range of $1/(2 \times 7.3 n_0 \lambda) = 0.068/(n_0 \times \lambda)$ or more and $1/(2 \times 0.45 n_0 \lambda) = 1.3/(n_0 \times \lambda)$ or less.

Appearance Frequencies of First and Second Unit Structures

Figure 9:
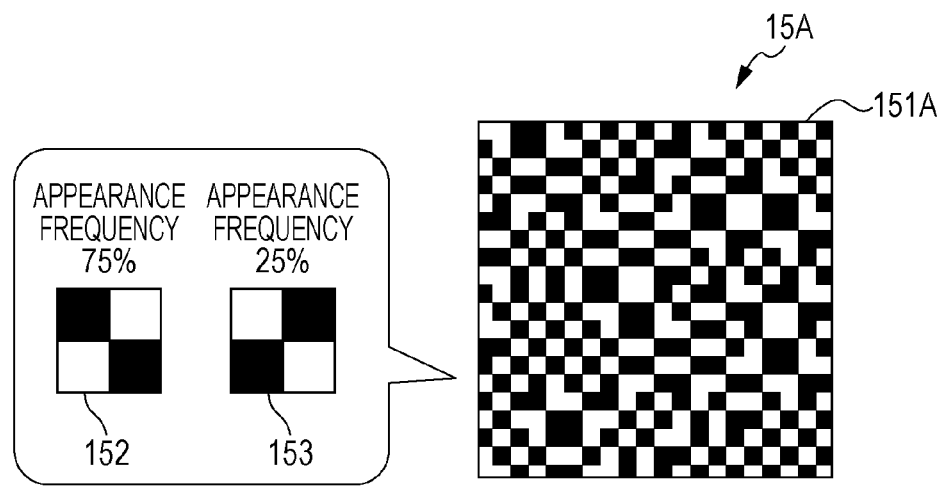
FIG. 9 is a plan view of an optical sheet in which the appearance frequencies of the first and second unit structures are 75% and 25%, respectively.
Figure 10:
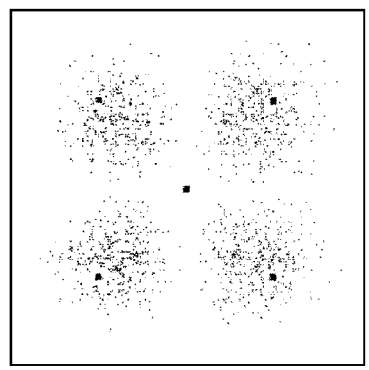
FIG. 10 illustrates the amplitudes of spatial frequency components obtained by taking the Fourier transform of a pattern of a light scattering layer illustrated in FIG. 9.

FIG. 9 is a plan view of an optical sheet 15A in which the appearance frequencies of the first unit structures 152 and the second unit structures 153 are 75% and 25%, respectively. FIG. 10 illustrates the amplitudes of spatial frequency components obtained by taking the Fourier transform of the pattern of a light scattering layer 151A illustrated in FIG. 9.

When the first unit structures 152 and the second unit structures 153 are randomly arranged at the above-described appearance frequencies, not only random components but also periodic components appear due to periodic appearance of the first unit structures 152, which have a high appearance frequency. Therefore, as illustrated in FIG. 10, the light emitted from the light scattering layer 151A includes both the scattered light based on the random components and the non-scattered light (first-order light) based on the periodic components.

Figure 11A:
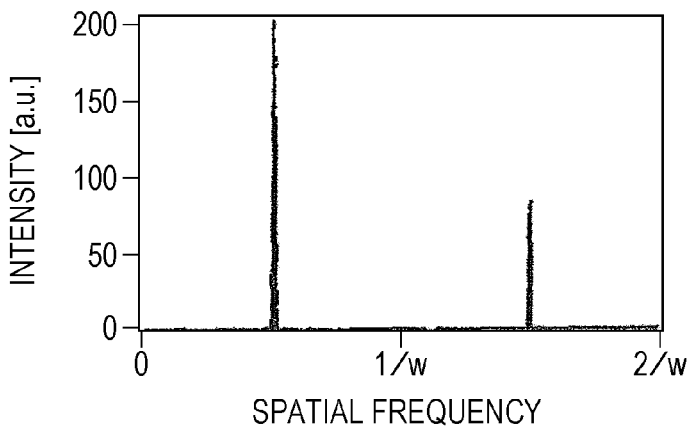
FIG. 11A is a graph showing a one-dimensional distribution in a certain direction of spatial frequency components obtained by taking the Fourier transform of the pattern in the case where the appearance frequency of the first unit structures is 100%.
Figure 11B:
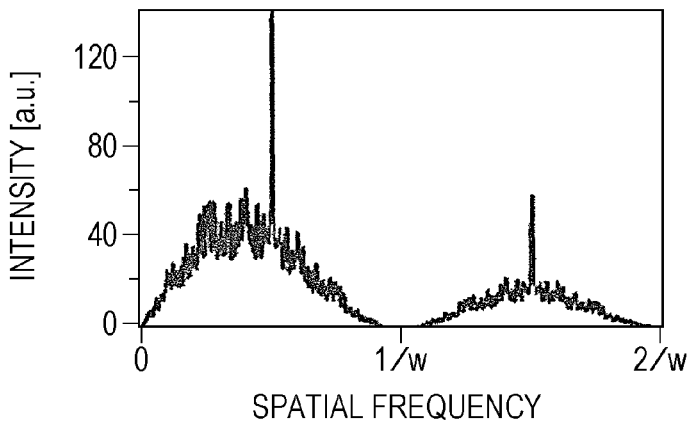
FIG. 11B is a graph showing a one-dimensional distribution in a certain direction of spatial frequency components obtained by taking the Fourier transform of the pattern in the case where the appearance frequency of the first unit structures is 80%.
Figure 11C:
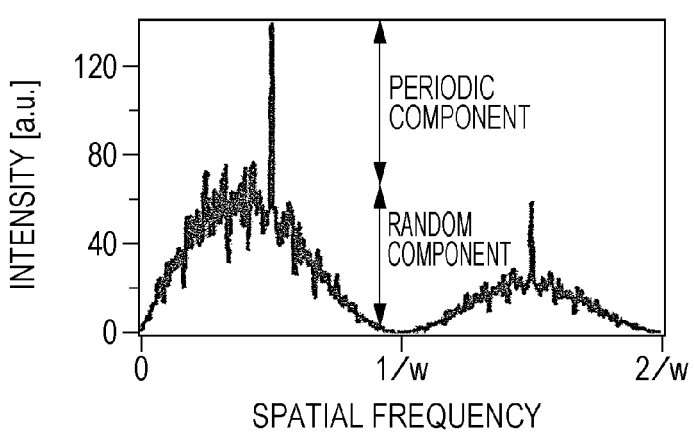
FIG. 11C is a graph showing a one-dimensional distribution in a certain direction of spatial frequency components obtained by taking the Fourier transform of the pattern in the case where the appearance frequency of the first unit structures is 70%.
Figure 11D:
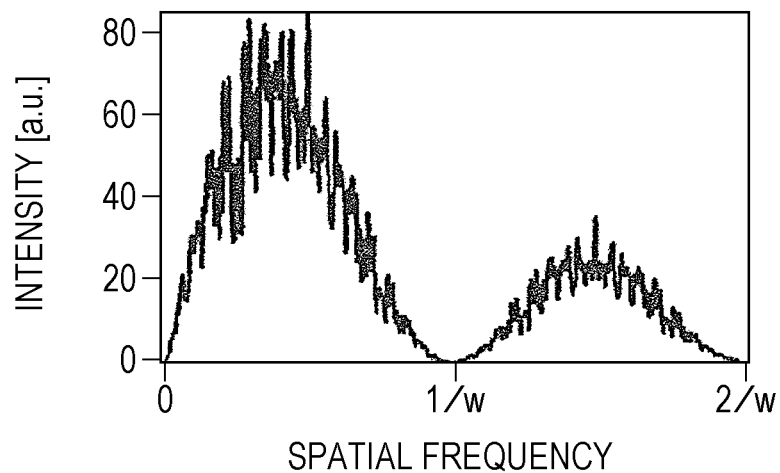
FIG. 11D is a graph showing a one-dimensional distribution in a certain direction of a spatial frequency components obtained by taking the Fourier transform of the pattern in the case where the appearance frequency of the first unit structures is 60%.
Figure 11E:
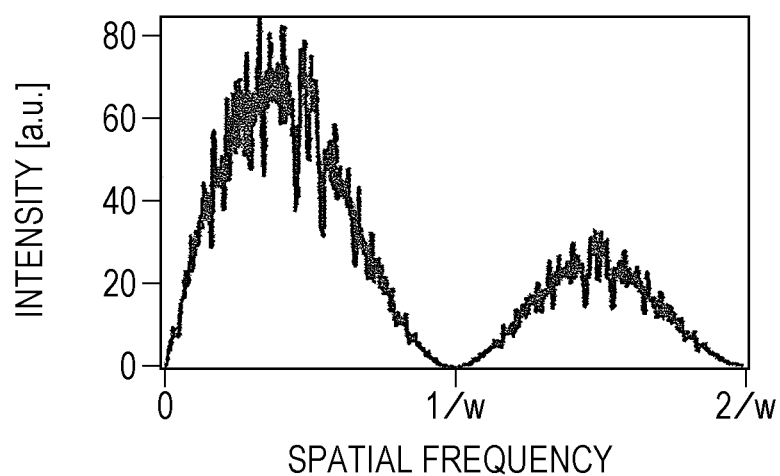
FIG. 11E is a graph showing a one-dimensional distribution in a certain direction of spatial frequency components obtained by taking the Fourier transform of the pattern in the case where the appearance frequency of the first unit structures is 50%.

FIGS. 11A to 11E are graphs showing one-dimensional distributions in a certain direction of spatial frequency components obtained by taking the Fourier transform of the pattern in the cases where the appearance frequency of the first unit structures 152 is 100%, 80%, 70%, 60%, and 50%, respectively. In the case where the appearance frequency of the first unit structures 152 is 100%, the periodic components are dominant. Therefore, as illustrated in FIG. 11A, the spatial frequency components of the pattern have steep peaks at spatial frequencies corresponding to periods, and are extremely small at other special frequencies. In the case where the appearance frequency of the first unit structures 152 is 50%, as illustrated in FIG. 11E, the spatial frequency components of the pattern have no steep peaks. Also, in the range from around 0 to around 1/w, the intensity distribution curve has a gentle upwardly convex shape with a certain width. This shows that the random components are dominant. In the case where the appearance frequency of the first unit structures 152 is 60%, although the periodic components are present in theory, as illustrated in FIG. 11D, the spatial frequency components of the pattern have substantially no steep peaks. In the cases where the appearance frequency of the first unit structures 152 is 80% and 70%, the periodic components more frequently appears. Therefore, as illustrated in FIGS. 11B and 11C, the spatial frequency components of the pattern have both a gentle intensity distribution with a certain width based on the random components and steep peaks due to the periodic components.

Here, assume that the appearance frequency of the first unit structures 152 is x % and the appearance frequency of the second unit structures 153 is y % (where x>y). In this case, some of the first unit structures 152 that correspond to y % have the second unit structures 153, whose appearance frequency is y %, to form pairs, and therefore serve as random components. However, the remaining first unit structures 152 that correspond to (x−y) % have no second unit structures 153 to form pairs, and therefore serve as periodic components. In other words, when the appearance frequency of the first unit structures 152 is x % and the appearance frequency of the second unit structures 153 is y %, some of the first unit structures 152 that correspond to y % serve as random components, and the remaining first unit structures 152 that correspond to (x−y) % serve as periodic components. Therefore, the condition under which the random components become dominant is y>x−y. In the case where x+y=100%, this condition can be rewritten as x<66.6%. This condition matches the fact that the random components are dominant when the appearance frequency of the first unit structures 152 is 60%, as illustrated in FIG. 11D, while the periodic components clearly appear when the appearance frequency of the first unit structures 152 is 70%, as illustrated in FIG. 11C.

As described above, it can be determined whether or not the random components are dominant by analyzing the spatial frequency components of the pattern. For example, in a spatial frequency spectrum of a certain pattern, when the amplitude of the intensity distribution due to the random components is greater than that of frequency components due to periodicity, it can be determined that the random components are dominant in that pattern. In the pattern of the light scattering layer 151 according to the present embodiment, the random components are dominant.

Heights from Bottom Parts of Recesses to Top Parts of Projections

Figure 12:
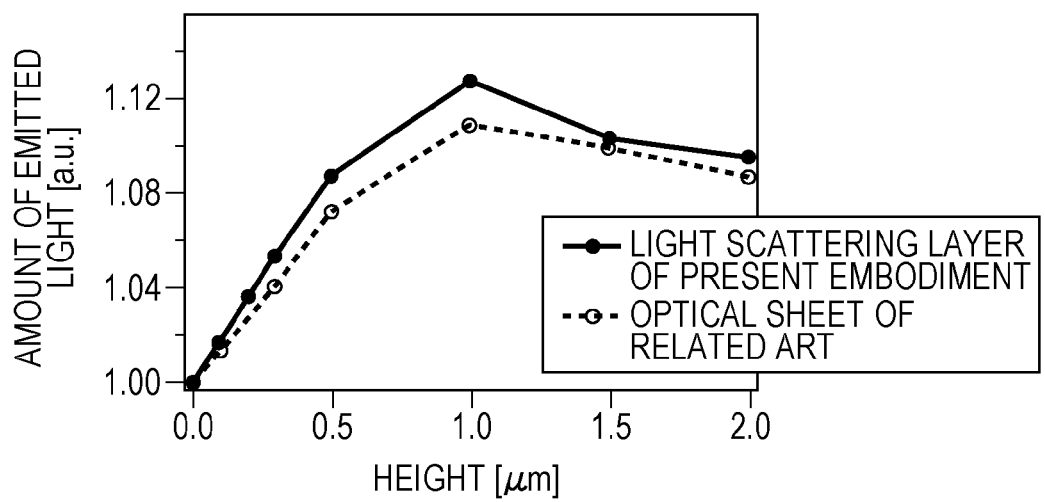
FIG. 12 is a graph showing the calculation result of the dependence of the total amount of light emitted into the air layer through the light scattering layer on the height h from the bottom part of the recess to the top part of the projection.

FIG. 12 is a graph showing the calculation result of the dependence of the total amount of light emitted into the air layer 16 through the light scattering layer 151 on the height h from the bottom part of the recess 155a to the top part of the projection 154a. In FIG. 12, the horizontal axis represents the height h from the bottom part of the recess 155a to the top part of the projection 154a, and the vertical axis represents the total amount of light emitted into the air layer 16 through the light scattering layer 151. With regard to calculation conditions, in the structure illustrated in FIGS. 1 and 2A, the refractive index of the first small areas 154 and the refractive index of the transparent substrate 14 are both set to 1.5, the refractive index of the second small areas 155 and the refractive index of the air layer 16 are both set to 1.0, and the unit size w of each of the first small areas 154 and the second small areas 155 is 1 μm. In FIG. 12, the solid line shows the calculation result for the light scattering layer 151 according to the present embodiment. The dashed line shows the calculation result for the optical sheet 60 that differs from the optical sheet of the present embodiment.

As is clear from FIG. 12, in particular, in the range in which the height h is smaller than or equal to 1.5 μm, the light extraction efficiency obtained by the light scattering layer 151 according to the present embodiment is higher than that obtained by the optical sheet that differs from the optical sheet of the present embodiment. Therefore, the height h from the bottom part of the recess 155a to the top part of the projection 154a may, for example, be set so as to be smaller than or equal to 1.5 μm. In the case where the height h is greater than or equal to 0.1 μm, the light extraction efficiency is higher than that obtained by the optical sheet that differs from the optical sheet of the present embodiment. When the height h is greater than or equal to 0.5 μm, the light extraction efficiency is further increased. Therefore, the height h from the bottom part of the recess 155a to the top part of the projection 154a is desirably greater than or equal to 0.1 μm. More desirably, the height h from the bottom part of the recess 155a to the top part of the projection 154a is desirably greater than or equal to 0.5 μm.

Figure 13:
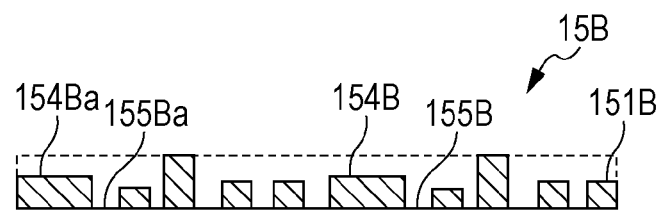
FIG. 13 is a sectional view of an optical sheet according to a modification.

In the present embodiment, it is assumed that the projections 154a and recesses 155a have the same height h. However, the projections 154a and recesses 155a may instead have random heights. FIG. 13 is a sectional view of an optical sheet 15B according to a modification. In the optical sheet 15B illustrated in FIG. 13, heights from the bottom parts of the recesses 155Ba to the top parts of projections 154Ba are random heights. When light passes through the projections 154Ba and the recesses 155Ba, phase differences are generated in accordance with the heights from the bottom parts of the recesses 155Ba to the top parts of the projections 154Ba. At this time, the average phase difference of the transmitted light is determined by the average height from the bottom parts of the recesses 155Ba to the top parts of the projections 154Ba. Therefore, also in this case, as long as a sufficient average phase difference is generated in the transmitted light, the average height from the bottom parts of the recesses 155Ba to the top parts of the projections 154Ba may be set so as to be smaller than or equal to 1.5 μm.

Modification of First Embodiment

In this modification, in the structure illustrated in FIGS. 1 and 2A, the percentage of the intensity of light incident on the light scattering layer 151 at an angle greater than the critical angle in the total intensity of light incident on the light scattering layer 151 is 50% or more. The conditions which the spatial frequency components of the pattern of the light scattering layer 151 are to satisfy in this case will now be described.

Figure 14:
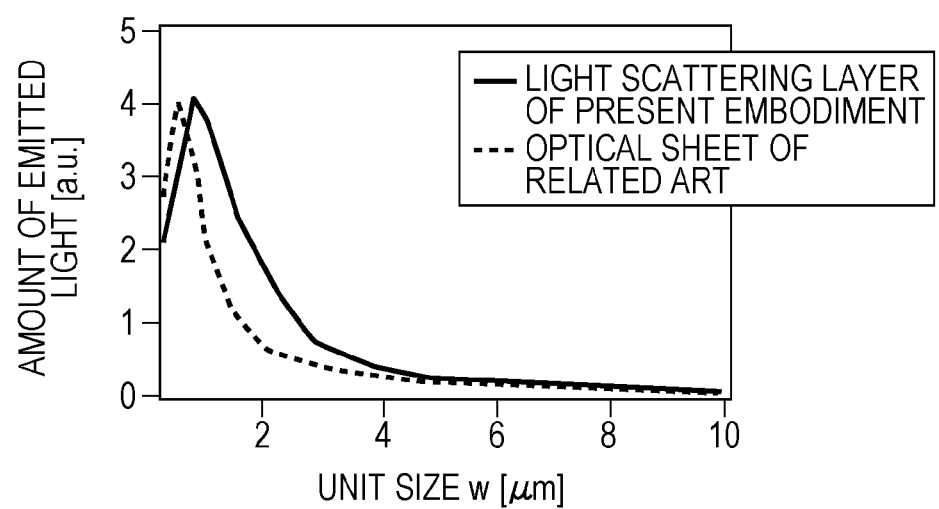
FIG. 14 is a graph showing the calculation result of the dependence of the total amount of light emitted into the air layer through a light scattering layer according to the modification of the first embodiment on a unit size w of each of first small areas and second small areas.

FIG. 14 is a graph showing the calculation result of the dependence of the total amount of light emitted into the air layer 16 through the light scattering layer 151 on the unit size w of each of the first small areas 154 and the second small areas 155 according to the modification of the first embodiment. With regard to calculation conditions, assuming that only light that travels at an angle greater than the critical angle is present in the transparent substrate 14, the refractive index of the first small areas 154 and the refractive index of the transparent substrate 14 are both set to 1.5, and the refractive index of the second small areas 155 and the refractive index of the air layer 16 are both set to 1.0. In FIG. 14, the solid line shows the calculation result for the light scattering layer 151 according to the present modification. The dashed line shows the calculation result for the optical sheet 60 that differs from the optical sheet of the present embodiment. As is clear from FIG. 14, when the unit size w is in the range of 0.6 μm to 5 μm, the light extraction efficiency obtained by the light scattering layer 151 according to the present modification is higher than that obtained by the optical sheet 60 that differs from the optical sheet of the present embodiment. When the center wavelength is $\lambda$, the above-described range of the unit size w is $1.1\lambda$ to $9.1\lambda$.

Accordingly, the conditions of the spatial frequency of the pattern of the present modification can be expressed by using the center wavelength $\lambda$ and the refractive index n of the air layer 16 at the emission side as follows. That is, in the pattern of the present modification, the spatial frequency components are suppressed at the spatial frequencies around 0 and 1/w, where w is desirably in the range of $1.1n\times\lambda$ to $9.1n\times\lambda$. In addition, the spatial frequency corresponding to a peak is desirably around 1/(2 w). Therefore, the spatial frequency corresponding to the peak is desirably in the range of $1/(2\times 9.1\lambda\times n)=0.055/(\lambda\times n)$ or more and $1/(2\times 1.1\lambda\times n)=0.45/(\lambda\times n)$ or less.

Second Embodiment

Figure 15A:
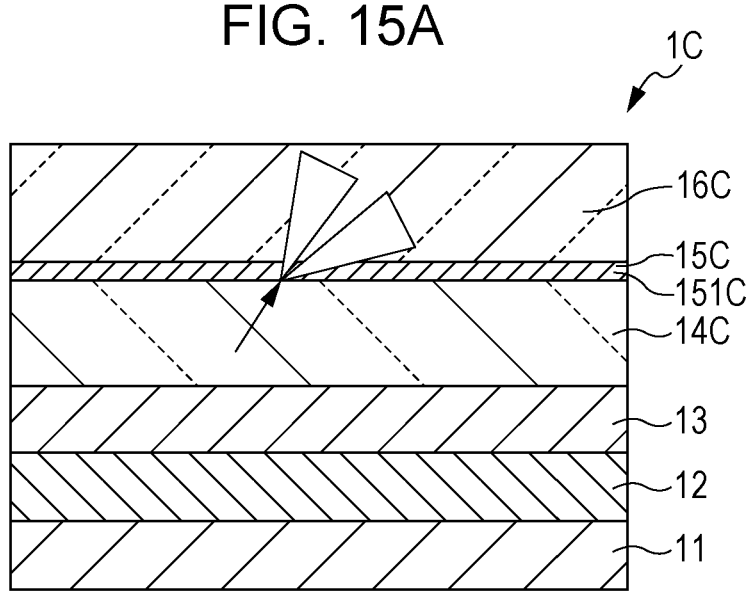
FIG. 15A is a sectional view of a light emitting apparatus according to a second embodiment.

FIG. 15A is a sectional view of a light emitting apparatus 1C according to a second embodiment. As illustrated in FIG. 15A, in the light emitting apparatus 1C according to the present embodiment, a protecting layer (transparent substrate) 16C is provided at a side of a light scattering layer 151C opposite to the side at which a high-refractive-index layer 14C is provided. The light scattering layer 151C is located between a light emitting layer 12 and the protecting layer 16C. The refractive index of the protecting layer 16C is, for example, 1.4 to 1.65, and the refractive index of the high-refractive-index layer 14C is higher than or equal to that of the protecting layer 16C. The material of the protecting layer 16C may be a transparent material such as glass or a resin. The material of the high-refractive-index layer 14C may be, for example, indium tin oxide (ITO), titanium oxide (TiO$_2$), silicon nitride (SiN), tantalum pentoxide (Ta$_2$O$_5$), zirconia (ZrO$_2$), or a resin. The light scattering layer 151C includes first small areas 154 which have a high refractive index that is closer to that of the high-refractive-index layer 14C. The material of the first small areas 154 may be, for example, a transparent material such as glass or a resin. The light scattering layer 151C also includes second small areas 155 which have a refractive index close to that of the protecting layer 16C. The material of the second small areas 155 may be, for example, indium tin oxide (ITO), titanium oxide (TiO$_2$), silicon nitride (SiN), tantalum pentoxide (Ta$_2$O$_5$), zirconia (ZrO$_2$), or a resin.

Figure 16:
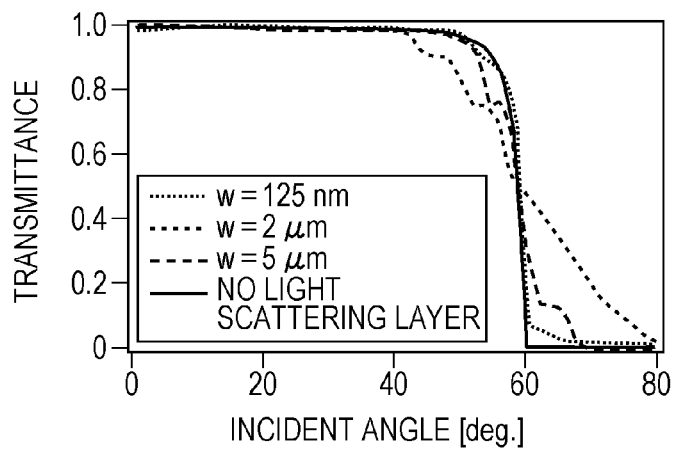
FIG. 16 is a graph showing the calculation result of the incident angle dependence of the light transmittance of a light scattering layer.

The incident angle dependence of the light transmittance of the light scattering layer 151C according to the present embodiment is calculated. FIG. 16 is a graph showing the calculation result of the incident angle dependence of the light transmittance of the light scattering layer 151C. In FIG. 16, the horizontal axis represents the incident angle of the light incident on the light scattering layer 151C, and the vertical axis represents the light transmittance of the light scattering layer 151C. With regard to calculation conditions, the refractive index of the first small areas 154 and the refractive index of the high-refractive-index layer 14C are both set to 1.75, the refractive index of the second small areas 155 and the refractive index of the protecting layer 16C are both set to 1.5, and the height h of the light scattering layer 151C is set to 1.0 μm. In FIG. 16, the three dashed lines show the calculation results in the cases where the unit size w of each of the first small areas 154 and the second small areas 155 is 125 nm, 2 μm, and 5 μm. The solid line shows the calculation result in the case where the light scattering layer 151C is not provided. As is clear from FIG. 16, in the case where the light scattering layer 151C is not provided, the transmittance is 0 when the incident angle exceeds the critical angle, which is about 60°. In contrast, in the case where the light scattering layer 151C is provided, the transmittance is higher than 0 even when the incident angle is greater than the critical angle of about 60°.

Figure 17:
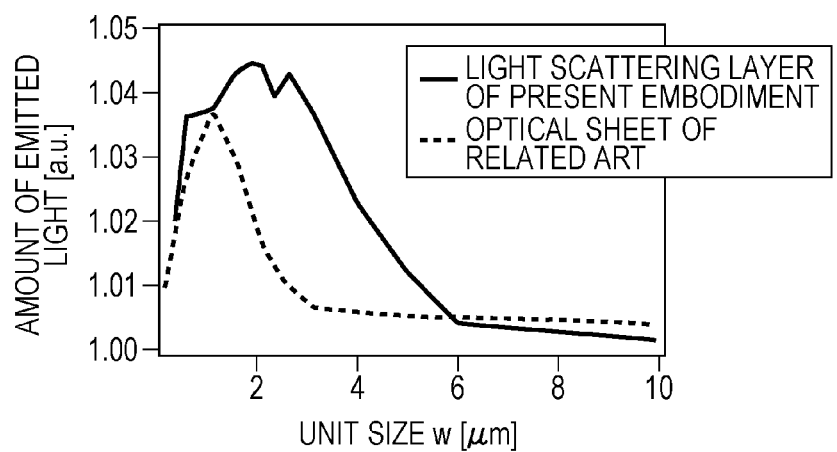
FIG. 17 is a graph showing the calculation result of the dependence of the total amount of light emitted into a protecting layer through the light scattering layer on a unit size w of each of first small areas and second small areas in the case where light present in a high-refractive-index layer is isotropic.

Next, assuming that light present in the high-refractive-index layer 14C is isotropic, the dependence of the total amount of light emitted into the protecting layer 16C through the light scattering layer 151C on the unit size w of each of the first small areas 154 and the second small areas 155 is calculated. FIG. 17 is a graph showing the calculation result of the dependence of the total amount of light emitted into the protecting layer 16C through the light scattering layer 151C on the unit size w of each of the first small areas 154 and the second small areas 155 in the case where light present in the high-refractive-index layer 14C is isotropic. In FIG. 17, the horizontal axis represents the unit size w of each of the first small areas 154 and the second small areas 155, and the vertical axis represents the total amount of light that is emitted into the protecting layer 16C through the light scattering layer 151C. With regard to calculation conditions, the refractive index of the first small areas 154 and the refractive index of the high-refractive-index layer 14C are both set to 1.75, and the refractive index of the second small areas 155 and the refractive index of the protecting layer 16C are both set to 1.5. In FIG. 17, the solid line shows the calculation result for the light scattering layer 151C according to the present embodiment. The dashed line shows the calculation result for the optical sheet 60 that differs from the optical sheet of the present embodiment. As is clear from FIG. 17, when the unit size w is in the range of 125 nm to 6 μm, the light extraction efficiency obtained by the light scattering layer 151C according to the present embodiment is higher than that obtained by the optical sheet 60 that differs from the optical sheet of the present embodiment.

Figure 18:
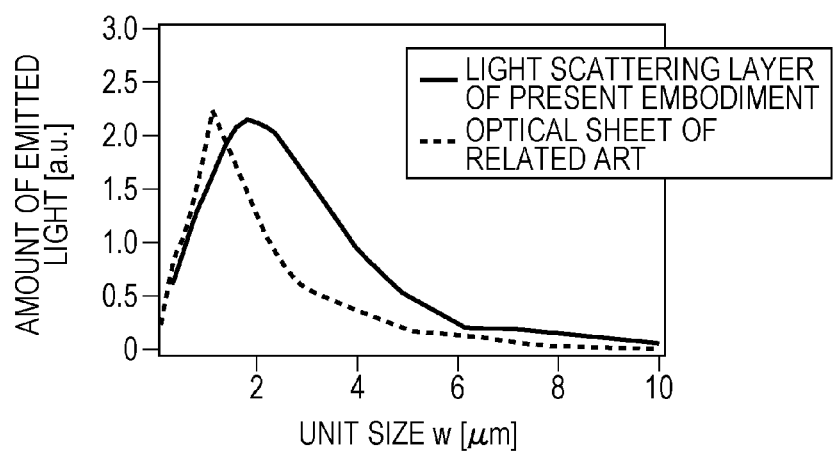
FIG. 18 is a graph showing the calculation result of the dependence of the total amount of light emitted into the protecting layer through the light scattering layer on the unit size w of each of the first small areas and second small areas in the case where only light that travels at an angle greater than or equal to the critical angle is present in the high-refractive-index layer.

Also, assuming that only light that travels at an angle greater than the critical angle is present in the high-refractive-index layer 14C, the dependence of the total amount of light emitted into the protecting layer 16C through the light scattering layer 151C on the unit size w of each of the first small areas 154 and the second small areas 155 is calculated. FIG. 18 is a graph showing the calculation result of the dependence of the total amount of light emitted into the protecting layer 16C through the light scattering layer 151C on the unit size w of each of the first small areas 154 and the second small areas 155 in the case where that only light that travels at an angle greater than the critical angle is present in the high-refractive-index layer 14C. As is clear from FIG. 18, when the unit size w is in the range of greater than or equal to 1.2 µm, the light extraction efficiency obtained by the light scattering layer 151C according to the present embodiment is higher than that obtained by the optical sheet 60 that differs from the optical sheet of the present embodiment.

Thus, it has been found that, to increase the light extraction efficiency with the pattern of the light scattering layer 151C according to the present embodiment, the unit size w is desirably in the range of 125 nm to 6 µm. This numerical range of the unit size w is for when the wavelength of the light is 550 nm. In the case where the center wavelength of the light is $\lambda$, to increase the light extraction efficiency, the unit size w is desirably in the range of $0.23\lambda$ to $11\lambda$. Therefore, the above-described conditions of the spatial frequency of the pattern can be expressed by using the center wavelength $\lambda$ and the refractive index n of the protecting layer 16C as follows. That is, in the pattern of the present embodiment, the spatial frequency components are suppressed at spatial frequencies around 0 and 1/w, where w is desirably in the range of $0.23n\times\lambda$ to $11n\times\lambda$. The spatial frequency corresponding to the peak is desirably around $1/(2w)$. Therefore, the spatial frequency corresponding to the peak is desirably in the range of $1/(2\times11\lambda\times n)=0.045/(\lambda\times n)$ to $1/(2\times0.23\lambda\times n)=2.2/(\lambda\times n)$.

Manufacturing Method and Structure of Light Scattering Layer

Figure 15B:
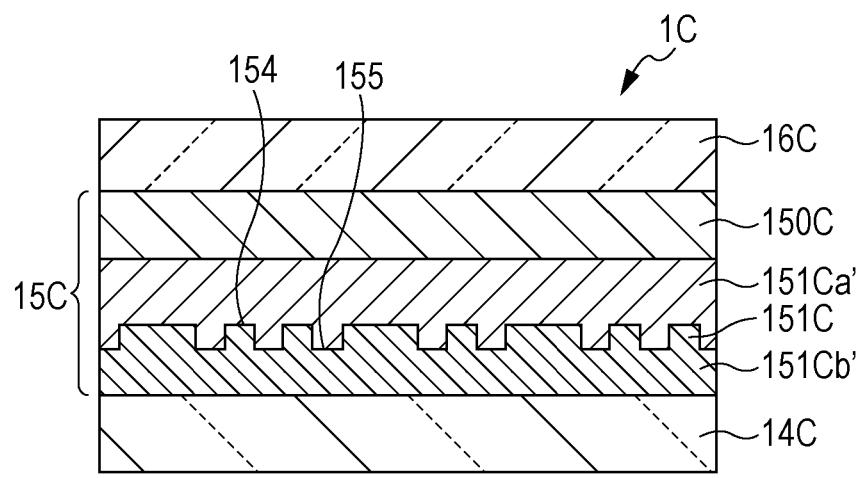
FIG. 15B is an enlarged sectional view of a part of the light emitting apparatus illustrated in FIG. 15A.

FIG. 15B is an enlarged sectional view of a part of the light emitting apparatus 1C illustrated in FIG. 15A. In the case where the light scattering layer 151C is formed in the light emitting apparatus 1C as illustrated in FIG. 15B, the first small areas 154 and a residual film portion 151Cb' are formed as follows. A sheet member is bonded to a surface of the protecting layer 16C. The sheet member includes a substrate 150C, a residual film portion 151Ca', and the second small areas 155. Then, the irregular structure of the second small areas 155 is embedded in a resin having a refractive index higher than that of the second small areas 155, to form the first small areas 154 and the residual film portion 151Cb'.

Alternatively, the first small areas 154 and the residual film portion 151Cb' may be formed as follows. The residual film portion 151Ca' and the second small areas 155 are formed on a surface of the protecting layer 16C. Then, the irregular structure of the second small areas 155 is embedded in a resin having a refractive index higher than that of the second small areas 155, to form the first small areas 154 and the residual film portion 151Cb'. In those case, the high-refractive-index layer 14C may be omitted, and the transparent electrode 13 may be formed on a surface of the residual film portion 151Cb'.

Alternatively, the second small areas 155 and the residual film portion 151Ca' may be formed as follows. The first small areas 154 and the residual film portion 151Cb' are formed on a surface of the high-refractive-index layer 14C. Then, the irregular structure of the first small areas 154 is embedded in a resin having a different refractive index, to form the second small areas 155 and the residual film portion 151Ca'. In this case, the substrate 150C may be omitted.

In the case where the substrate 150C is directly processed, the structure may be such that the residual film portion 151Ca' and the residual film portion 151Cb' are not provided.

In the present embodiment, a member including components required to form the irregular structure, that is, the substrate 150C, the residual film portion 151Ca', the residual film portion 151Cb', the first small areas 154, and the second small areas 155 (or some of them) is referred to as the light scattering layer 151C.

All of the above-described structures provide an effect of suppressing the total reflection of light at the light scattering layer 151C and increasing the light extraction efficiency, and are therefore included in the scope of the present disclosure.

The effect of suppressing the total reflection of light at the light scattering layer 151C and increasing the light extraction efficiency can be obtained when the refractive indices of the first small areas 154, the residual film portion 151Cb', and the high-refractive-index layer 14C are higher than the refractive indices of the second small areas 155 and the residual film portion 151Ca'. The material of each of the substrate 150C, the second small areas 155, and the residual film portion 151Ca' may be, for example, a transparent material such as glass or a resin. The material of each of the first small areas 154 and the residual film portion 151Cb' may be, for example, a transparent material such as high-refractive-index glass, a resin, or an inorganic material such as ITO, $TiO_2$, SiN, $Ta_2O_5$, or $ZrO_2$.

Third Embodiment

Figure 19A:
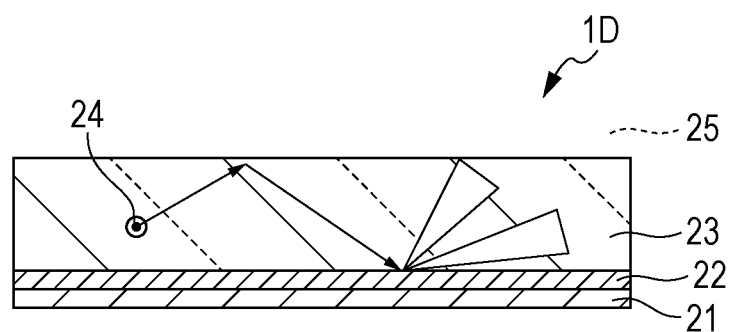
FIG. 19A is a sectional view of a light emitting apparatus according to a third embodiment.

FIG. 19A is a sectional view of a light emitting apparatus 1D according to a third embodiment. As illustrated in FIG. 19A, the light emitting apparatus 1D according to the present embodiment includes a reflective layer 21, an optical sheet 22, a transparent substrate 23, and a light emitting portion 24. The light emitting portion 24 is located in, for example, the transparent substrate 23. The optical sheet 22 is located between the reflective layer 21 and the light emitting portion 24, and has a structure similar to that of the optical sheet 15 (15A to 15C) described in the first and second embodiments. The light emitting apparatus 1D may include an independent light scattering layer instead of the optical sheet 22 including a light scattering layer.

A part of the light emitted from the light emitting portion 24 travels at an angle greater than the critical angle, and is totally reflected by the interface between the transparent substrate 23 and an outer layer 25. The totally reflected light is reflected by the reflective layer 21, and is then scattered by diffraction by the optical sheet 22. A large part of the scattered light emitted from the optical sheet 22 travels at an angle smaller than the critical angle, and is therefore emitted into the outer layer 25 through the transparent substrate 23.

Thus, according to the present embodiment, the light emitted from the light emitting portion 24 can be prevented from being trapped in the transparent substrate 23 as a result of total reflection. Therefore, the light extraction efficiency can be increased.

In the present embodiment, the light emitting portion 24 is located in the transparent substrate 23. However, the location of the light emitting portion 24 is not limited to this, and the light emitting portion 24 may instead be located outside the transparent substrate 23.

Modification of Third Embodiment

Figure 19B:
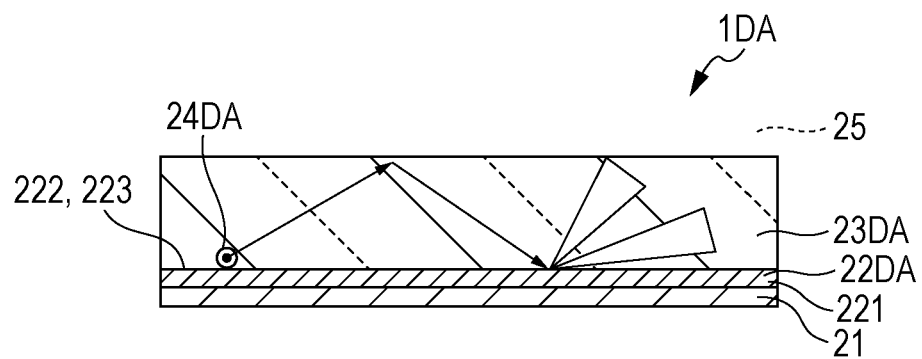
FIG. 19B is a sectional view of a light emitting apparatus according to a modification of the third embodiment.

FIG. 19B is a sectional view of a light emitting apparatus 1DA according to a modification of the third embodiment. As illustrated in FIG. 19B, in the light emitting apparatus 1DA according to this modification, a light emitting portion 24DA is provided on a transparent substrate 23DA so as to be in contact with an optical sheet 22DA. Similar to the above-described third embodiment, the transparent substrate 23DA is arranged so as to be in contact with the optical sheet 22DA.

The optical sheet 22DA includes a light scattering layer 221. Similar to the above-described first and second embodiments, the light scattering layer 221 includes a plurality of projections 222 (first small areas) and a plurality of recesses 223 (second small areas).

Spatial frequency components obtained by taking the Fourier transform of data obtained by converting the distribution of heights from the bottom parts of the recesses 223 to top parts of the projections 222 in the light scattering layer 221 according to the present modification into a numerical form can be expressed by using the center wavelength λ of light and the refractive index n of the outer layer 25 at the emission side as follows. That is, the spatial frequency components have a maximum peak at a spatial frequency in the range of $0.068/(\lambda \times n)$ or more and $2.8/(\lambda \times n)$ or less.

Fourth Embodiment

Structure of Optical Sheet

Figure 20A:
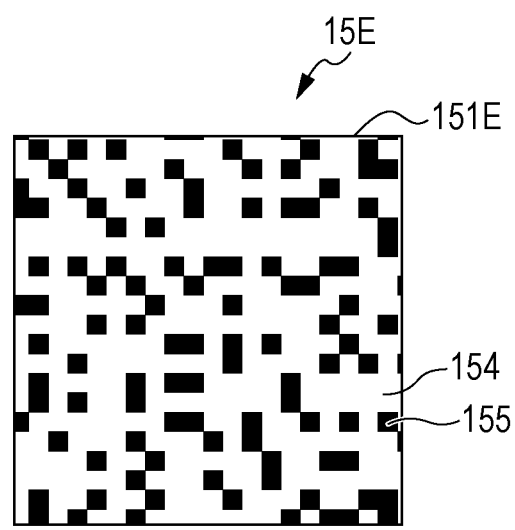
FIG. 20A is a plan view of an optical sheet according to a fourth embodiment.
Figure 20B:
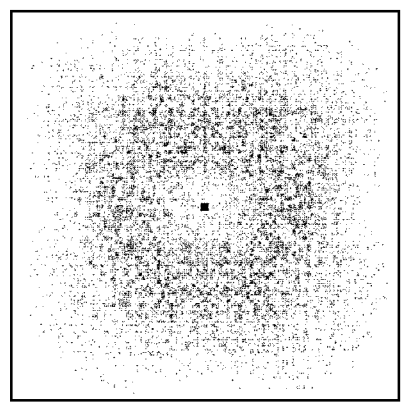
FIG. 20B illustrates the amplitudes of spatial frequency components obtained by taking the Fourier transform of a pattern of a light scattering layer illustrated in FIG. 20A.

FIG. 20A is a plan view of an optical sheet 15E according to a fourth embodiment. FIG. 20B illustrates the amplitudes of spatial frequency components obtained by taking the Fourier transform of a pattern of a light scattering layer 151E illustrated in FIG. 20A.

Figure 21:
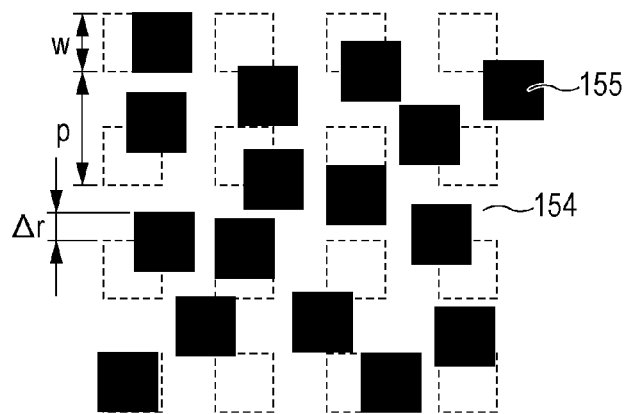
FIG. 21 is a diagram for describing the pattern of the light scattering layer illustrated in FIG. 20A.

FIG. 21 is a diagram for describing the pattern of the light scattering layer 151E illustrated in FIG. 20A. As illustrated in FIG. 21, according to the present embodiment, a plurality of second small areas 155 are arranged in an arrangement pattern obtained by applying a positional fluctuation $\Delta r$ to the arrangement pattern of a diffraction grating shown by the dashed lines in FIG. 21. The positional fluctuation $\Delta r$ is greater than one-fourth the period p of the diffraction grating (or half the unit size w of the second small areas 155) on average. More specifically, four types of positional fluctuations $\Delta r$, which are (1) positional fluctuation $\Delta r = 0$, (2) positional fluctuation $\Delta r = p/2$ in the x direction, (3) positional fluctuation $\Delta r = p/2$ in the y direction, and (4) positional fluctuation $\Delta r = p/2$ in x and y directions, are provided at the same percentage.

In the pattern of the light scattering layer 151E according to the present embodiment, no periodic components appear. As a result, according to the present embodiment, an effect similar to that of the first embodiment can be obtained. Therefore, the pattern of the light scattering layer 151E according to the present embodiment is included in the scope of the present disclosure.

Comparison with Diffraction Grating

Figure 22A:
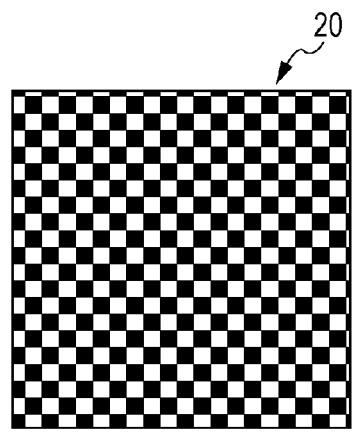
FIG. 22A is a plan view of an optical sheet having a diffraction grating pattern that differs from the pattern of the present embodiment.
Figure 22B:
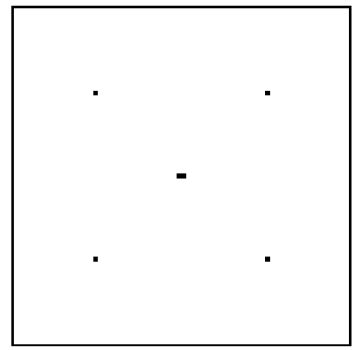
FIG. 22B illustrates the amplitudes of spatial frequency components obtained by taking the Fourier transform of the diffraction grating pattern illustrated in FIG. 22A.

FIG. 22A is a plan view of an optical sheet 20 having a diffraction grating pattern that differs from the pattern of the present embodiment. FIG. 22B illustrates the amplitudes of spatial frequency components obtained by taking the Fourier transform of the diffraction grating pattern illustrated in FIG. 22A.

As illustrated in FIG. 22B, diffraction gratings have characteristics such that light incident thereon is collected in certain directions as a result of the interference effect. The characteristics of diffraction gratings differ from those of the pattern of the light scattering layer 151E according to the present embodiment, that is, the characteristics in which the incident light is scattered by diffraction.

Since diffraction gratings have a large wavelength dependence, when a diffraction grating is installed in a light emitting apparatus, color and brightness vary depending on the angle at which the light emitting apparatus is viewed (i.e. viewing angle). Therefore, it is difficult to apply a light emitting apparatus including a diffraction grating to a display or an illumination light source.

Figure 23A:
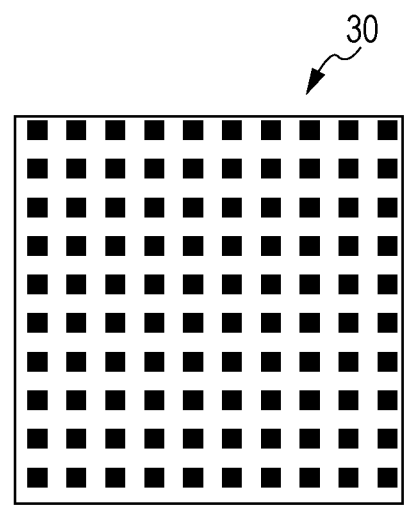
FIG. 23A is a plan view of an optical sheet having another diffraction grating pattern that differs from the pattern of the present embodiment.
Figure 23B:
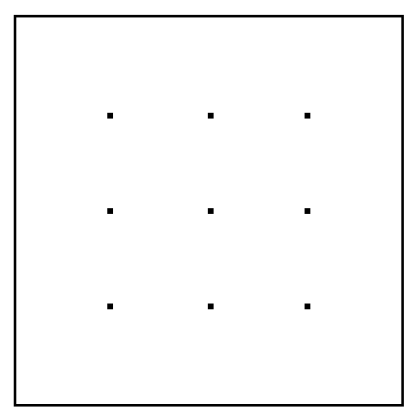
FIG. 23B illustrates the amplitudes of spatial frequency components obtained by taking the Fourier transform of the diffraction grating pattern illustrated in FIG. 23A.
Figure 24A:
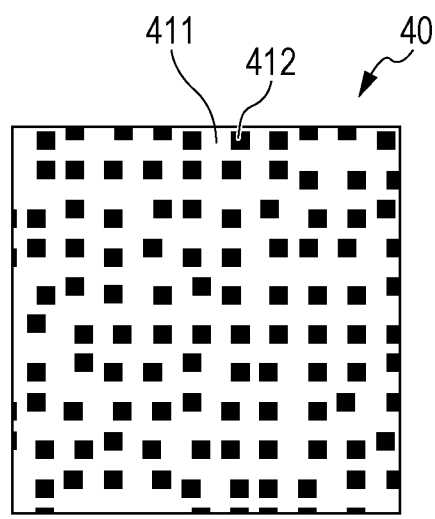
FIG. 24A is a plan view of an optical sheet having a pattern obtained by making the diffraction grating pattern that differs from the pattern of the present embodiment random.
Figure 24B:
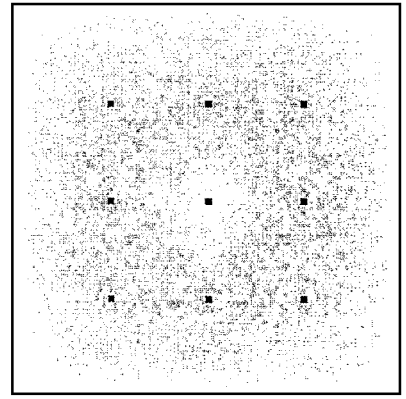
FIG. 24B illustrates the amplitudes of spatial frequency components obtained by taking the Fourier transform of the pattern illustrated in FIG. 24A.

Comparison with Optical Sheet that Differs from Optical Sheet of Present Embodiment FIG. 23A is a plan view of an optical sheet 30 having another diffraction grating pattern that differs from the pattern of the present embodiment. FIG. 23B illustrates the amplitudes of spatial frequency components obtained by taking the Fourier transform of the diffraction grating pattern illustrated in FIG. 23A. FIG. 24A is a plan view of an optical sheet 40 having a pattern obtained by adding randomness to the diffraction grating pattern that differs from the pattern of the present embodiment. FIG. 24B illustrates the amplitudes of spatial frequency components obtained by taking the Fourier transform of the pattern illustrated in FIG. 24A.

Figure 25:
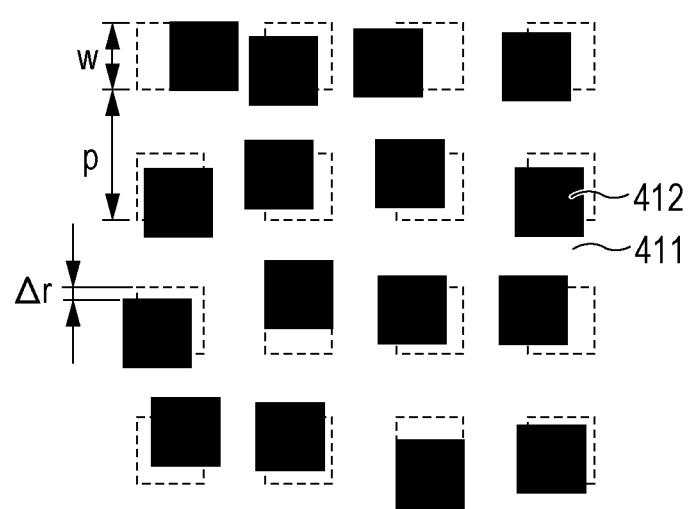
FIG. 25 is a diagram for describing the pattern of the optical sheet illustrated in FIG. 24A.

The optical sheet 40 illustrated in FIG. 24A is formed by arranging a plurality of first small areas 411 and a plurality of second small areas 412 in accordance with the rule described below. FIG. 25 is a diagram for describing the pattern of the optical sheet 40 illustrated in FIG. 24A. As illustrated in FIG. 25, in the optical sheet 40, the second small areas 412 are arranged in an arrangement pattern obtained by applying a positional fluctuation $\Delta r$ to the arrangement pattern of the diffraction grating shown by the dashed lines in FIG. 25. The positional fluctuation $\Delta r$ is less than or equal to one-fourth the period p of the diffraction grating (or half the unit size w). More specifically, four types of positional fluctuations $\Delta r$, which are (1) positional fluctuation $\Delta r = 0$, (2) positional fluctuation $\Delta r = p/4$ in the x direction, (3) positional fluctuation $\Delta r = p/4$ in the y direction, and (4) positional fluctuation $\Delta r = p/4$ in the x and y directions, are provided at the same percentage (see, for example, Japanese Patent No. 4822243 (hereinafter referred to as Patent Document 4)).

However, periodic components appear in the pattern illustrated in FIG. 24A. In the pattern illustrated in FIG. 24A, the amplitudes of the frequency components based on the periodic components are greater than those of the frequency components based on random components. Therefore, the pattern can be regarded as that of a diffraction grating, and the characteristics thereof differ from those of the pattern according to the present embodiment.

Fifth Embodiment

Figure 26A:
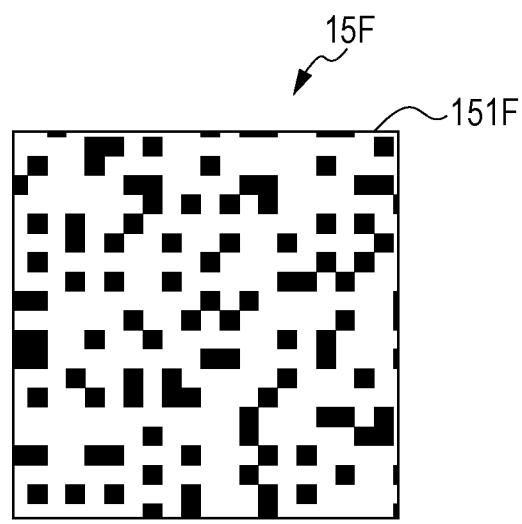
FIG. 26A is a plan view of an optical sheet according to a fifth embodiment.
Figure 26B:
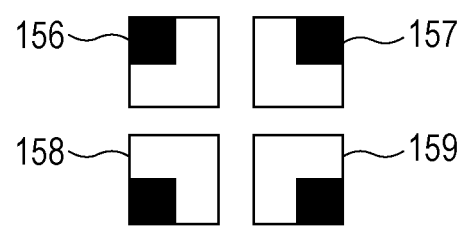
FIG. 26B is a plan view illustrating four types of unit structures included in a light scattering layer illustrated in FIG. 26A.
Figure 26C:
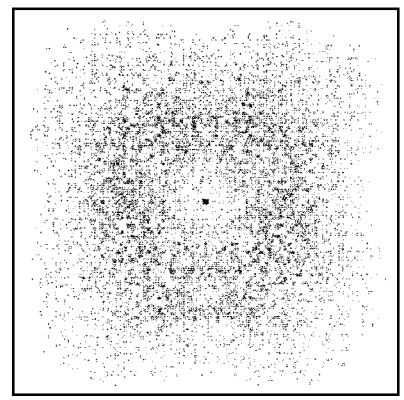
FIG. 26C illustrates the amplitudes of spatial frequency components obtained by taking the Fourier transform of a pattern of the light scattering layer illustrated in FIG. 26A.

FIG. 26A is a plan view of an optical sheet 15F according to a fifth embodiment. FIG. 26B is a plan view illustrating four types of unit structures 156, 157, 158, and 159 included in a light scattering layer 151F illustrated in FIG. 26A. FIG. 26C illustrates the amplitudes of spatial frequency components obtained by taking the Fourier transform of a pattern of the light scattering layer 151F illustrated in FIG. 26A.

The light scattering layer 151F according to the present embodiment has a pattern in which first unit structures 156, second unit structures 157, third unit structures 158, and fourth unit structures 159 are arranged. Referring to FIG. 26C, in the pattern according to the present embodiment, no spatial frequency components are present at spatial frequencies around 0. In other words, no scattered light is emitted in directions around the emission direction of the non-scattered light, which is zeroth-order light, from the light scattering layer 151F. Therefore, also in the present embodiment, an effect similar to that of the first embodiment can be obtained.

Sixth Embodiment

Figure 27A:
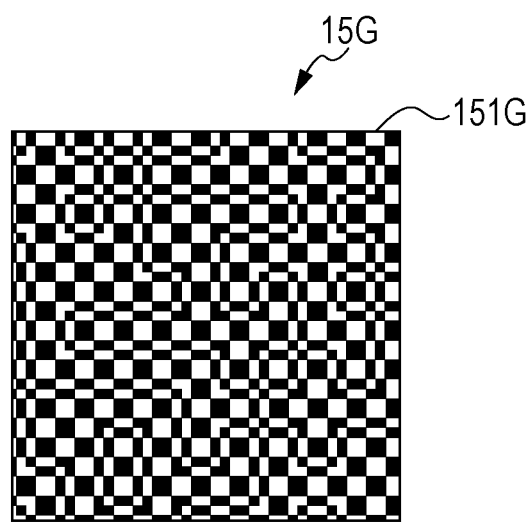
FIG. 27A is a plan view of an optical sheet according to a sixth embodiment.
Figure 27B:
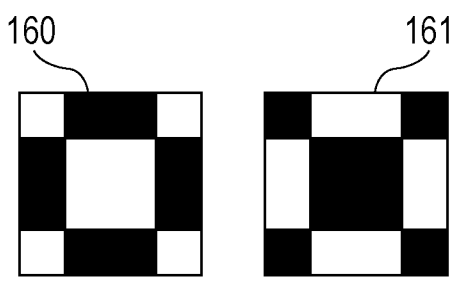
FIG. 27B is a plan view illustrating two types of unit structures included in a light scattering layer illustrated in FIG. 27A.
Figure 27C:
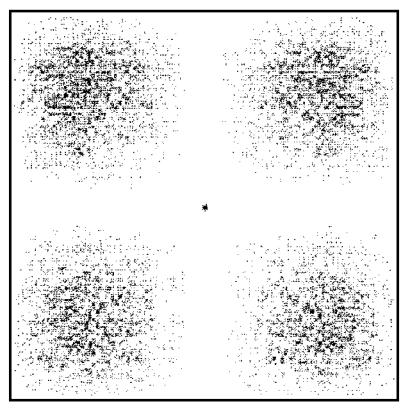
FIG. 27C illustrates the amplitudes of spatial frequency components obtained by taking the Fourier transform of a pattern of the light scattering layer illustrated in FIG. 27A.

FIG. 27A is a plan view of an optical sheet 15G according to a sixth embodiment. FIG. 27B is a plan view illustrating two types of unit structures 160 and 161 included in a light scattering layer 151G illustrated in FIG. 27A. FIG. 27C illustrates the amplitudes of spatial frequency components obtained by taking the Fourier transform of a pattern of the light scattering layer 151G illustrated in FIG. 27A.

The light scattering layer 151G according to the present embodiment has a pattern in which first unit structures 160 and second unit structures 161 are arranged. Referring to FIG. 27C, in the pattern according to the present embodiment, no spatial frequency components are present at spatial frequencies around 0. In other words, no scattered light is emitted in directions around the emission direction of the non-scattered light, which is zeroth-order light, from the light scattering layer 151G. Therefore, also in the present embodiment, an effect similar to that of the first embodiment can be obtained.

Figure 27D:
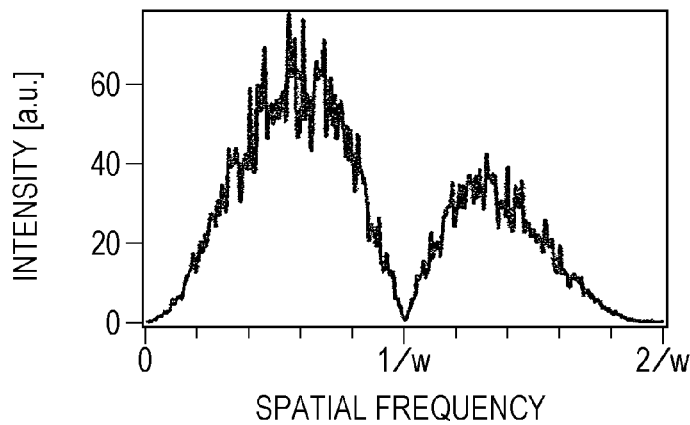
FIG. 27D is a graph showing a one-dimensional distribution in a certain direction of spatial frequency components obtained by taking the Fourier transform of the pattern illustrated in FIG. 27A.

FIG. 27D is a graph showing a one-dimensional distribution in a certain direction of spatial frequency components obtained by taking the Fourier transform of the pattern illustrated in FIG. 27A. As illustrated in FIG. 27D, the spatial frequency components of the pattern according to the present embodiment have a peak a spatial frequency that is slightly higher than $1/(2w)$. Furthermore, the spatial frequency components of this pattern are suppressed at high spatial frequencies around $1/w$ and low spatial frequencies around 0. In other words, the intensity distribution has an upwardly convex shape in which the spatial frequency components are suppressed at spatial frequencies around $1/w$ and 0 and have a peak at a spatial frequency that is slightly higher than $1/(2w)$. The intensity distribution curve has a half-width that is, for example, about $1/(2w)$.

Figure 27E:
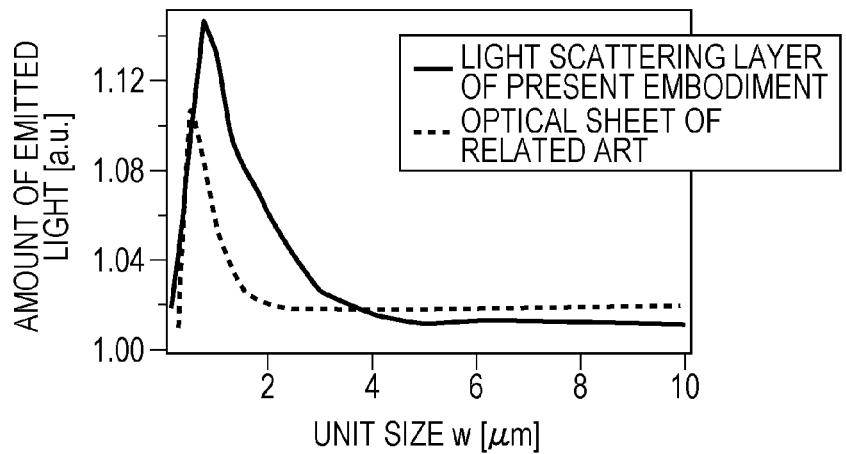
FIG. 27E is a graph showing the calculation result of the dependence of the total amount of light emitted into an air layer through the light scattering layer on a unit size w of each of first small areas and second small areas in the case where the light scattering layer is provided on a surface of a transparent substrate.

FIG. 27E is a graph showing the calculation result of the dependence of the total amount of light emitted into the air layer 16 through the light scattering layer 151G on the unit size w of each of the first small areas and the second small areas in the case where the light scattering layer 151G is provided on a surface of the transparent substrate 14. With regard to calculation conditions, in a structure similar to that illustrated in FIG. 1, the refractive index of the first small areas and the refractive index of the transparent substrate 14 are both set to 1.5, and the refractive index of the second small areas and the refractive index of the air layer 16 are both set to 1.0. In FIG. 27E, the solid line shows the calculation result for the light scattering layer 151G according to the present embodiment. The dashed line shows the calculation result for the optical sheet 60 that differs from the optical sheet of the present embodiment. As is clear from FIG. 27E, when the unit size w is in the range of 100 nm to 4 μm, the light extraction efficiency obtained by the light scattering layer 151G according to the present embodiment is higher than that obtained by the optical sheet 60 that differs from the optical sheet of the present embodiment.

Figure 27F:
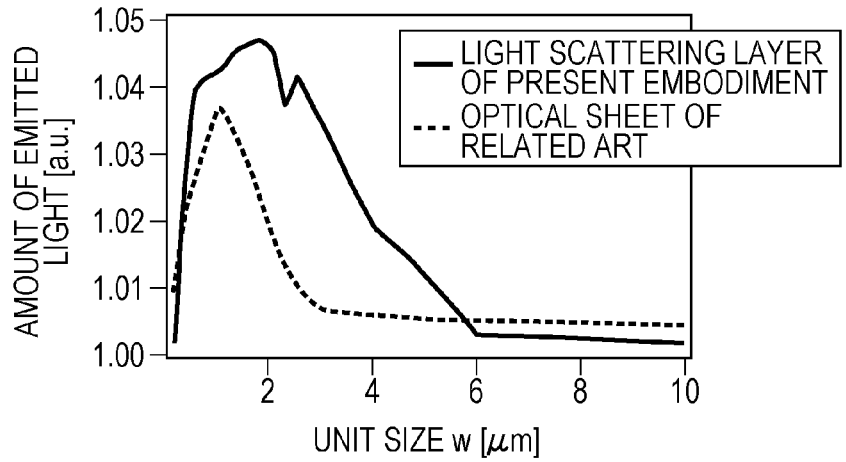
FIG. 27F is a graph showing the calculation result of the dependence of the total amount of light emitted into a protecting layer through the optical sheet on the unit size w of each of the first small areas and second small areas in the case where the optical sheet is located between a high-refractive-index layer and the protecting layer.

FIG. 27F is a graph showing the calculation result of the dependence of the total amount of light emitted into the protecting layer 16C through the light scattering layer 151G on the unit size w of each of the first small areas and the second small areas in the case where the light scattering layer 151G is located between the high-refractive-index layer 14C and the protecting layer 16C. With regard to calculation conditions, in a structure similar to that illustrated in FIG. 15A, the refractive index of the first small areas and the refractive index of the high-refractive-index layer 14C are both set to 1.75, and the refractive index of the second small areas and the refractive index of the protecting layer 16C are both set to 1.5. In FIG. 27F, the solid line shows the calculation result for the light scattering layer 151G according to the present embodiment. The dashed line shows the calculation result for the optical sheet 60 that differs from the optical sheet of the present embodiment. As is clear from FIG. 27F, when the unit size w is in the range of 125 nm to 6 μm, the light extraction efficiency obtained by the light scattering layer 151G according to the present embodiment is higher than that obtained by the optical sheet 60 that differs from the optical sheet of the present embodiment.

Seventh Embodiment

Figure 28A:
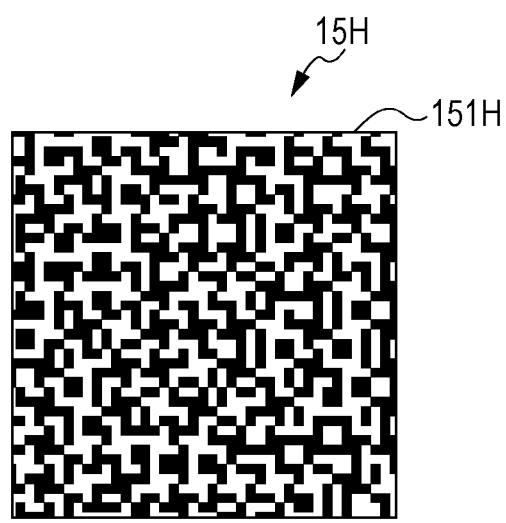
FIG. 28A is a plan view of an optical sheet according to a seventh embodiment.
Figure 28B:
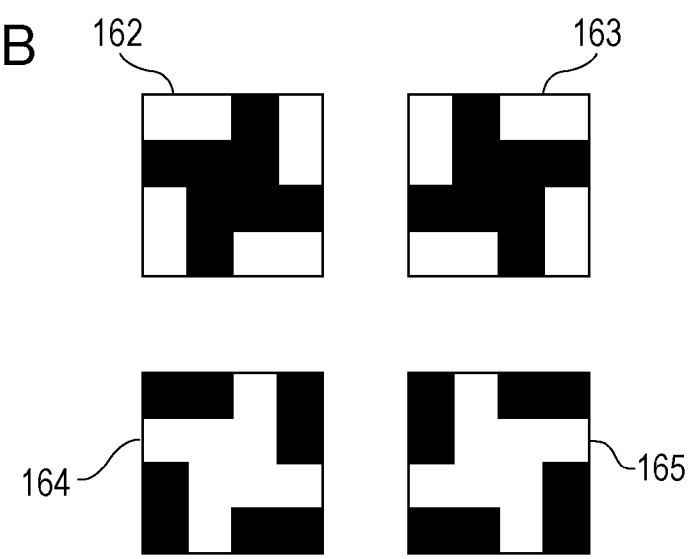
FIG. 28B is a plan view illustrating four types of unit structures included in a light scattering layer illustrated in FIG. 28A.
Figure 28C:
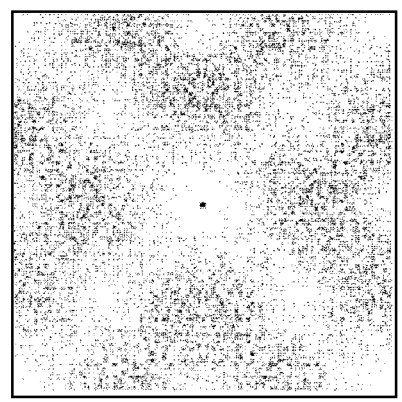
FIG. 28C illustrates the amplitudes of spatial frequency components obtained by taking the Fourier transform of a pattern of the light scattering layer illustrated in FIG. 28A.

FIG. 28A is a plan view of an optical sheet 15H according to a seventh embodiment. FIG. 28B is a plan view illustrating four types of unit structures 162, 163, 164, and 165 included in a light scattering layer 151H illustrated in FIG. 28A. FIG. 28C illustrates the amplitudes of spatial frequency components obtained by taking the Fourier transform of a pattern of the light scattering layer 151H illustrated in FIG. 28A.

The light scattering layer 151H according to the present embodiment has a pattern in which first unit structures 162, second unit structures 163, third unit structures 164, and fourth unit structures 165 are arranged. Referring to FIG. 28C, in the pattern according to the present embodiment, no spatial frequency components are present at spatial frequencies around 0. In other words, no scattered light is emitted in directions around the emission direction of the non-scattered light, which is zeroth-order light, from the light scattering layer 151H. Therefore, also in the present embodiment, an effect similar to that of the first embodiment can be obtained.

Eighth Embodiment

Figure 29A:
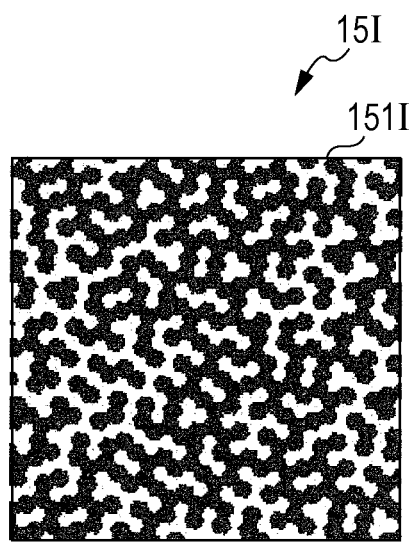
FIG. 29A is a plan view of an optical sheet according to an eighth embodiment.
Figure 29B:
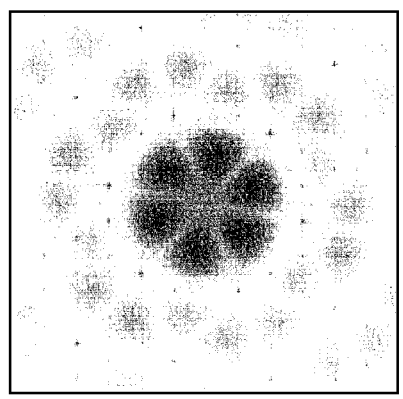
FIG. 29B illustrates the amplitudes of spatial frequency components obtained by taking the Fourier transform of a pattern of a light scattering layer illustrated in FIG. 29A.

FIG. 29A is a plan view of an optical sheet 15I according to an eighth embodiment. FIG. 29B illustrates the amplitudes of spatial frequency components obtained by taking the Fourier transform of a pattern of a light scattering layer 151I illustrated in FIG. 29A.

In the present embodiment, the light scattering layer 151I has a pattern in which unit structures having a regular hexagonal shape in plan view are arranged. Referring to FIG. 29B, in the pattern according to the present embodiment, the spatial frequency components are suppressed at spatial frequencies around 0. In other words, the scattered light emitted in directions around the emission direction of the non-scattered light, which is zeroth-order light, from the light scattering layer 151I is suppressed. Therefore, also in the present embodiment, an effect similar to that of the first embodiment can be obtained.

Figure 30A:
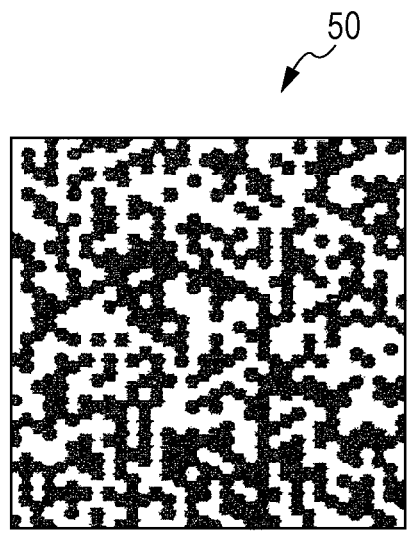
FIG. 30A is a plan view of an optical sheet in which a plurality of regular hexagonal unit structures are arranged in a random pattern that differs from the pattern of the present embodiment.
Figure 30B:
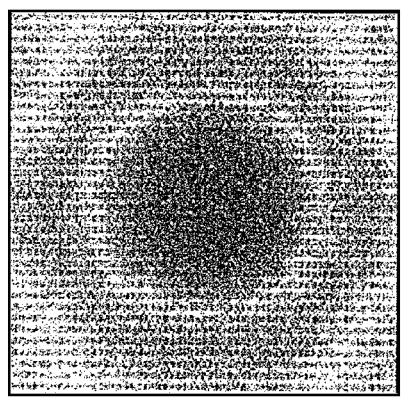
FIG. 30B illustrates the amplitudes of spatial frequency components obtained by taking the Fourier transform of the random pattern of the optical sheet illustrated in FIG. 30A.

A case in which unit structures having a regular hexagonal shape in plan view are arranged in a random pattern that differs from the pattern of the present embodiment will now be described for comparison with the pattern of the present embodiment. FIG. 30A is a plan view of an optical sheet 50 in which a plurality of regular hexagonal unit structures are arranged in a random pattern that differs from the pattern of the present embodiment. FIG. 30B illustrates the amplitudes of spatial frequency components obtained by taking the Fourier transform of the random pattern of the optical sheet 50 illustrated in FIG. 30A. It can be understood that, in the random pattern illustrated in FIG. 30B, the spatial frequency components are present at spatial frequencies around 0, in other words, scattered light is emitted in directions around the emission direction of the non-scattered light, which is zeroth-order light, from the optical sheet 50.

Modification of Eighth Embodiment

Figure 31A:
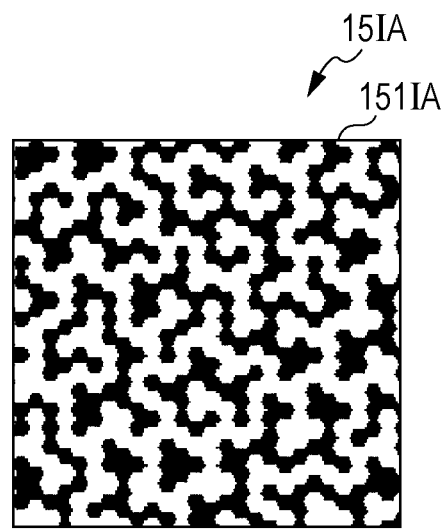
FIG. 31A is a plan view of an optical sheet according to a modification of the eighth embodiment.
Figure 31B:
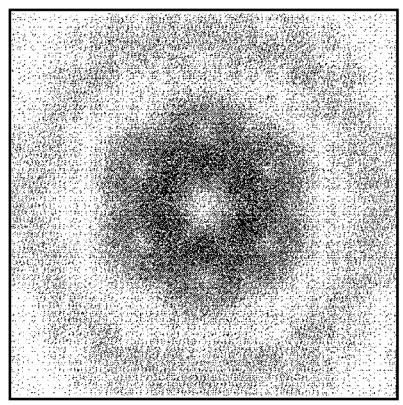
FIG. 31B illustrates the amplitudes of spatial frequency components obtained by taking the Fourier transform of a pattern of a light scattering layer illustrated in FIG. 31A.

FIG. 31A is a plan view of an optical sheet 15IA according to a modification of the eighth embodiment. FIG. 31B illustrates the amplitudes of spatial frequency components obtained by taking the Fourier transform of a pattern of a light scattering layer 151IA illustrated in FIG. 31A.

As illustrated in FIG. 31A, in the present modification, the light scattering layer 151IA has a pattern in which unit structures having a regular hexagonal shape in plan view are arranged. The pattern according to the present modification is different from the pattern according to the above-described eighth embodiment.

Referring to FIG. 31B, in the pattern according to the present modification, the spatial frequency components are suppressed at spatial frequencies around 0. In other words, the scattered light emitted in directions around the emission direction of the non-scattered light, which is zeroth-order light, from the light scattering layer 151IA is suppressed. Therefore, also in the present embodiment, an effect similar to that of the first embodiment can be obtained.

Ninth Embodiment

Figure 32A:
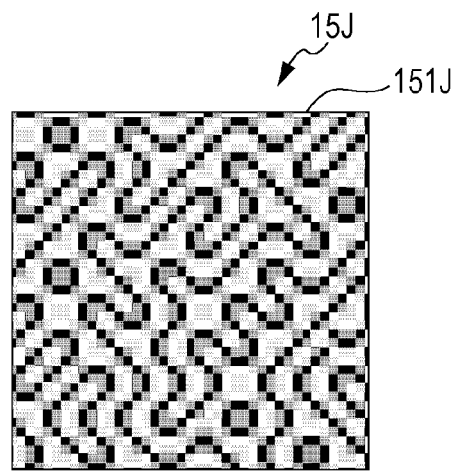
FIG. 32A is a plan view of an optical sheet according to a ninth embodiment.
Figure 32B:
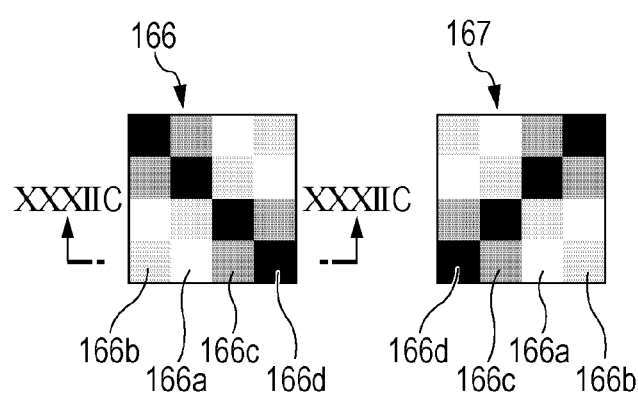
FIG. 32B is a plan view illustrating two types of unit structures included in a light scattering layer illustrated in FIG. 32A.
Figure 32C:
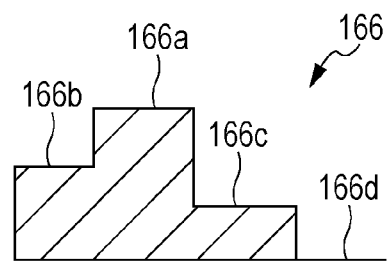
FIG. 32C is a sectional view of a first unit structure taken along line XXXIIC-XXXIIC in FIG. 32B.
Figure 32D:
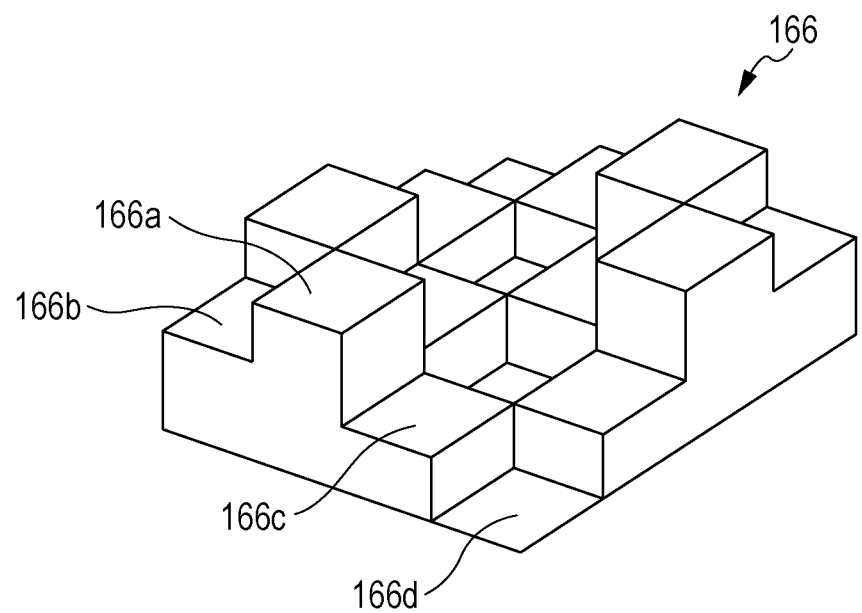
FIG. 32D is a perspective view of the first unit structure.
Figure 32E:
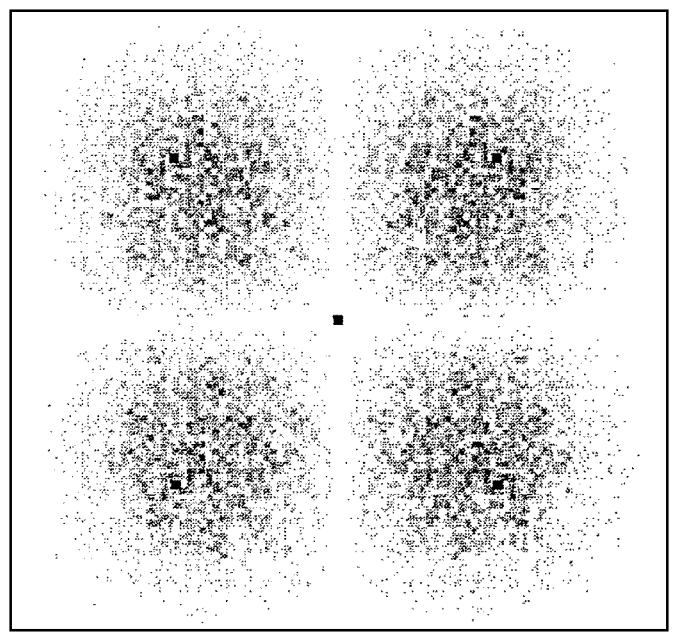
FIG. 32E illustrates the amplitudes of spatial frequency components obtained by taking the Fourier transform of a pattern of the light scattering layer illustrated in FIG. 32A.

FIG. 32A is a plan view of an optical sheet 15J according to a ninth embodiment. FIG. 32B is a plan view illustrating two types of unit structures 166 and 167 included in a light scattering layer 151J illustrated in FIG. 32A. FIG. 32C is a sectional view of a first unit structure 166 taken along line XXXIIC-XXXIIC in FIG. 32B. FIG. 32D is a perspective view of the first unit structure 166. FIG. 32E illustrates the amplitudes of spatial frequency components obtained by taking the Fourier transform of a pattern of the light scattering layer 151J illustrated in FIG. 32A.

In the present embodiment, the light scattering layer 151J has a pattern in which a plurality of the first unit structures 166 and a plurality of the second unit structures 167 are arranged.

Each first unit structure 166 is formed by arranging four first small areas 166a, four second small areas 166b, four third small areas 166c, and four fourth small areas 166d in a first arrangement pattern. Each first unit structure 166 has a rectangular shape (square shape) in plan view.

Each second unit structure 167 is formed by arranging four first small areas 166a, four second small areas 166b, four third small areas 166c, and four fourth small areas 166d in a second arrangement pattern that differs from the first arrangement pattern. Each second unit structure 167 has a rectangular shape (square shape) in plan view.

As illustrated in FIGS. 32C and 32D, the first small areas 166a have the largest height, the second small areas 166b have the second largest height, the third small areas 166c have the third largest height, and the fourth small areas 166d have the smallest height.

Referring to FIG. 32E, in the pattern according to the present embodiment, no spatial frequency components are present at spatial frequencies around 0. In other words, no scattered light is emitted in directions around the emission direction of the non-scattered light, which is zeroth-order light, from the light scattering layer 151J. Therefore, also in the present embodiment, an effect similar to that of the first embodiment can be obtained.

Tenth Embodiment

Figure 33A:
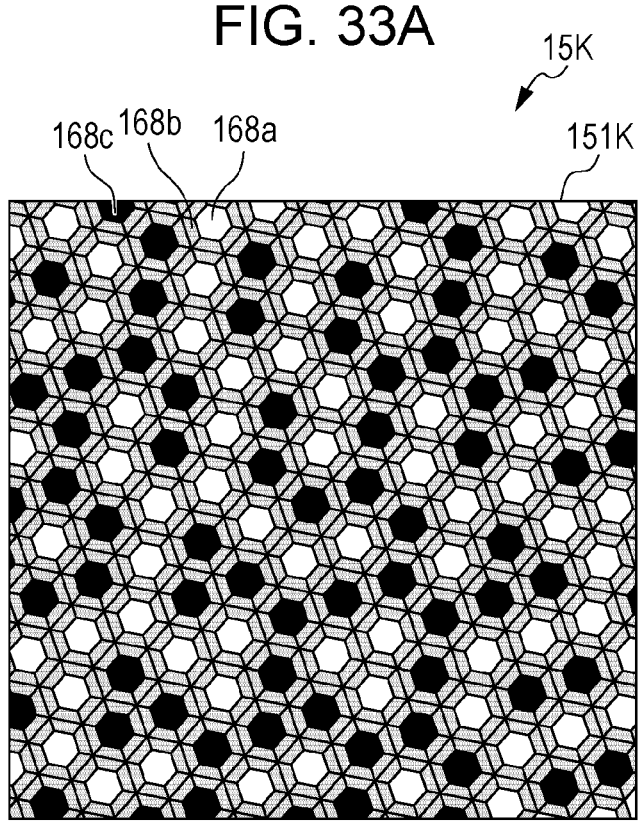
FIG. 33A is a plan view of an optical sheet according to a tenth embodiment.
Figure 33B:
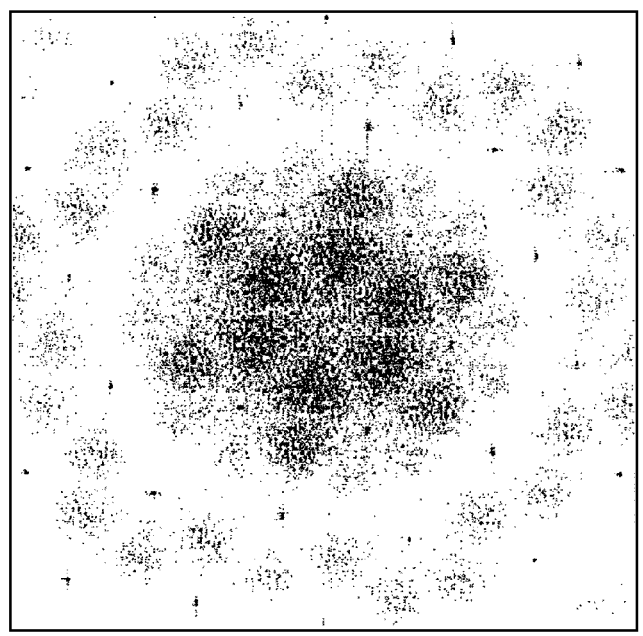
FIG. 33B illustrates the amplitudes of spatial frequency components obtained by taking the Fourier transform of a pattern of a light scattering layer illustrated in FIG. 33A.

FIG. 33A is a plan view of an optical sheet 15K according to a tenth embodiment. FIG. 33B illustrates the amplitudes of spatial frequency components obtained by taking the Fourier transform of a pattern of a light scattering layer 151K illustrated in FIG. 33A.

As illustrated in FIG. 33A, the light scattering layer 151K of the optical sheet 15K according to the present embodiment has a pattern in which first small areas 168a (white regions in FIG. 33A), second small areas 168b (gray regions in FIG. 33A), and third small areas 168c (black regions in FIG. 33A) are arranged. Each of the first small areas 168a and the third small areas 168c has a regular hexagonal shape in plan view. For example, the first small areas 168a have the largest height, the second small areas 168b have the second largest height, and the third small areas 168c have the smallest height.

Referring to FIG. 33B, in the pattern according to the present embodiment, the spatial frequency components are suppressed at spatial frequencies around 0. In other words, the scattered light emitted in directions around the emission direction of the non-scattered light, which is zeroth-order light, from the light scattering layer 151K is suppressed. Therefore, also in the present embodiment, an effect similar to that of the first embodiment can be obtained.

Eleventh Embodiment

Figure 34A:
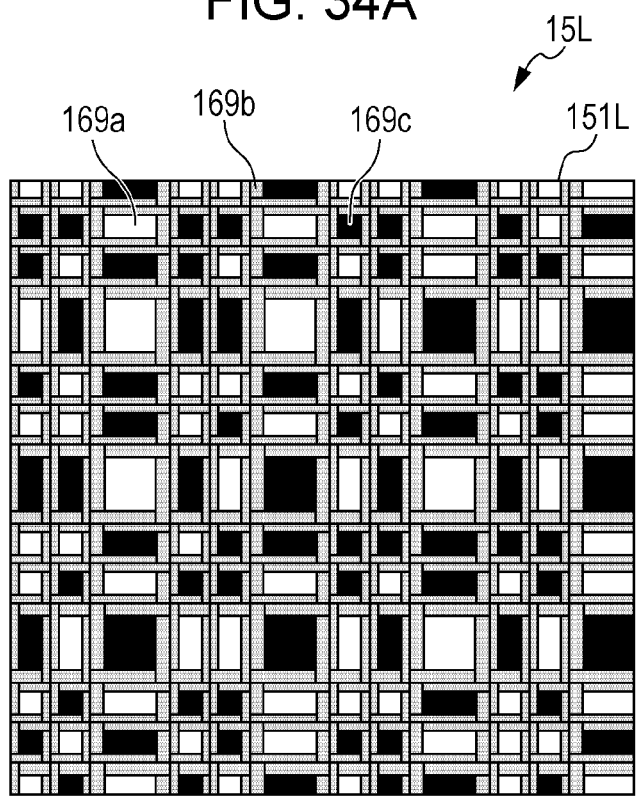
FIG. 34A is a plan view of an optical sheet according to an eleventh embodiment.
Figure 34B:
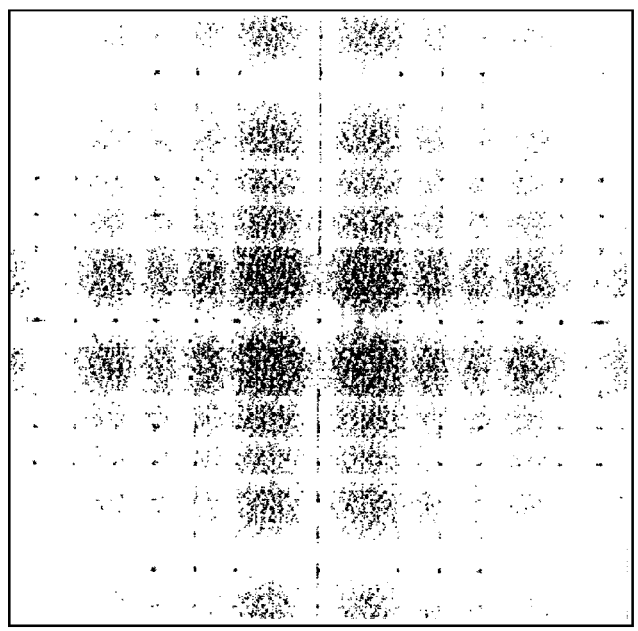
FIG. 34B illustrates the amplitudes of spatial frequency components obtained by taking the Fourier transform of a pattern of a light scattering layer illustrated in FIG. 34A.

FIG. 34A is a plan view of an optical sheet 15L according to an eleventh embodiment. FIG. 34B illustrates the amplitudes of spatial frequency components obtained by taking the Fourier transform of a pattern of a light scattering layer 151L illustrated in FIG. 34A.

As illustrated in FIG. 34A, the light scattering layer 151L of the optical sheet 15L according to the present embodiment has a pattern in which first small areas 169a (white regions in FIG. 34A), second small areas 169b (gray regions in FIG. 34A), and third small areas 169c (black regions in FIG. 34A) are arranged. Note that, though in FIG. 34A, boundary lines are shown between adjacent small areas 169b, those small areas 169b are not actually divided, and form one area having the same height. Each of the first small areas 169a and the third small areas 169c has a rectangular shape in plan view. For example, the first small areas 169a have the largest height, the second small areas 169b have the second largest height, and the third small areas 169c have the smallest height.

Referring to FIG. 34B, in the pattern according to the present embodiment, the spatial frequency components are suppressed at spatial frequencies around 0. In other words, the scattered light emitted in directions around the emission direction of the non-scattered light, which is zeroth-order light, from the light scattering layer 151L is suppressed. Therefore, also in the present embodiment, an effect similar to that of the first embodiment can be obtained.

Twelfth Embodiment

Figure 35A:
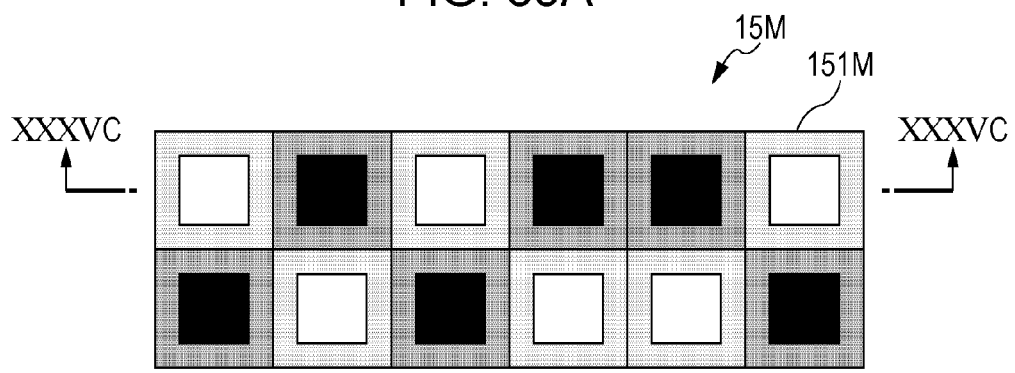
FIG. 35A is an enlarged plan view of a part of an optical sheet according to a twelfth embodiment.
Figure 35B:
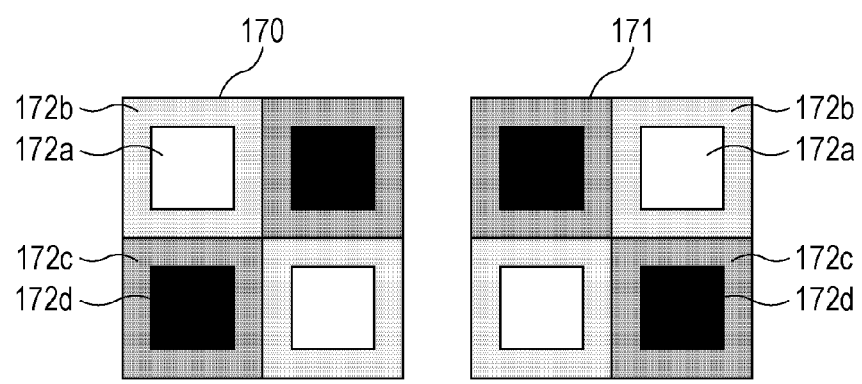
FIG. 35B is a plan view illustrating two types of unit structures included in a light scattering layer illustrated in FIG. 35A.
Figure 35C:
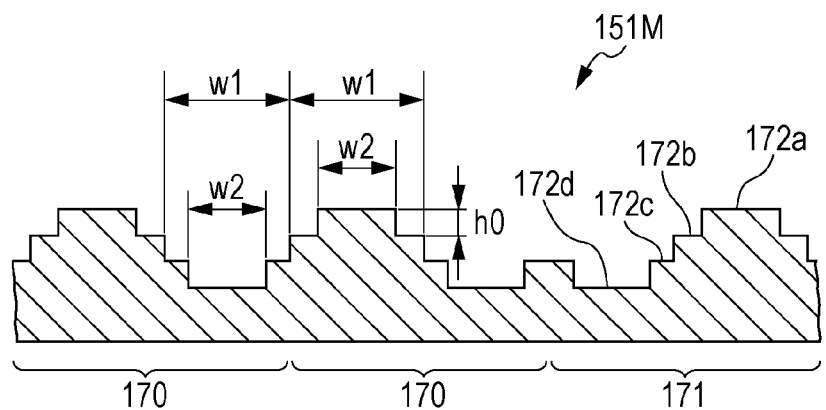
FIG. 35C is a sectional view of the light scattering layer taken along line XXXVC-XXXVC in FIG. 35A.

FIG. 35A is an enlarged plan view of a part of an optical sheet 15M according to a twelfth embodiment. FIG. 35B is a plan view illustrating two types of unit structures 170 and 171 included in a light scattering layer 151M illustrated in FIG. 35A. FIG. 35C is a sectional view of the light scattering layer 151M taken along line XXXVC-XXXVC in FIG. 35A.

As illustrated in FIG. 35A, the light scattering layer 151M of the optical sheet 15M according to the present embodiment has a pattern in which a plurality of the first unit structures 170 and a plurality of the second unit structures 171 are arranged.

Referring to FIG. 35B, each first unit structure 170 is formed by arranging a plurality of types of small areas having different heights, more specifically, two first small areas 172a (white regions in FIG. 35B), two second small areas 172b (light gray regions in FIG. 35B), two third small areas 172c (thick gray regions in FIG. 35B), and two fourth small areas 172d (black regions in FIG. 35B), in a first arrangement pattern. Each of the first to fourth small areas 172a to 172d has a rectangular shape (square shape) in plan view. Each first unit structure 170 is a multi-stepped structure having a rectangular shape (square shape) in plan view.

Each second unit structure 171 is formed by arranging a plurality of types of small areas having different heights, more specifically, two first small areas 172a, two second small areas 172b, two third small areas 172c, and two fourth small areas 172d in a second arrangement pattern that differs from the first arrangement pattern. Each second unit structure 171 is a multi-stepped structure having a rectangular shape (square shape) in plan view.

As illustrated in FIG. 35C, the first small areas 172a have the largest height, the second small areas 172b have the second largest height, the third small areas 172c have the third largest height, and the fourth small areas 172d have the smallest height. When the height of the fourth small areas 172d is set as a reference and the height of the third small areas 172c is h0, the height of the second small areas 172b is 2 h0 and the height of the first small areas 172a is 3 h0.

In addition, as illustrated in FIG. 35C, the unit size w2 of the first small areas 172a is smaller than the unit size w1 of the second small areas 172b. Also, the unit size w2 of the fourth small areas 172d is smaller than the unit size w1 of the third small areas 172c.

Figure 35D:
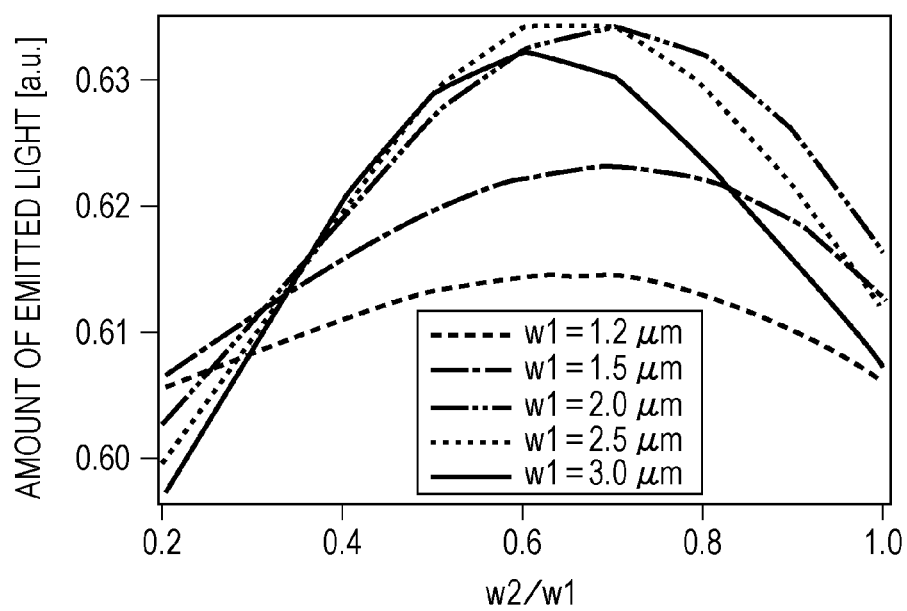
FIG. 35D is a graph showing the calculation result of the dependence of the total amount of light emitted into an air layer through the light scattering layer according to the twelfth embodiment on the ratio of a unit size w2 to a unit size w1.

FIG. 35D is a graph showing the calculation result of the dependence of the total amount of light emitted into the air layer through the light scattering layer 151M according to the twelfth embodiment on the ratio of the unit size w2 to the unit size w1. In FIG. 35D, the horizontal axis represents the ratio w2/w1 of the unit size w2 to the unit size w1, and the vertical axis represents the total amount of light that is emitted into the air layer through the light scattering layer 151M. With regard to calculation conditions, the height h0 of a single step of the multi-stepped first unit structures 170 (or the second unit structures 171) is set to 300 nm. In FIG. 35D, the five curves show the calculation results in the cases where the unit size w1 of the second small areas 172b (or third small areas 172c) is 1.2 μm, 1.5 μm, 2.0 μm, 2.5 μm, and 3.0 μm.

As is clear from FIG. 35D, with the light scattering layer 151M according to the present embodiment, high light extraction efficiency can be achieved when the ratio w2/w1 of the unit size w2 to the unit size w1 is in the range of 0.4 to 1.0.

Thirteenth Embodiment

Figure 36A:
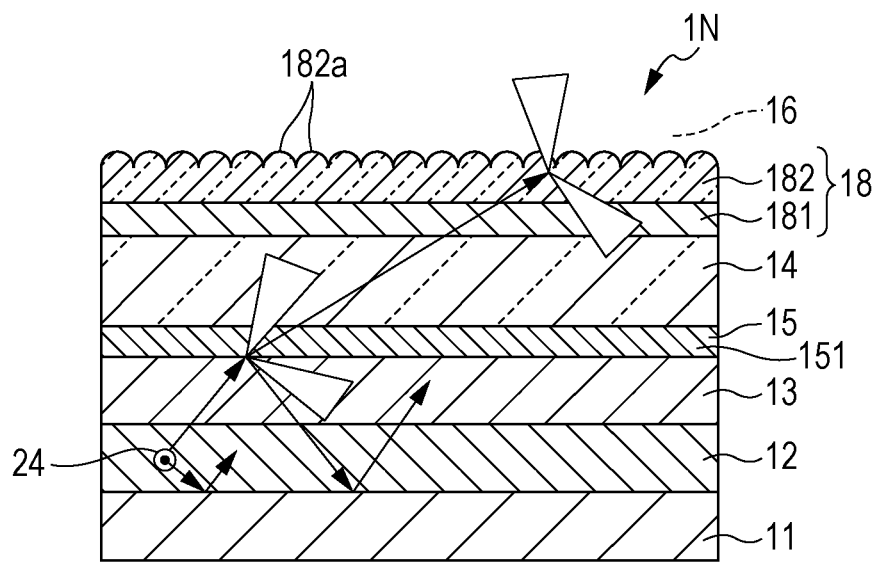
FIG. 36A is a sectional view of a light emitting apparatus according to a thirteenth embodiment.

FIG. 36A is a sectional view of a light emitting apparatus 1N according to a thirteenth embodiment. As illustrated in FIG. 36A, the light emitting apparatus 1N according to the present embodiment includes an electrode 11, a light emitting layer 12 (including a light emitting portion 24), a transparent electrode 13, an optical sheet 15 including a light scattering layer 151, a transparent substrate 14, and an auxiliary optical sheet 18, which are stacked in this order. The structures of the electrode 11, the light emitting layer 12, the transparent electrode 13, the transparent substrate 14, and the optical sheet 15 including the light scattering layer 151 are similar to those in the above-described first embodiment, and descriptions thereof are thus omitted.

The auxiliary optical sheet 18 is provided on a surface of the transparent substrate 14. The auxiliary optical sheet 18 has a structure that functions as a light extraction structure and in which a light scattering layer 181 and a microlens 182 are combined. The light scattering layer 181 is provided on the surface of the transparent substrate 14, and has, for example, a light scattering function similar to that of the light scattering layer 151 of the optical sheet 15. The microlens 182 is formed on a surface of the light scattering layer 181. A plurality of convex lens portions 182a are two-dimensionally arranged along a surface of the microlens 182.

A part of light generated in the light emitting portion 24 passes through the transparent electrode 13, and then is incident on the optical sheet 15 including the light scattering layer 151. Another part of the light generated in the light-emitting portion 24 is reflected by the electrode 11, passes through transparent electrode 13, and then is incident on the optical sheet 15 including the light scattering layer 151. At least a part of the light incident on the optical sheet 15 including the light scattering layer 151 is scattered by diffraction, and passes through the transparent substrate 14. The light that has passed through the transparent substrate 14 is incident on the auxiliary optical sheet 18. At least a part of the light incident on the auxiliary optical sheet 18 is scattered by diffraction, and is emitted into an air layer 16, which is outside the light emitting apparatus 1N.

According to the present embodiment, since the auxiliary optical sheet 18 is provided in addition to the light scattering layer 151, the light extraction efficiency can be further increased.

Modification of Thirteenth Embodiment

Figure 36B:
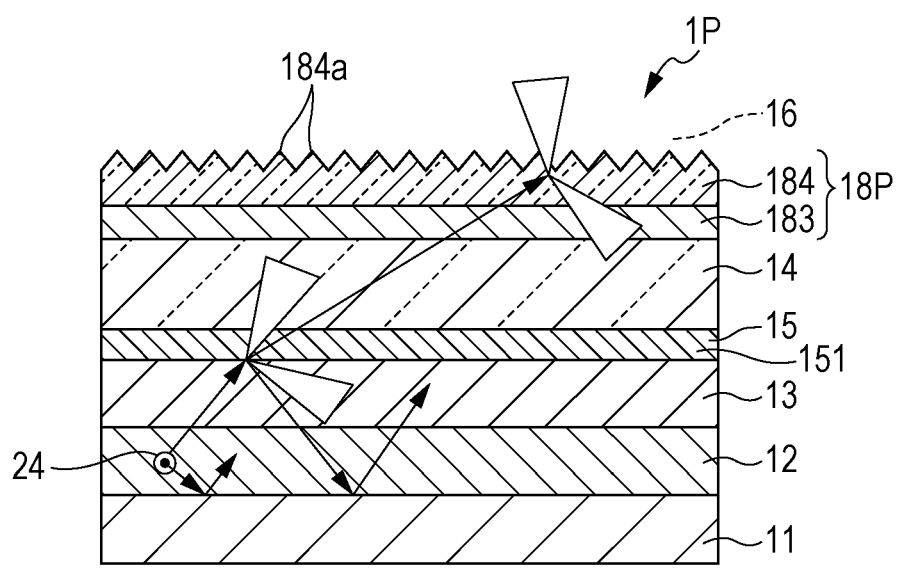
FIG. 36B is a sectional view of a light emitting apparatus according to a modification of the thirteenth embodiment.

FIG. 36B is a sectional view of a light emitting apparatus 1P according to a modification of the thirteenth embodiment. As illustrated in FIG. 36B, the light emitting apparatus 1P according to the present modification includes an auxiliary optical sheet 18P having a structure that functions as a light extraction structure and in which a diffraction grating 183 and a pyramid structure 184 are combined. The diffraction grating 183 is provided on a surface of a transparent substrate 14, and has a function of diffracting light incident thereon. The pyramid structure 184 is provided on a surface of the diffraction grating 183. A plurality of pyramid portions 184a having a pyramid shape (rectangular pyramid shape) are two-dimensionally arranged along a surface of the pyramid structure 184.

Also in the present embodiment, since the auxiliary optical sheet 18P is provided in addition to the light scattering layer 151, the light extraction efficiency can be further increased.

In the present modification, the auxiliary optical sheet 18P is formed by combining the diffraction grating 183 and the pyramid structure 184 together. However, the structure of the auxiliary optical sheet is not limited to this. For example, the auxiliary optical sheet may instead have a structure in which any two or more of the above-described light scattering layer 181, microlens 182, diffraction grating 183, and pyramid structure 184 are combined. Alternatively, the auxiliary optical sheet may be structured so as to include any one of the above-described light scattering layer 181, microlens 182, diffraction grating 183, and pyramid structure 184. Alternatively, a light scattering layer having small particles that scatter light may be used in place of the above-described light scattering layer 181.

Fourteenth Embodiment

A fourteenth embodiment will now be described. This embodiment differs from the above-described embodiments in that first small areas (projections) and second small areas (recesses) of a light scattering layer have tapered shapes. Here, the "tapered shapes" are shapes in which side faces (i.e. side walls) include portions that are inclined with respect to a direction (i.e. thickness direction) perpendicular to a surface of the light scattering layer (hereinafter referred to as "layer surface"). As an example of a tapered shape, a shape in which the side walls of the recesses and projections are linearly inclined at a certain angle will be considered.

Figure 40A:
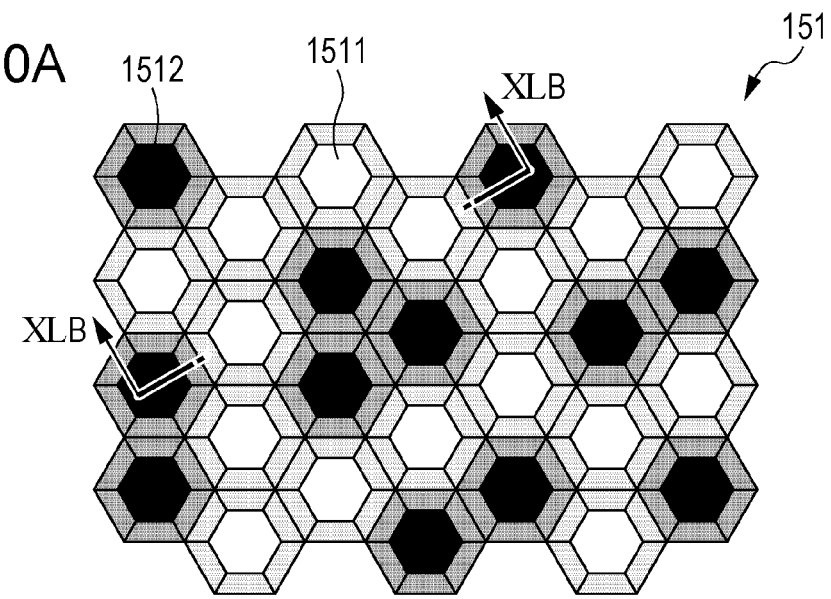
FIG. 40A is a plan view of a part of a light scattering layer according to a fourteenth embodiment.

FIG. 40A is a plan view of a part of a light scattering layer 151 according to the present embodiment. The light scattering layer 151 has a pattern in which projections 1511 and recesses 1512, each of which has a regular hexagonal shape in plan view, are two-dimensionally arranged. Note that the projections 1511 are projecting parts from a base plane, and the recesses 1512 are recessed parts from the base plane. The heights from the bottom parts of the recesses 1512 to the base plane are the same as the heights from the base plane to the top parts of the projections 1511. Thus, the heights from the bottom parts of the recesses 1512 to the top parts of the projections 1511 are twice as high as the heights of the projections 1511. The pattern of the projections 1511 and recesses 1512 is similar to that in the eighth embodiment illustrated in FIG. 29A except that the side faces of the projections 1511 and the recesses 1512 are inclined with respect to the thickness direction of the light scattering layer 151 in the present embodiment.

Figure 40B:
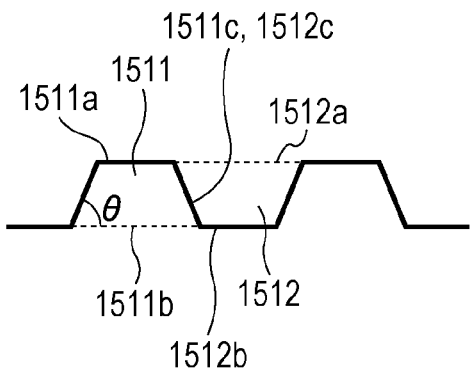
FIG. 40B is a sectional view of FIG. 40A taken along line XLB-XLB.

FIG. 40B is a sectional view of FIG. 40A taken along line XLB-XLB. As illustrated in FIG. 40B, the projections 1511 and the recesses 1512 according to the present embodiment have an isosceles trapezoid shape in cross section. Each of the projections 1511 is a portion that projects upward (toward the light emission side) in FIG. 40B, and includes an upper face 1511a, a lower face 1511b having a larger area than the upper face 1511a, and side faces 1511c. Each of the recesses 1512 is a portion located between the projections, and includes an upper face 1512a, a lower face 1512b having a smaller area than the upper face 1512a, and side faces 1512c. The lower faces 1511b of the projections and the upper faces 1512a of the recesses are not necessarily interfaces between different media. In FIG. 40B, since the projections 1511 and the recesses 1512 are adjacent to each other, the side faces 1511c and 1512c are in contact with each other. The side faces 1511c and 1512c are inclined with respect to the layer surface at an angle θ (0°<θ<90°). The terms "upper face", "lower face", and "side face" refer to an upper face, a lower face, and a side face in the sectional view of FIG. 40B. In other words, faces on which light from the light emitting layer is incident are referred to as "lower faces", and faces from which light is emitted are referred to as "upper faces". The projections 1511 and the recesses 1512 are made of materials having different refractive indices.

Figure 40C:
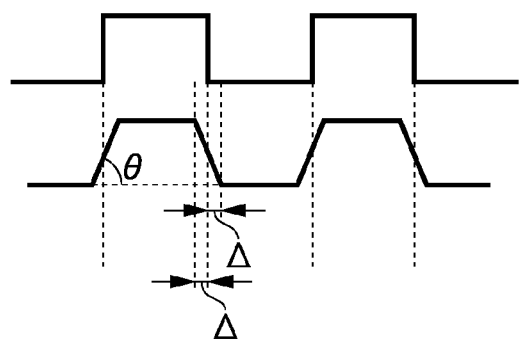
FIG. 40C is a diagram for describing the cross sectional shape of an irregular structure according to the fourteenth embodiment.

FIG. 40C is a diagram for describing the cross sectional shape of an irregular structure according to the present embodiment. The upper part of FIG. 40C shows the cross section of an irregular structure in which side walls are perpendicular to the layer surface, and the lower part of FIG. 40C shows the cross section of an irregular structure according to the present embodiment. In this example, for simplicity, the side walls are approximated as being linearly inclined, and are assumed to be inclined at a constant angle θ so that the recesses and projections have a constant cross-sectional area. More specifically, compared to the irregular structure having side walls that are perpendicular to the layer surface (side walls whose inclination angle relative to the layer surface is 90°), the inclination angle θ is reduced so that an amount of reduction Δ in the length of the top side of each projection in cross section is equal to an amount of reduction Δ in the length of the bottom side of the recess so that the ratio of the cross-sectional areas of the projection and the recess is maintained constant. The light extraction efficiency in the case where the above-described tapered shape is employed will now be discussed.

Figure 41A:
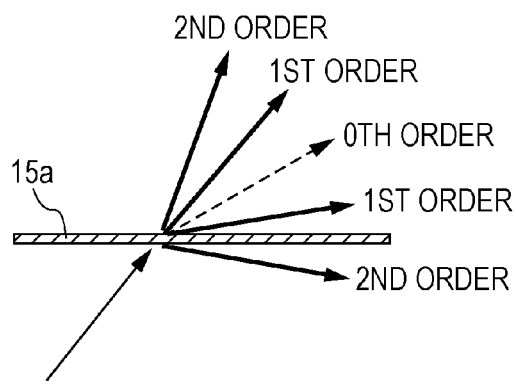
FIGS. 41A and 41B are first diagrams for describing the influence of inclination of side walls on the intensity distribution of diffracted light, where
Figure 41B:
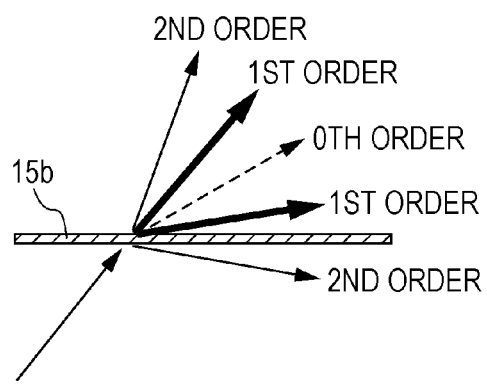
Figure 42A:
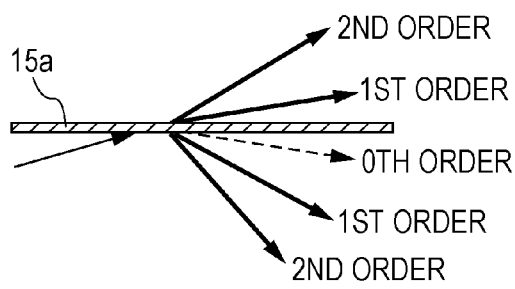
FIGS. 42A and 42B are second diagrams for describing the influence of the inclination of the side walls on the intensity distribution of diffracted light, where
Figure 42B:
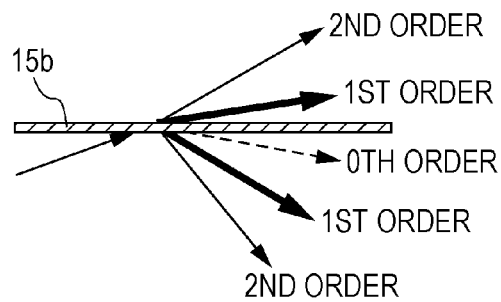

FIGS. 41A, 41B, 42A, and 42B are diagrams for describing the influence of the inclination of the side walls on the intensity distribution of the diffracted light. FIGS. 41A and 41B illustrate an example in which the incident angle of the light incident on an optical sheet is an intermediate angle at which total reflection does not occur. FIGS. 42A and 42B illustrate an example in which the incident angle of the light incident on the optical sheet is an angle at which total reflection occurs. FIGS. 41A and 42A illustrate the manner in which light is diffracted by an optical sheet 15a including a light scattering layer having projections and recesses with side walls that are not inclined, and FIGS. 41B and 42B illustrate the manner in which light is diffracted by an optical sheet 15b including a light scattering layer having projections and recesses with side walls that are inclined. In each figure, the thickness of each arrow shows the intensity of the emitted light.

As is clear from FIGS. 41A and 41B, when the angle of the side walls of the irregular structure is reduced, high-order (for example, second-order or more) diffraction components can be weakened and low-order (first-order) diffraction components can be enhanced. In the case where the incident angle of the light incident on the irregular structure is an intermediate angle at which the zeroth-order light is not totally reflected, in the structure in which the tapered shape is employed (FIG. 41B), high-order diffraction components that are reflected because the sum of the incident angle and the diffraction angle exceeds 90° can be weakened. As a result, the percentage of light that passes through the irregular structure (transmittance) can be increased compared to that in the case where the side walls of the irregular structure are perpendicular to the layer surface (see FIG. 41A).

In the case where the incident angle of the light incident on the irregular structure is large and is greater than the angle at which total reflection of the zeroth-order light occurs, even in the structure in which the tapered shape is employed (FIG. 42B), low-order (first-order) diffraction components are reflected. Therefore, the effect obtained by changing the intensity proportion between the diffraction orders is small. However, since the projection are tapered toward the top, the possibility that light that has passes through the projections will enter the adjacent projections and return can be reduced.

Figure 43A:
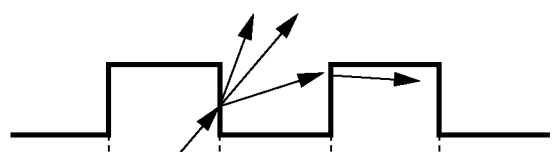
FIG. 43A illustrates the manner in which light is incident on an irregular structure in which side walls are perpendicular to a layer surface.
Figure 43B:
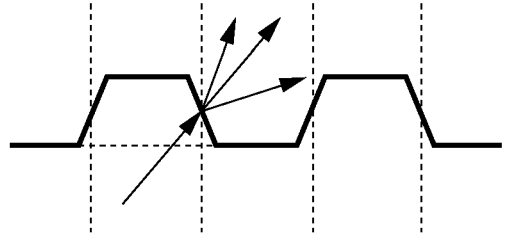
FIG. 43B illustrates the manner in which light is incident on an irregular structure in which side walls are inclined.

FIGS. 43A and 43B are diagrams for describing the effects obtained because the projections are tapered toward the top. FIG. 43A illustrates the manner in which light is incident on an irregular structure having side walls that are perpendicular to the layer surface. FIG. 43B illustrates the manner in which light is incident on an irregular structure having inclined side walls. As illustrated in FIG. 43B, with the present embodiment, the possibility that the light that has passed through a projection will enter an adjacent projection and return toward the incident side can be reduced. Therefore, also when light is incident on the irregular structure at an angle exceeding the critical angle at which total reflection of the zeroth-order light occurs, the transmittance can be increased.

Figure 44A:
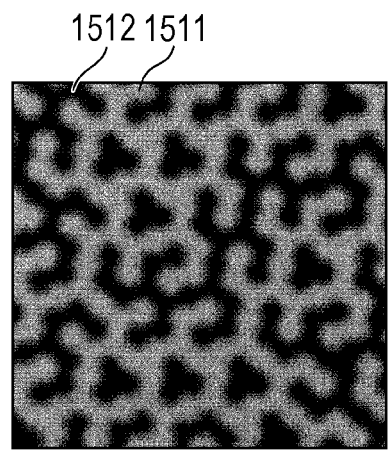
FIG. 44A is a plan view illustrating an example of an irregular pattern of an optical sheet according to the fourteenth embodiment.

FIG. 44A is a plan view illustrating an example of an irregular pattern of the optical sheet 15b according to the present embodiment. In this example, the pattern is formed by the same arrangement method as the method by which unit structures having a regular hexagonal shape are arranged in the light scattering layer 151I according to the eighth embodiment (FIG. 29A). The pattern of this example differs from the pattern of FIG. 29A in that the side walls of the irregular structure are inclined. The structure illustrated in FIG. 44A does not have the irregular pattern illustrated in FIG. 40A, but has an irregular pattern illustrated in FIG. 44C. In the case where the adjacent projections (or adjacent recesses) have the same height, portions formed between the side walls thereof (V-shaped portions smaller than the unit structures) may be omitted, as illustrated in FIG. 44C, because contribution of these portion to the extraction of light is small. Accordingly, manufacturing of the irregular structure can be facilitated. FIG. 44A illustrates the pattern formed in this way. The method for omitting the portions smaller than the unit structures is not limited to that illustrated in FIG. 44C, and it is not necessary that the tapered shapes be uniform. As described below, different types of effective tapered shapes may be applied in combination as necessary. Also, it is also not necessary that the corners of the shapes of basic structures (rectangular or hexagonal shapes) remain sharp. In FIG. 44A, the tone shows the height. More specifically, in FIG. 44A, the lighter the regions are, the larger the height of the regions, and the darker the regions are, the smaller the height of the regions.

Figure 44B:
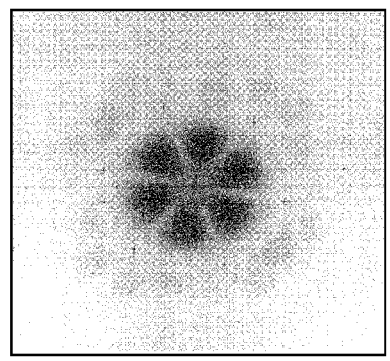
FIG. 44B illustrates the amplitudes of spatial frequency components obtained by taking the Fourier transform of the irregular pattern illustrated in FIG. 44A.
Figure 44C:
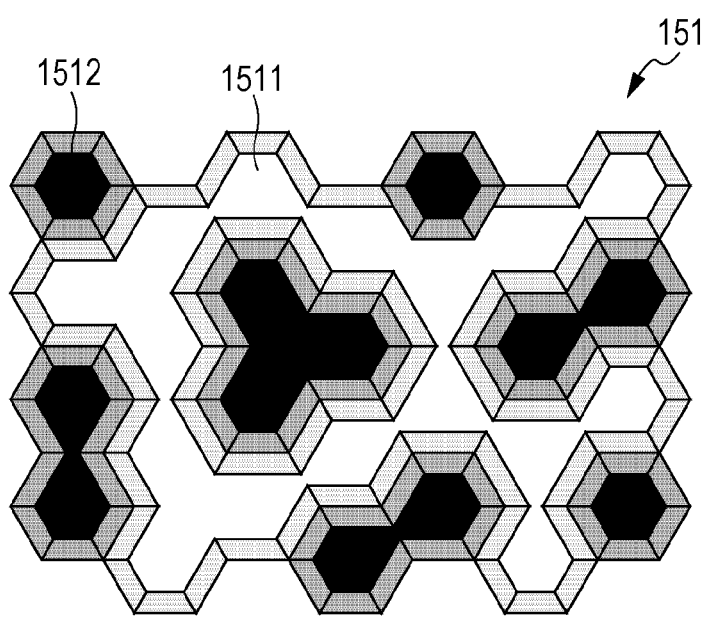
FIG. 44C illustrates a modification of the light scattering layer according to the fourteenth embodiment.

FIG. 44B illustrates the amplitudes of spatial frequency components obtained by taking the Fourier transform of the irregular pattern illustrated in FIG. 44A. It can be confirmed that since the side walls are inclined, the high-order (second-order or more) diffraction components are weakened compared to that in the result illustrated in FIG. 29B.

Figure 45:
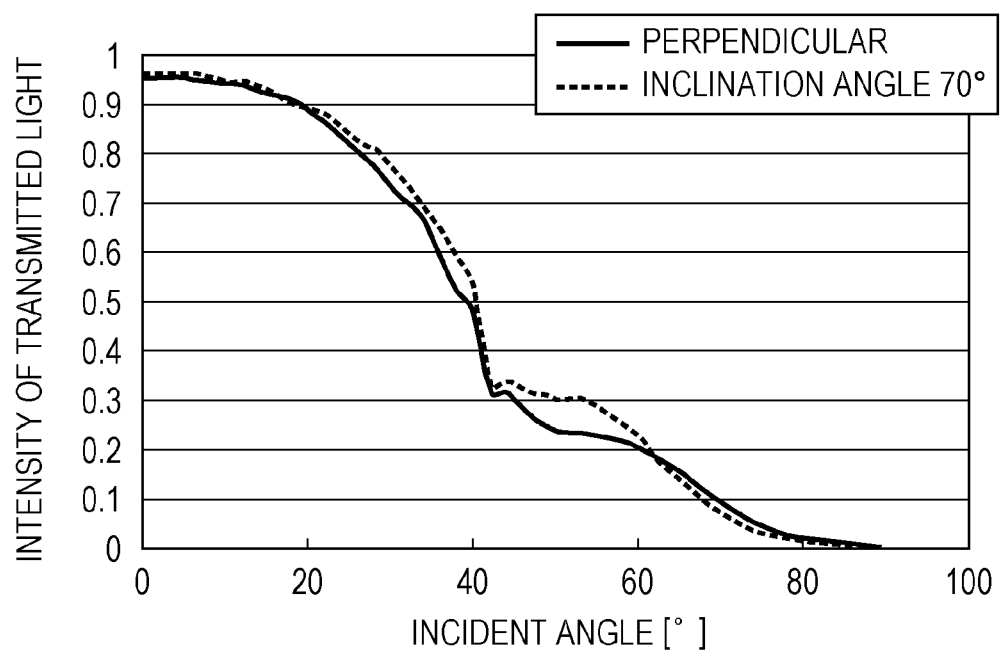
FIG. 45 is a graph showing the calculation result of transmittance characteristics according to the fourteenth embodiment.

FIG. 45 is a graph showing the transmittance characteristics of an optical sheet having the pattern according to the eighth embodiment illustrated in FIG. 29A and an optical sheet having the pattern illustrated in FIG. 44A. In each pattern, the diameter of the inscribed circle of each hexagon is 2 μm, and the height of each hexagon is 1 μm. Each optical sheet is located between a transparent substrate having a refractive index of 1.5 and air having a refractive index of 1.0. In the graph, the solid line shows the result in the case where the side walls of the projections and recesses are perpendicular to the layer surface, and the dotted line shows the result in the case where the side walls are linearly inclined at 70 degrees. As is clear from this graph, the light transmittance is increased when the incident angle is an intermediate angle in the range of about 20 to 60 degrees. Accordingly, the total amount of light emitted into the air layer through the light scattering layer in the case where light present in the transparent substrate is isotropic is determined by calculation. As a result, it is confirmed that the amount of emitted light in the case where the side walls in the light scattering layer are inclined is higher by 4.3% than that in the case where the side walls in the light scattering layer are not inclined.

As described above, according to the present embodiment, the light extraction efficiency can be increased by using a light scattering layer having a tapered irregular structure. The irregular structure according to the present embodiment may be applied to any of the optical sheets according to the above-described first to thirteenth embodiments.

Next, a method for manufacturing the optical sheet 15b according to the present embodiment will be described. Also in the present embodiment, the optical sheet 15b may be manufactured by, for example, a method including a semiconductor process or a cutting process, or a method of transferring, by nanoimprinting, a pattern of a mold formed by a semiconductor process, a cutting process, or the like.

Figure 46A:
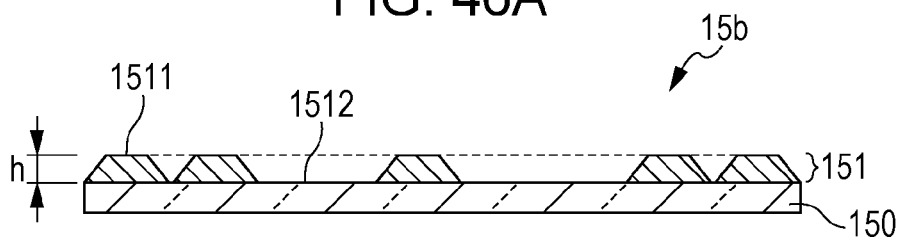
FIG. 46A is a sectional view of an optical sheet in the case where a material is directly processed to form an irregular shape.

FIG. 46A is a sectional view of the optical sheet 15b in the case where the irregular pattern is formed by directly processing a material by a semiconductor process or a cutting process. As illustrated in FIG. 46A, the light scattering layer 151 includes the projections 1511 and the recesses 1512, which are formed on a transparent substrate 150 and each of which has a tapered shape. The substrate 150 and the projections 1511 may either be formed of the same material or different materials. A semiconductor process is effective for micromachining in the case where the pattern is controlled on the order of micrometers. In the case where a semiconductor process is performed, a stepped structure having flat surfaces, that is, a structure having discrete height levels, can be easily formed. For example, a structure having two height levels can be formed by performing an etching process once. A structure having three or four height levels may be formed by performing the etching process twice. The tapered shapes of the projections 1511 and the recesses 1512 may be formed by various methods. For example, the tapered shapes can be formed by appropriately setting process conditions, such as the process pressure and the composition of the etching gas, when etching is performed in a semiconductor process. In the present embodiment, it is important that the irregular structure have a tapered shape, and the effects of the present embodiment are not affected by the manufacturing method.

Figure 46B:
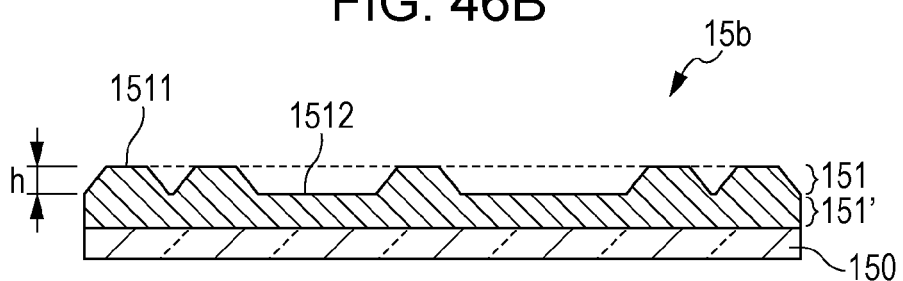
FIG. 46B is a sectional view of an optical sheet manufactured by nanoimprinting.

FIG. 46B is a sectional view of the optical sheet 15b in the case where the optical sheet 15b is manufactured by nanoimprinting. In the case where the optical sheet 15b is manufactured by nanoimprinting, first, a step of pressing a mold having a tapered shape against a liquid resin is performed. Then, a step of curing the resin is performed. An irregular pattern formed on the mold is transferred to the liquid resin, so that the projections 1511 and the recesses 1512 are formed. In this case, as illustrated in FIG. 46B, the resin includes a residual film portion 151' to which the irregular pattern on the mold is not transferred.

A transparent adhesive may be used to retain the optical sheet 15b having either of the structures illustrated in FIGS. 46A and 46B adjacent to the transparent substrate 14.

Figure 46C:
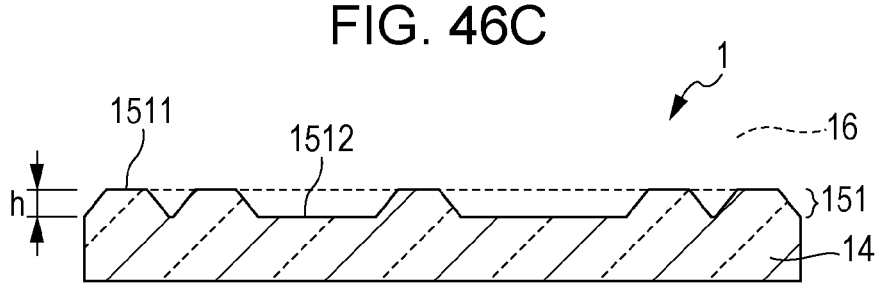
FIG. 46C is a sectional view of a part of a light emitting apparatus in the case where a light scattering layer is formed on a surface of a transparent substrate.

The light scattering layer 151 may be formed directly on a surface of the transparent substrate. FIG. 46C is a sectional view of a part of the light emitting apparatus 1 in the case where the light scattering layer 151 is formed on a surface of the transparent substrate 14 by a semiconductor process or a cutting process. Referring to FIG. 46C, first, the projections 1511 and the recesses 1512, each of which has a tapered shape, are formed on the transparent substrate 14. Then, the projections 1511 and the recesses 1512 are embedded in a material having a refractive index that differs from that of the transparent substrate 14. In this manner, the tapered irregular structure can be formed directly on the surface of the transparent substrate 14.

As described above, the tapered irregular structure according to the present embodiment can be formed by various methods. The manufacturing method for the light scattering layer according to the present embodiment and a light scattering sheet including the light scattering layer is not particularly limited, and any manufacturing method may be used as long as at least the recesses or the projections have a tapered shape.

Fifteenth Embodiment

Figure 47:
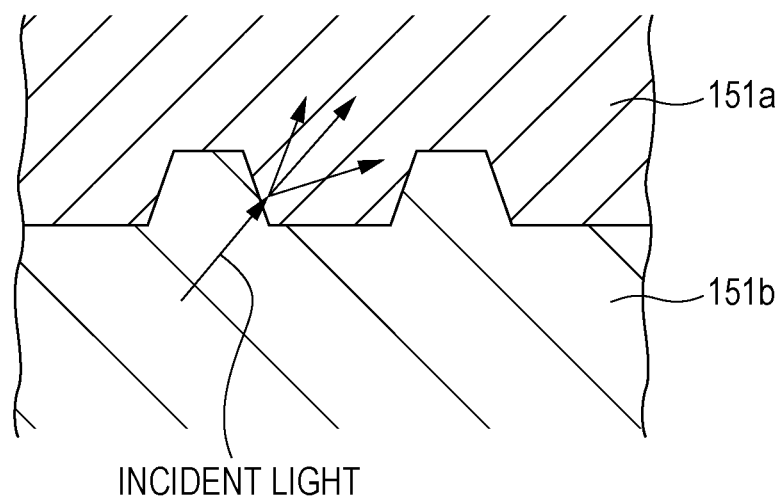
FIG. 47 illustrates the manner in which light is incident on a medium having a relatively low refractive index (low-refractive-index layer) from a medium having a relatively high refractive index (high-refractive-index layer).

A fifteenth embodiment will now be described. In this embodiment, the tapered irregular structure according to the fourteenth embodiment is applied to the light emitting apparatus 1C according to the second embodiment illustrated in FIG. 15A. In this embodiment, the light scattering layer having the tapered irregular structure is located between a medium having a relatively high refractive index and the transparent substrate. In other words, referring to FIG. 47, the transmittance of light from a medium having a relatively high refractive index (high-refractive-index layer) 151b to a medium having a relatively low refractive index (low-refractive-index layer) 151a is important. Accordingly, a configuration in which a tapered irregular structure having the pattern illustrated in FIG. 29A is located between the medium 151b having a refractive index of 1.75 and the medium 151a having a refractive index of 1.5 is considered.

Figure 48:
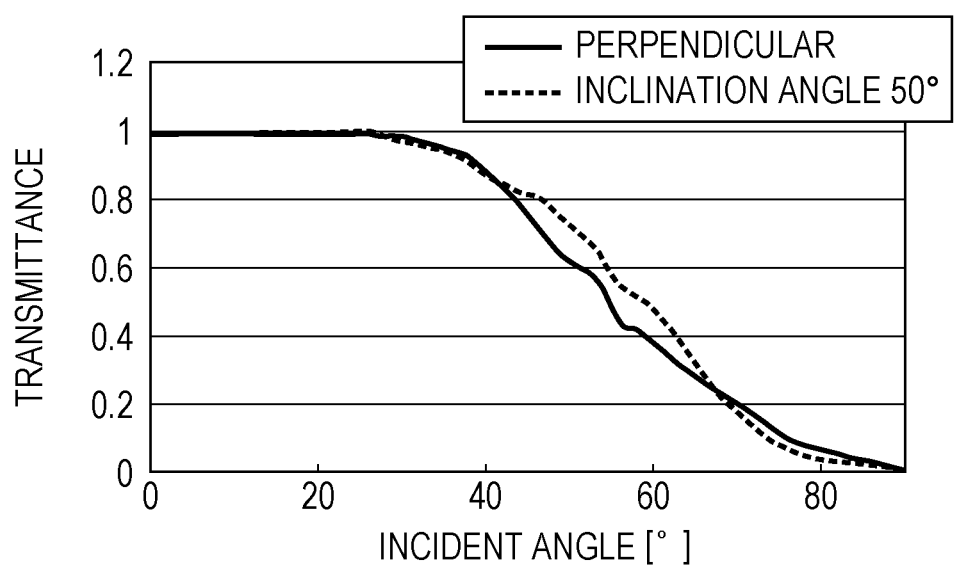
FIG. 48 is a graph showing the calculation result of the incident angle dependence of the light transmittance in a fifteenth embodiment.

FIG. 48 is a graph showing the calculation result of the incident angle dependence of light transmittance in the above-described configuration. Here, it is assumed that the diameter of the inscribed circle of each hexagon is 2 μm, the height of each hexagon is 1 μm, and the side walls of the irregular structure are inclined at 50 degrees. In FIG. 48, the solid line shows the result in the case where the side walls of the irregular structure are vertical (i.e. inclination angle is 90 degrees), and the dashed line shows the result in the case where the inclination angle is 50 degrees. These results show that the light transmittance can be increased when the incident angle is an intermediate angle in the range of about 40 to 70 degrees.

Figure 49:
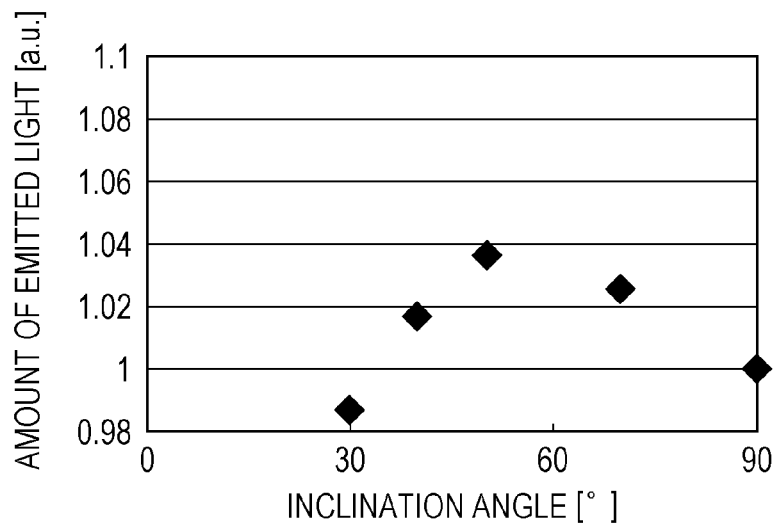
FIG. 49 is a graph showing the relationship between the inclination angle and the amount of emitted light according to the fifteenth embodiment.

Based on the above-described result, the present inventors have calculated the inclination angle dependence of the total amount of light extracted from the high-refractive-index layer 151b to the low-refractive-index layer 151a through the irregular structure (amount of emitted light) in the case where light present in the high-refractive-index layer 151b is isotropic. FIG. 49 is a graph showing the relationship between the inclination angle and the amount of emitted light. The amount of emitted light increases as the inclination angle decreases from 90 degrees (vertical), and reaches a maximum value when the inclination angle is 50 degrees. It has been found from the result shown in FIG. 49 that the light extraction efficiency can be increased when the inclination angle is in the range of 42 to 90 degrees.

According to the present embodiment, since the projections are tapered toward the top, the possibility that light transmitted through each projection will enter an adjacent projection can be reduced. This effect depends on the height and width of the irregular structure. Accordingly, the light transmittance of an irregular structure having a height increased to 8 μm without changing the size in the layer surface direction is calculated for each of the case in which the inclination angle of the side walls is 90 degrees (vertical) and the case in which the inclination angle is 70 degrees. Similar to the above-described calculation, assuming that light present in the high-refractive-index layer 151b is isotropic, the total amount of light emitted into the low-refractive-index layer 151a from the high-refractive-index layer 151b through the irregular structure is calculated. In this structure having high projections, light transmitted through each projection enters an adjacent projection irrespective of the incident angle. Therefore, the effect that the reduction in transmittance can be suppressed by the upwardly tapered upper portions cannot be observed. However, it is confirmed that the total amount of emitted light in the case where the inclination angle is 70 degrees is higher by about 0.9% than that in the case where the side walls in the irregular structure are vertical. This shows that the diffraction efficiency for the high-order light components is reduced and the light extraction efficiency at an intermediate incident angle is increased. This effect is obtained by making the corners of the irregular structure gentle irrespective of the height of the structure.

Modifications of Fourteenth and Fifteenths Embodiments

The irregular structures according to the fourteenth and fifteenth embodiments are not limited to the above-described structures as long as the irregular structures have a tapered shape. Examples of irregular structures having other shapes will now be described.

Figure 50A:
FIG. 50A illustrates a cross sectional shape of an irregular structure having side walls perpendicular to a layer surface according to the first to thirteenth embodiments.
Figure 50B:
FIGS. 50B to 50D illustrate other examples of cross sectional shapes of irregular structures having tapered shapes.
Figure 50C:
Figure 50D:

FIGS. 50A to 50D are diagrams for describing other examples of the shapes of the recesses and projections. FIGS. 50B to 50D illustrate other examples of cross sectional shapes of the irregular structure. FIG. 50A illustrates the cross sectional shape of the irregular structure having the side walls perpendicular to the layer surface according to the first to thirteenth embodiments. As illustrated in FIGS. 50B to 50D, instead of forming the side walls so as to be inclined linearly in cross section, the side walls may be formed so as to be at least partially curved in cross section. FIG. 50B illustrates the structure in which lower portions of the projections and recesses are curved. FIG. 50C illustrates the structure in which upper portions of the projections and recesses are curved. FIG. 50D illustrates the structure in which both the upper and lower portions of the projections and recesses are curved. Here, the "upper portions" are portions connecting the upper and side faces, and the "lower portions" are portions connecting the lower and side faces. Each of these shapes is formed such that the cross-sectional area of each of the projections and recesses is the same as that in the case where the side faces are vertical. In other words, the irregular structure is formed such that the cross-sectional area of each projection along a first plane that is perpendicular to the light scattering layer and that passes through the center of the projection is equal to the cross-sectional area of each recess along a second plane that is parallel to the first plane and that passes through the center of the recess.

Assuming that light present in the high-refractive-index layer is isotropic, the total amount of light emitted into the low-refractive-index layer from the high-refractive-index layer through the irregular structure is calculated for when the cross sectional shape of the irregular structure having the pattern illustrated in FIG. 29A is set to those illustrated in FIGS. 50B to 50D. Although the result is not illustrated, the amount of emitted light is increased by 4.3% with the shape illustrated in FIG. 50B, by 1.7% with the shape illustrated in FIG. 50C, and by 2.8% with the shape illustrated in FIG. 50D. Thus, it is confirmed that, also when the tapered shapes illustrated in FIGS. 50B to 50D are employed, the effect of increasing the light extraction efficiency can be obtained.

Figure 51A:
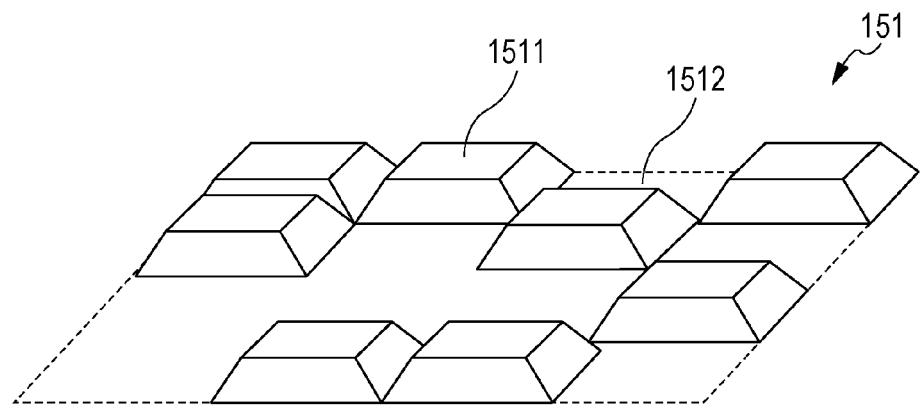
FIG. 51A is a perspective view of an example of a light scattering layer including projections having a truncated pyramidal shape with a square bottom.
Figure 51B:
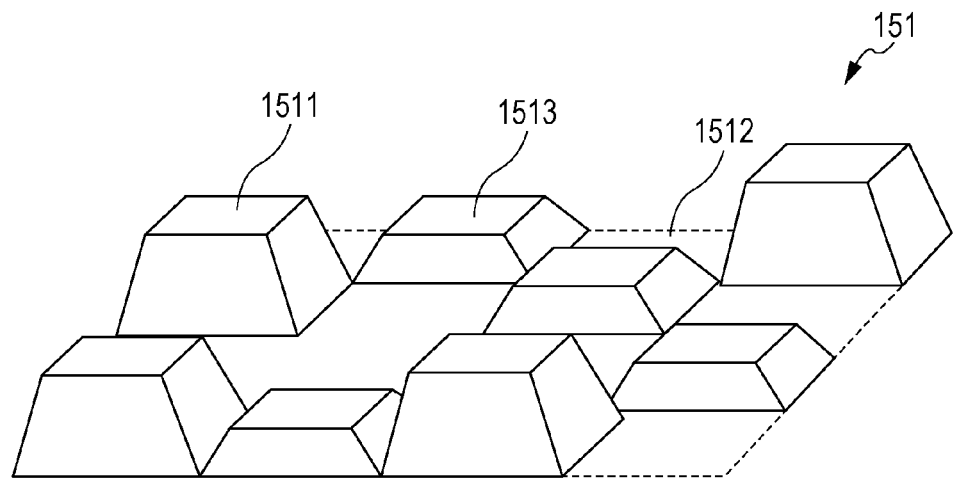
FIG. 51B is a perspective view of an example of a light scattering layer including, in addition to projections and recesses, second projections as third small areas.

The tapered shapes of the projections and recesses may be shapes other than the above-described shapes. The side walls may have any cross sectional shape in which straight and curved lines are combined. In other words, in a cross section of a projection or a recess taken along a plane that is perpendicular to the light scattering layer and that passes through the center of the projection or the recess, various shapes in which portions corresponding to the side faces are at least partially linear or curved may be employed. The shapes are not limited to those in which the projections have short upper sides and long lower sides, or in which recesses have long upper sides and short lower sides, and may instead be such that the projections have long upper sides and short lower sides. The recesses and projections do not necessary have a hexagonal shape in plan view, and may instead have other shapes, such as a rectangular shape. For example, as illustrated in FIG. 51A, the projections 1511 may have a truncated pyramidal shape with a square bottom. In addition, the side walls of the projections 1511 and the recesses 1512 may be formed so as to be tapered at one side and perpendicular to the layer surface at the other side. In addition, small areas having a height different from those of the first small areas (projections) and the second small areas (recesses) may be additionally formed. For example, as illustrated in FIG. 51B, the light scattering layer 151 may include second projections 1513 as third small areas in addition to the projections 1511 and the recesses 1512.

In the calculations in the fifteenth embodiment, it is assumed that light present in the high-refractive-index layer is isotropic. However, in practice, the intensity of light emitted from a light emitting apparatus is closer to the calculation result obtained when it is assumed that the emitted light has a Lambertian distribution. Accordingly, the calculation result obtained when it is assumed that the emitted light has a Lambertian distribution in the configuration of the fifteenth embodiment will now be described.

Figure 52A:
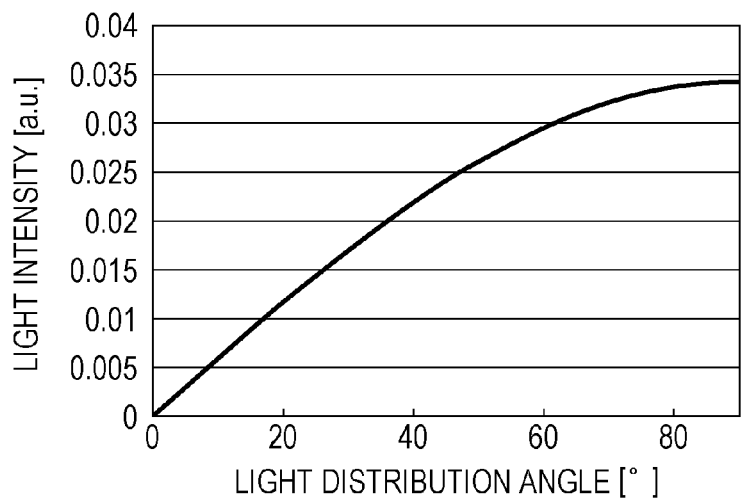
FIG. 52A is a graph showing the dependence of light intensity on the light distribution angle in the case of isotropic light emission.
Figure 52B:
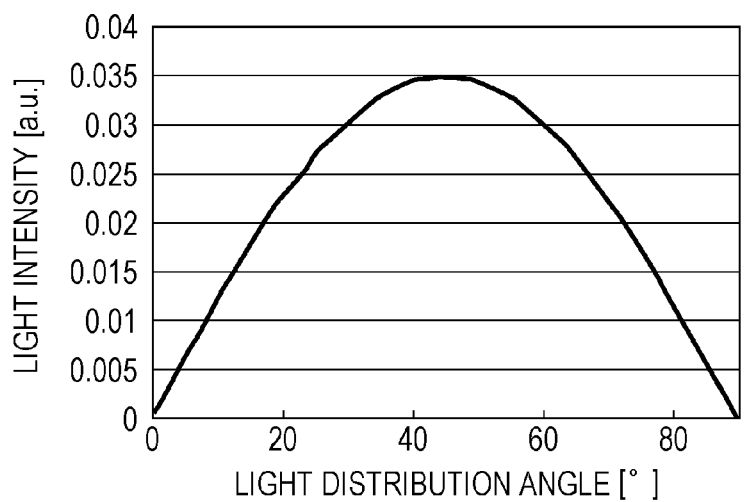
FIG. 52B is a graph showing the dependence of light intensity on the light distribution angle in the case of Lambertian light emission.
Figure 53:
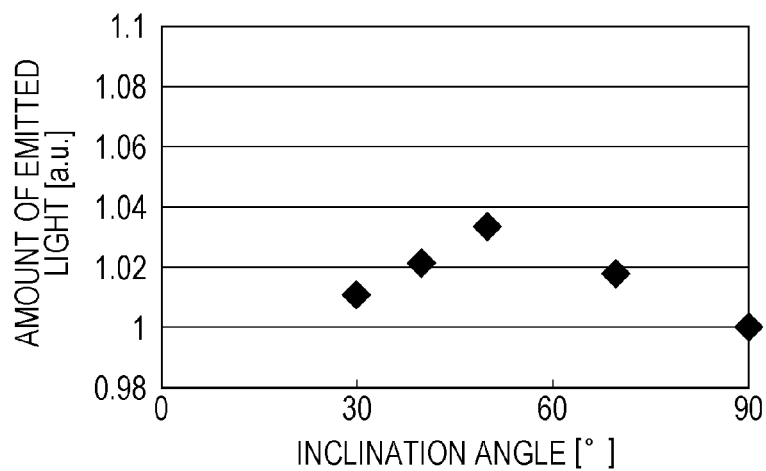
FIG. 53 is a graph showing the dependence of the amount of emitted light on the inclination angle in the case of Lambertian light emission.

FIG. 52A is a graph showing the dependence of light intensity on the light distribution angle in the case of isotropic light emission. FIG. 52B is a graph showing the dependence of light intensity on the light distribution angle in the case of Lambertian light emission. In the case of isotropic light emission, the light intensity has a peak at 90 degrees. In the case where of Lambertian light emission, the light intensity has a peak at around 45 degrees. FIG. 53 is a graph showing the inclination angle dependence of the amount of emitted light in the case of Lambertian light emission as in FIG. 52B. As is clear from FIG. 53, in the case of Lambertian light emission, the amount of emitted light increases as the inclination angle decreases from 90 degrees (vertical), and reaches a maximum value at 50 degrees. When the inclination angle is higher than or equal to 30 degrees, the light extraction efficiency is higher than that when the side walls are vertical. The total amount of light emitted when the shape of the side walls is changed from the linear shape to those illustrated in FIG. 50B to 50D is also calculated. As a result, the amount of emitted light is increased by 3.5% with the shape illustrated in FIG. 50B, by 1.7% with the shape illustrated in FIG. 50C, and by 2.6% with the shape illustrated in FIG. 50D. Thus, it is confirmed that, also in the case of Lambertian light emission, the light extraction efficiency can be increased when the shapes illustrated in FIGS. 50B to 50D are employed.

Sixteenth Embodiment

A sixteenth embodiment will now be described. This embodiment relates to a surface illumination apparatus including an organic electroluminescent (EL) panel having an optical sheet or a light scattering layer according to any of the above-described embodiments. In particular, the present embodiment provides a surface illumination apparatus in which a plurality of organic EL panels are connected together to form a single large organic EL panel unit and in which a connecting portion between the organic EL panels is not conspicuous.

Figure 54A:
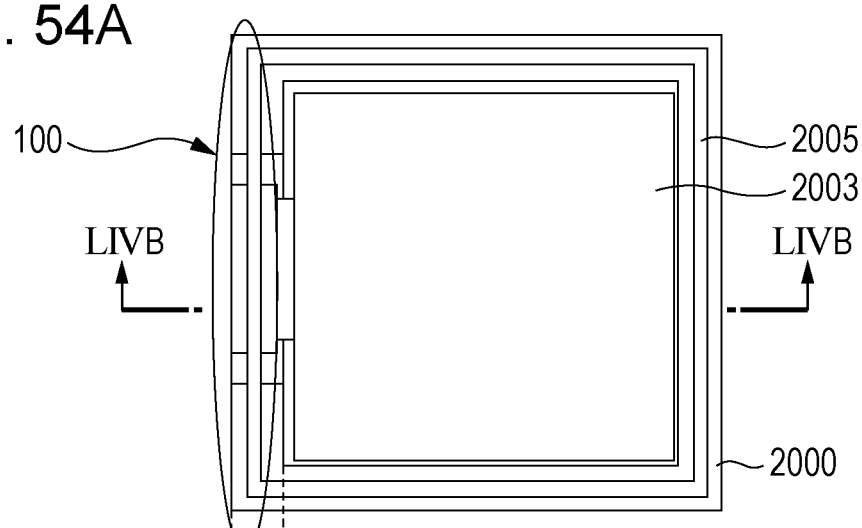
FIG. 54A is a plan view of a general structure of an organic EL panel.
Figure 54B:
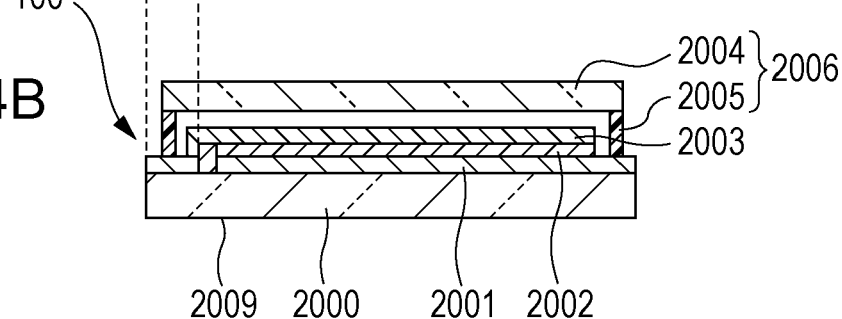
FIG. 54B is a sectional view of FIG. 54A taken along line LIVB-LIVB.

In recent years, surface illumination apparatuses including organic EL panels have been developed. For example, an organic EL panel illustrated in FIGS. 54A and 54B is known. FIG. 54A is a top view of the organic EL panel, and FIG. 54B is a sectional view of FIG. 54A taken along line LIVB-LIVB.

A patterned transparent electrode 2001 is formed on a transparent substrate 2000 made of glass or the like, and an organic layer 2002 in which an electron injection layer, an electron transport layer, a light emitting layer, a hole transport layer, and a hole injection layer are stacked together is formed on a part of the transparent electrode 2001. To apply a voltage to the organic layer, a reflective electrode 2003 is formed on the organic layer. The reflective electrode 2003 is made of, for example, Al, Ag, or an alloy thereof that has a high reflectance. Light passes through the transparent substrate 2000, and is emitted to the outside through an extraction surface 2009. In the following description, the multilayer structure including the transparent electrode 2001, the organic layer 2002, and the reflective electrode 2003 may sometimes be referred to as a "light emitting function layer".

The organic material of the organic layer 2002 deteriorates in an environment in which the material is exposed to oxygen or moisture, and therefore needs to be protected by being covered with a sealing structure 2006. The sealing structure 2006 includes, for example, a sealing substrate 2004 that faces the reflective electrode 2003 and a sealing member 2005 that connects the sealing substrate 2004 to the transparent substrate 2000 in a peripheral region of the transparent substrate 2000.

To apply a voltage to the organic EL panel, a feeding portion 100 is provided in the peripheral region of the transparent substrate 2000. The feeding portion 100 extends through a space between the sealing member 2005 and the transparent substrate 2000. The feeding portion 100 is electrically connected to the transparent electrode 2001 and the reflective electrode 2003.

To comply with a demand for a light source having a large illumination area, a single large organic EL panel unit may be formed by simply connecting a plurality of organic EL panels having the above-described structure together. In such a case, connecting portions between the adjacent organic EL panels are conspicuous since each organic EL panel has a non-illuminating peripheral region in which the feeding portion 100 and the sealing member 2005 are installed. Thus, the appearance of the organic EL panel unit is degraded.

Figure 55:
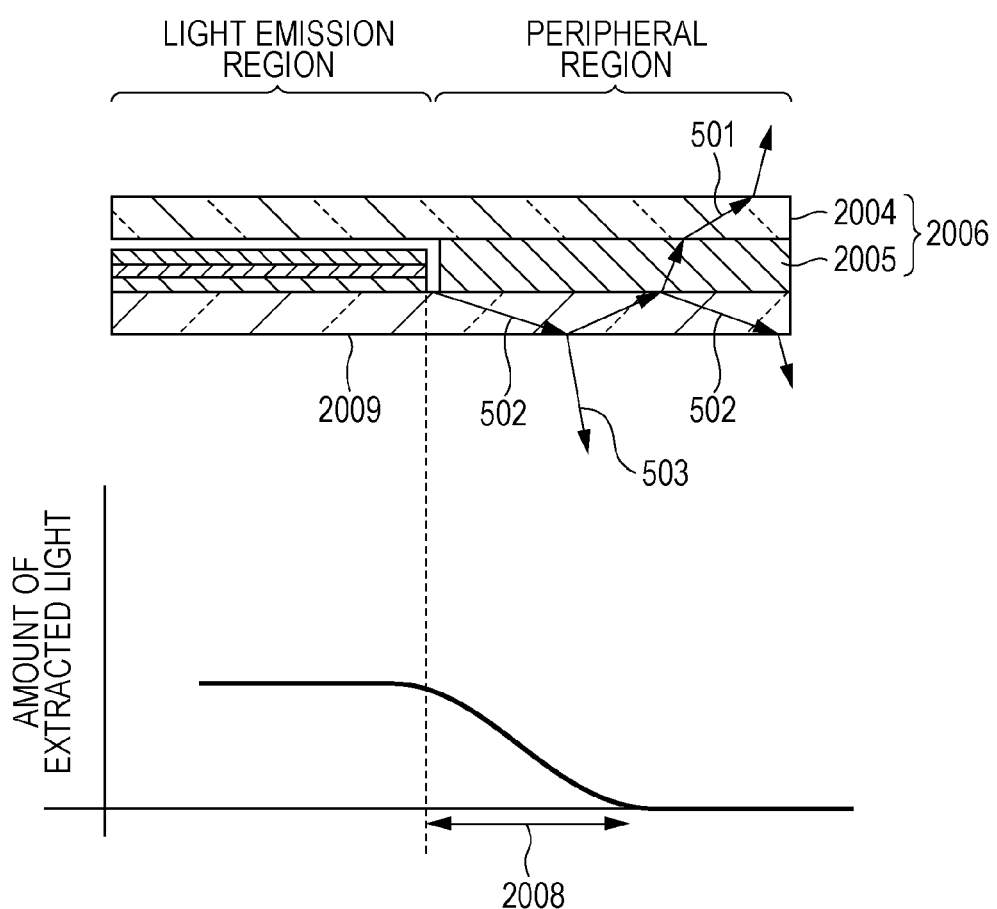
FIG. 55 is a diagram for describing the amount of light extracted from a region near an end portion of a light-emitting region of the organic EL panel.

FIG. 55 illustrates an enlarged view of a region around the boundary between the light emitting region and the peripheral region of an organic EL panel and the amount of light extracted from the extraction surface 2009 of the transparent substrate 2000. Here, the "light emitting region" is a region in which the light emitting function layer is arranged on the transparent substrate 2000, and the "peripheral region" is a non-illuminating region that surrounds the light-emitting region of the transparent substrate 2000. In FIG. 55, to facilitate understanding, the length of the peripheral region in the horizontal direction is increased.

A part of light emitted from the light emitting layer travels along the path shown by arrows 502 while being repeatedly totally reflected in the transparent substrate 2000. At this time, a component of the light having an angle greater than or equal to the total reflection angle with respect to the transparent substrate 2000 is gradually extracted to the outside from the transparent substrate 2000. Therefore, the peripheral region includes a fade region 2008 in which the amount of light gradually decreases. The width of the fade region 2008 differs depending on the distance from the light emitting layer to the extraction surface 2009.

In the case where the sealing member 2005 is not transparent, light from an organic EL panel arranged at the back is blocked and the connecting portion becomes conspicuous. The connecting portion can be made unrecognizable by human eyes by making the width of the peripheral region in which the sealing member 2005 is provided as small as possible. However, this is not practical because sufficient sealing performance cannot be obtained and the life of the organic EL panel will be reduced as a result.

The connecting portion can be made less conspicuous by using a transparent material for the sealing member 2005. In this case, the amount of light emitted from the connecting portion between the organic EL panels that overlap is the sum of the amounts of light transmitted through the fade regions 2008 of the respective organic EL panels. Therefore, the reduction in the amount of light emitted from the connecting portion between the organic EL panels can be suppressed.

However, even in such a case, the connecting portion is conspicuous unless the sealing member 2005 is sufficiently thin. There is a limit to how thin the peripheral region in which the sealing member 2005 is provided can be made. Therefore, additional measures are required to make the connecting portion between the organic EL panels less conspicuous while ensuring sufficient width of the peripheral region.

The present embodiment provides organic EL panels with which a connecting portion between the organic EL panels can be made less conspicuous and sufficient width of the peripheral region is ensured.

Figure 56A:
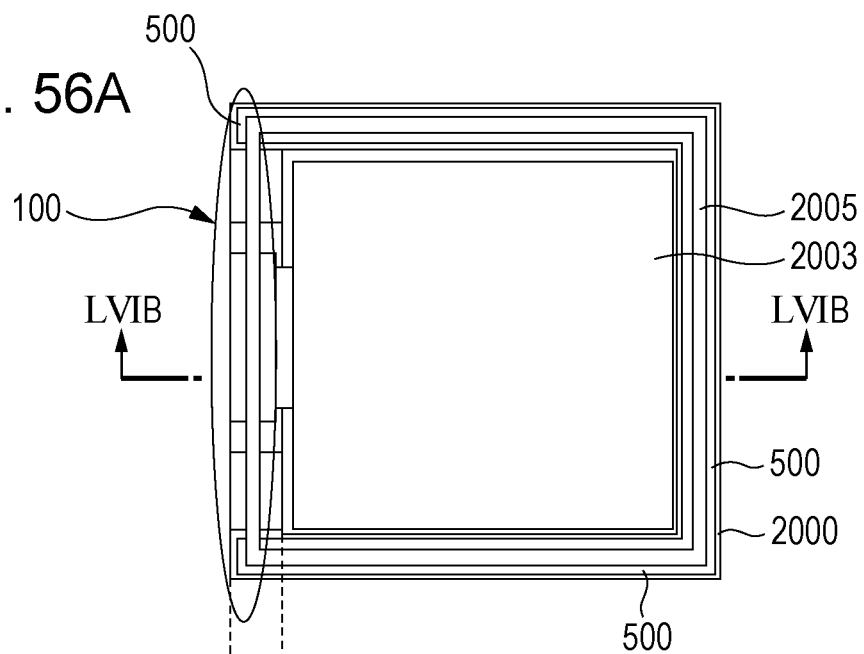
FIG. 56A is a plan view illustrating the structure of an organic EL panel according to a sixteenth embodiment.
Figure 56B:
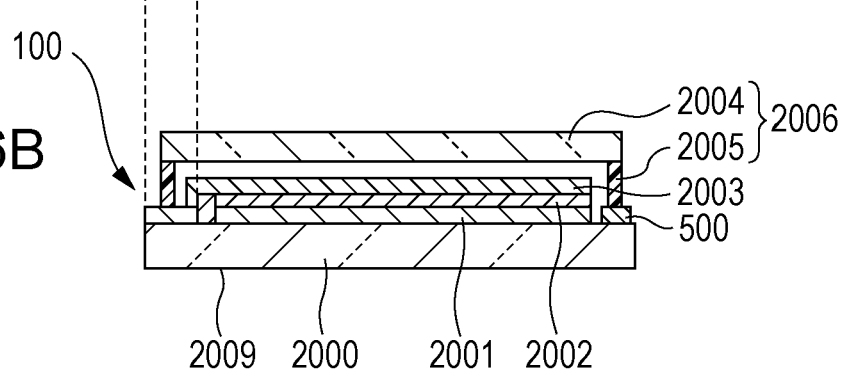
FIG. 56B is a sectional view of FIG. 56A taken along line LVIB-LVI.

FIGS. 56A and 56B are diagrams illustrating the structure of an organic EL panel according to the present embodiment. FIG. 56A is a top view of the organic EL panel, and FIG. 56B is a sectional view of FIG. 56A taken along line LVIB-LVIB. In FIGS. 56A and 56B, components similar to those in FIGS. 54A and 54B are denoted by the same reference numerals, and descriptions thereof are thus omitted.

A reflective film 500 is located between the sealing member 2005 and the transparent substrate 2000. The sealing member 2005 extends from an end portion of the sealing substrate 2004 toward the transparent substrate 2000. The reflective film 500 is located at least at one side of the organic EL panel, and is not necessarily located so as to extend along the entire periphery.

In FIGS. 56A and 56B, the feeding portion 100 is located at one side.

The reflective film 500 is made of, for example, Al, Ag, or an alloy thereof that has a high reflectance.

The sealing substrate 2004 and the sealing member 2005 are characterized by being made of an optically transparent material. For example, the sealing substrate 2004 is made of glass, and the sealing member 2005 is made of a transparent resin.

The width of the fade region 2008, which is included in the peripheral region of the organic EL panel and in which the amount of light gradually decreases, is determined by the distance from the light emitting layer included in the organic layer 2002 to the extraction surface 2009.

Although not illustrated in FIGS. 56A and 56B, any of the optical sheets or light scattering layers according to the first to fifteenth embodiments may be located between the transparent substrate 2000 and the transparent electrode 2001. Accordingly, the influence of total reflection between the transparent substrate 2000 and the transparent electrode 2001 can be suppressed and the light extraction efficiency can be increased.

Figure 57A:
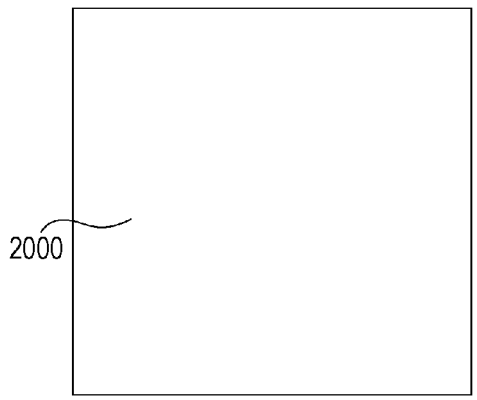
Figure 57A:
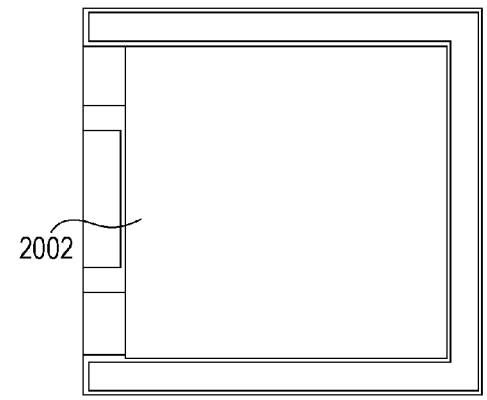
Figure 57B:
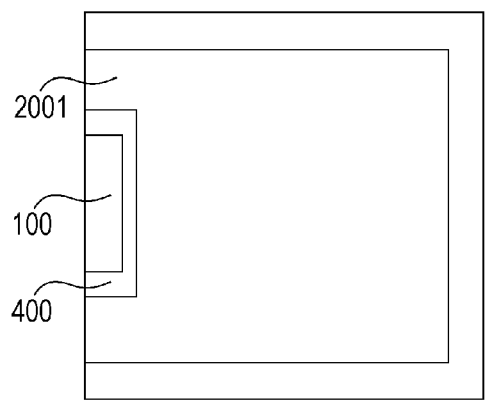
Figure 57E:
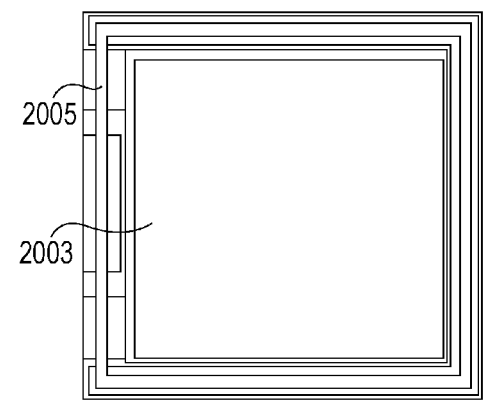
Figure 57C:
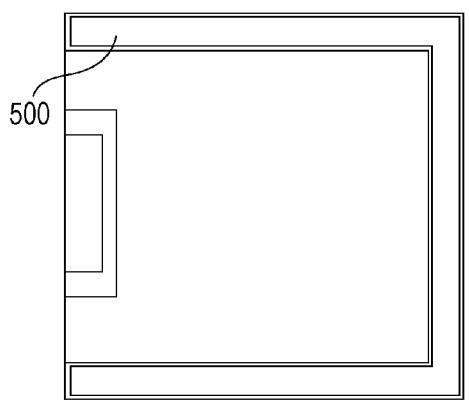

FIGS. 57A to 57F illustrate an example of a method for manufacturing the organic EL panel. First, the transparent substrate 2000 is prepared (FIG. 57A), and the transparent electrode 2001 made of indium tin oxide (ITO) or the like is formed on the transparent substrate 2000. A dividing portion 400 is formed by removing a portion of the transparent electrode 2001, so that the feeding portion 100 is formed (FIG. 57B). The reflective film 500 is formed in a region around the transparent electrode 2001 (FIG. 57C).

Figure 57F:
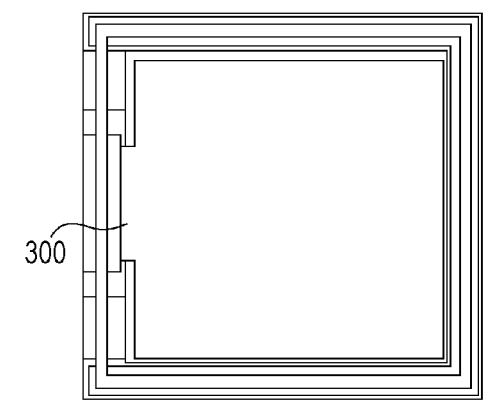

The organic layer 2002 is formed on the transparent electrode 2001 such that the organic layer 2002 overlaps the dividing portion 400 formed by removing a portion of the transparent electrode 2001 (FIG. 57D). The reflective electrode (metal electrode) 2003 is formed on the organic layer 2002 (FIG. 57E). With this structure, short-circuiting between the metal electrode 2003 and the transparent electrode 2001 can be prevented. Then, the sealing member 2005 made of an UV curing material or the like is formed (FIG. 57E), and the sealing substrate 2004 is stacked on the top and fixed. The reflective film 500 is formed of Al, Ag, or an alloy thereof. The metal electrode 2003 and the feeding portion 100 are connected to each other with a connecting portion 300 (FIG. 57F).

Figure 58:
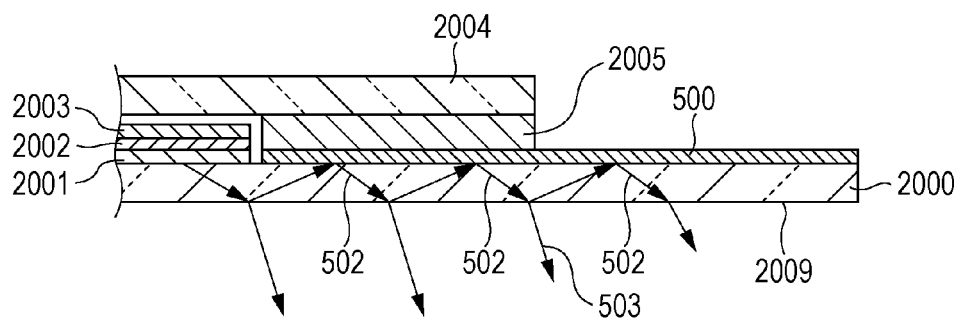
FIG. 58 is a diagram illustrating the manner in which light propagates in the sixteenth embodiment.

Referring to FIG. 58, propagation of light at the boundary of the light emitting region and the effect of the reflective film 500 will be described. When the reflective film 500 is not provided, as illustrated in FIG. 55, a part of the light emitted along the substrate is reflected by the extraction surface 2009 and returned, and travels toward the sealing substrate along the path shown by the arrow 501. Therefore, the light cannot be extracted to the outside. In contrast, when the reflective film 500 is provided, the light that is reflected by the extraction surface 2009 and returned can be reflected toward the transparent-substrate-2000 side along the paths shown by arrows 503, and extracted to the outside.

Figure 59:
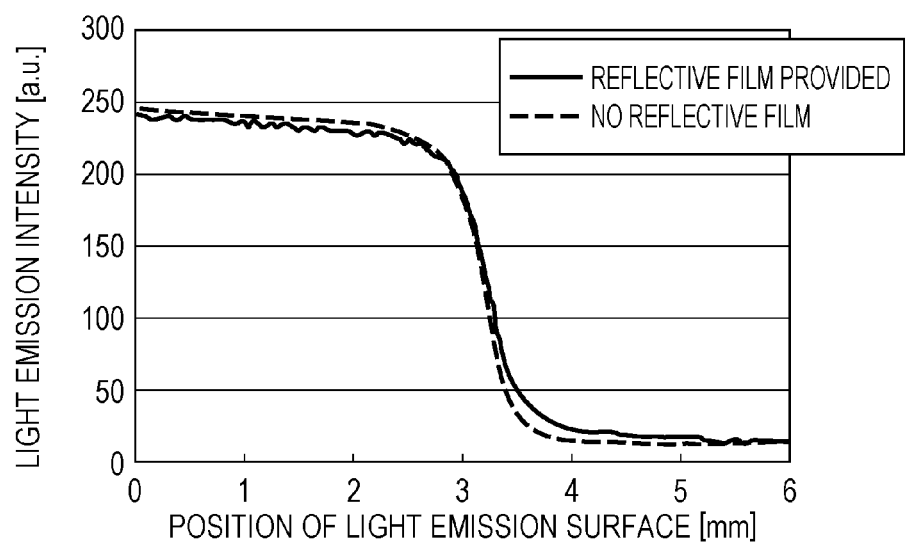
FIG. 59 is a graph showing the accumulated amount of extracted light according to the sixteenth embodiment.

FIG. 59 is a graph showing the amount of light extracted at the boundary of the light emitting region in the case where an Ag reflective film is provided. The dashed line shows the amount of light at each location in the case where the reflective film is not provided, and the solid line shows the amount of light at each location in the case where the reflective film is provided. When the reflective film is provided, the light is more effectively utilized, and the total amount of light that can be extracted is increased. Also, the amount of light decreases more gradually. Therefore, the width of the region in which the amount of light decreases, that is, the fade region, is increased. As a result, the width of the sealing member can be increased, and the sealing performance of the organic EL panel can be increased accordingly.

FIGS. 57A to 57F illustrate an example of a manufacturing method in which the external shape of the substrate is formed first. However, the method is not limited to this, and may instead be such that a plurality of organic EL panels are simultaneously formed on a large substrate first and then the substrate is cut.

It is known that total reflection is caused also by a difference in refractive index between the transparent electrode 2001 and the transparent substrate 2000 of the organic EL panel. The effect of the present embodiment can also be obtained in an organic EL panel in which any one of the light extraction structures according to the first to fifteenth embodiments is located between the transparent substrate 2000 and the transparent electrode 2001.

Seventeenth Embodiment

Figure 60A:
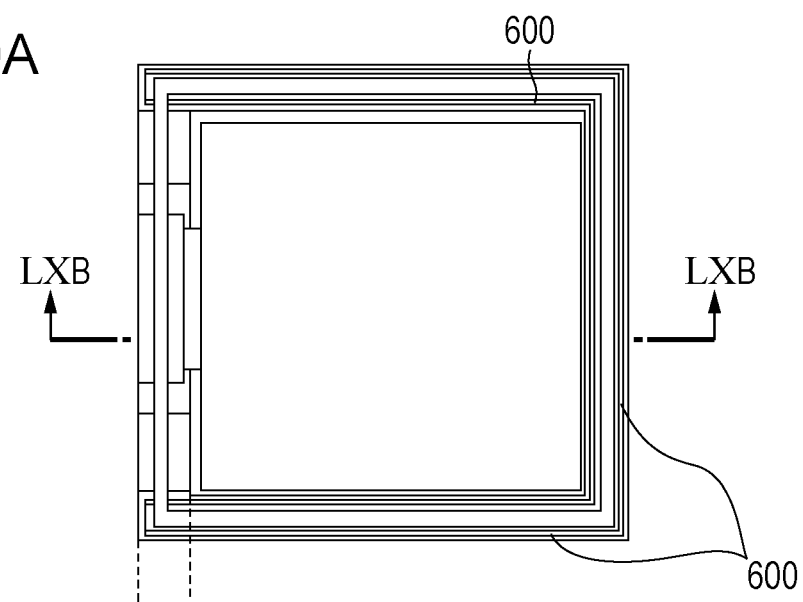
FIG. 60A is a plan view illustrating the structure of an organic EL panel according to a seventeenth embodiment.
Figure 60B:
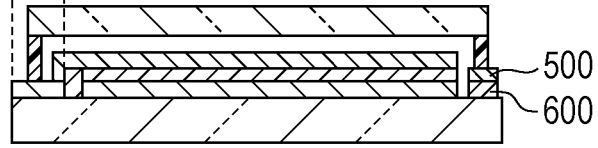
FIG. 60B is a sectional view of FIG. 60A taken along line LXB-LXB.

FIGS. 60A and 60B are diagrams illustrating the structure of an organic EL panel according to a seventeenth embodiment. FIG. 60A is a top view of the organic EL panel, and FIG. 60B is a sectional view of FIG. 60A taken along line LXB-LXB. In FIGS. 60A and 60B, components similar to those in FIGS. 56A and 56B are denoted by the same reference numerals, and descriptions thereof are thus omitted. This embodiment differs from the sixteenth embodiment in that a first adhesion layer 600 is provided between the transparent substrate 2000 and the reflective film 500.

Figure 61A:
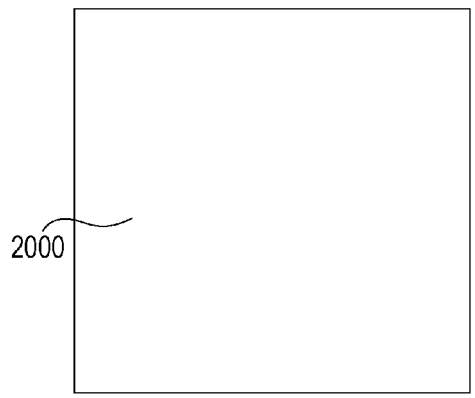
Figure 61A:
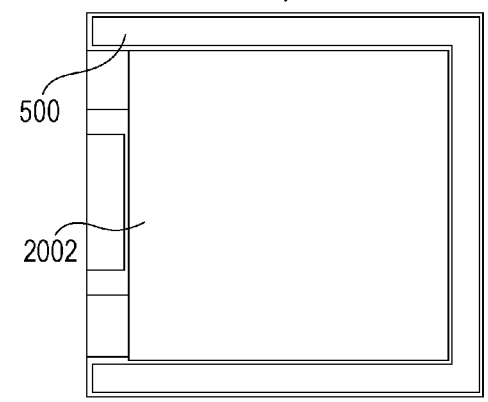
Figure 61B:
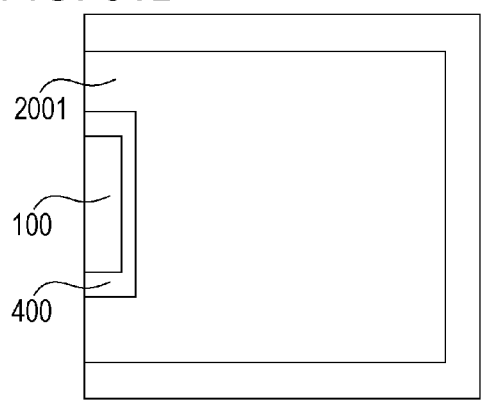
Figure 61E:
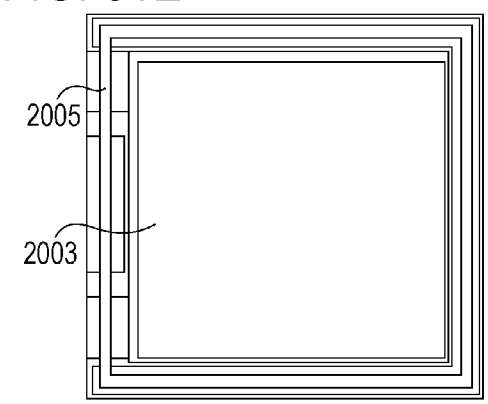
Figure 61C:
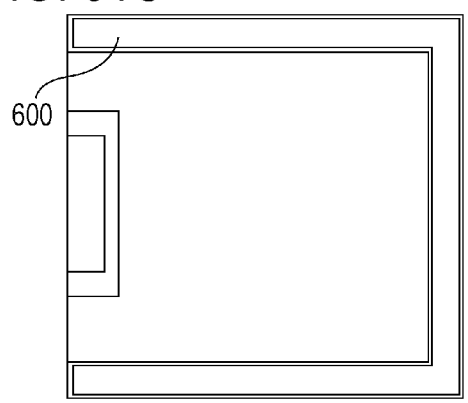
Figure 61F:
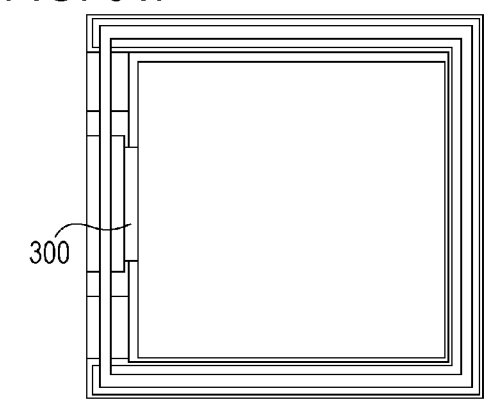

FIGS. 61A to 61F illustrate an example of a method for manufacturing the organic EL panel according to the present embodiment. This method differs from the method of the sixteenth embodiment in that the first adhesion layer 600 is formed after the patterned transparent electrode 2001 is formed (FIG. 61C). Other steps are similar to those of the method of the sixteenth embodiment.

To ensure good adhesion between the transparent substrate and the reflective film, the first adhesion layer 600 is made of glass paste or an oxide buffer layer ($Al_2O_3$).

Eighteenth Embodiment

Figure 62A:
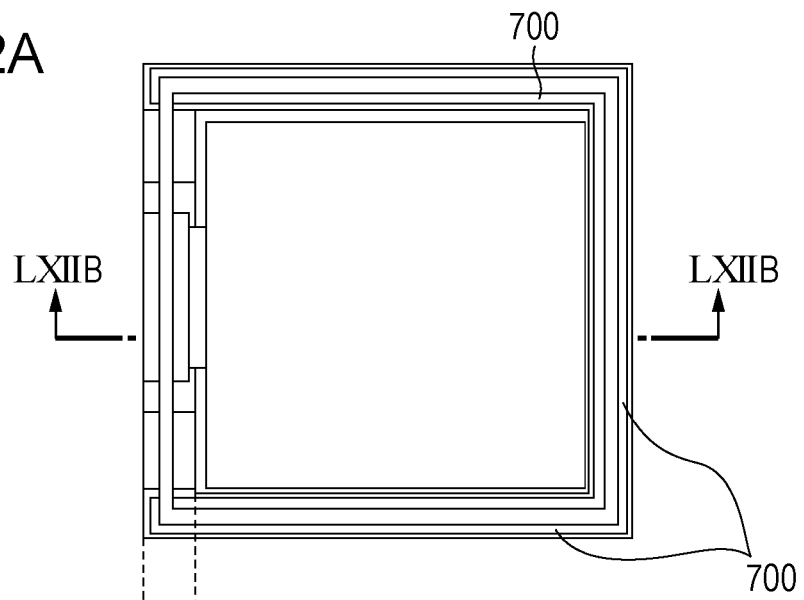
FIG. 62A is a plan view illustrating the structure of an organic EL panel according to an eighteenth embodiment.
Figure 62B:
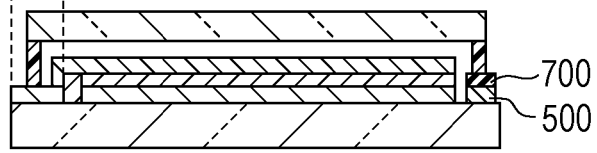
FIG. 62B is a sectional view of FIG. 62A taken along line LXIIB-LXIIB.

FIGS. 62A and 62B are diagrams illustrating the structure of an organic EL panel according to an eighteenth embodiment. FIG. 62A is a top view of the organic EL panel, and FIG. 62B is a sectional view of FIG. 62A taken along line LXIIB-LXIIB. In FIGS. 62A and 62B, components similar to those in FIGS. 56A and 56B are denoted by the same reference numerals, and descriptions thereof are thus omitted. This embodiment differs from the sixteenth and seventeenth embodiments in that a second adhesion layer 700 is provided between the reflective film 500 and the sealing member 2005.

Figure 63A:
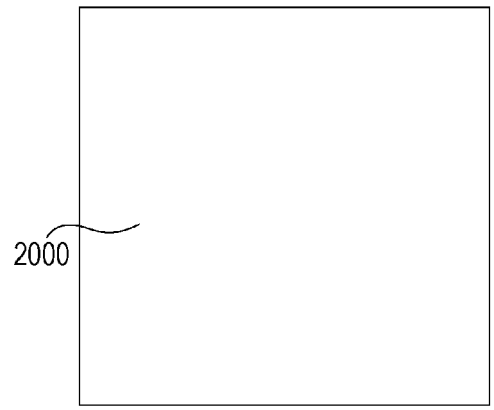
Figure 63A:
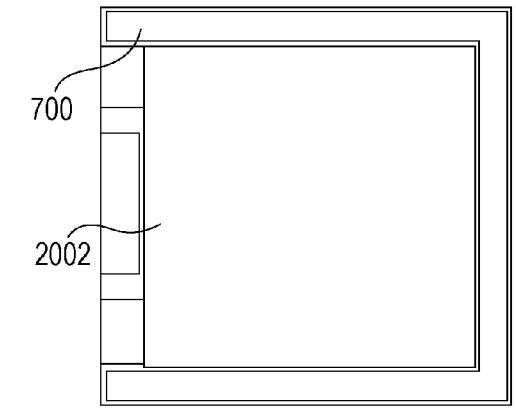
Figure 63B:
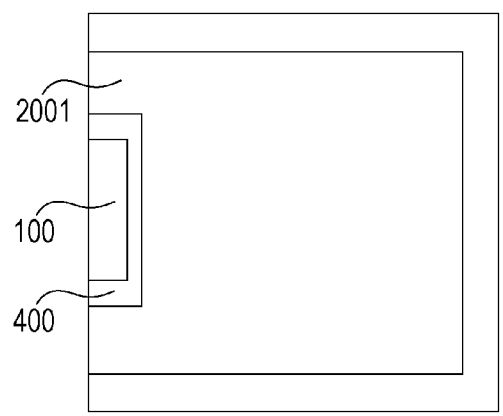
Figure 63E:
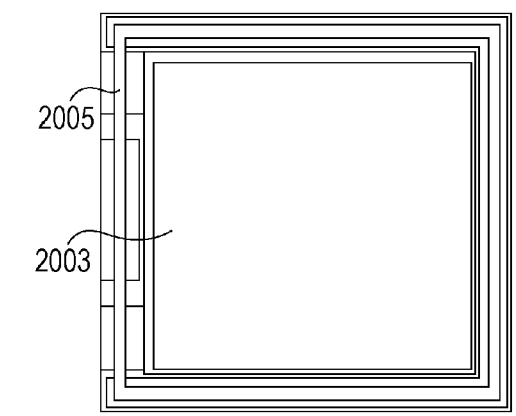
Figure 63C:
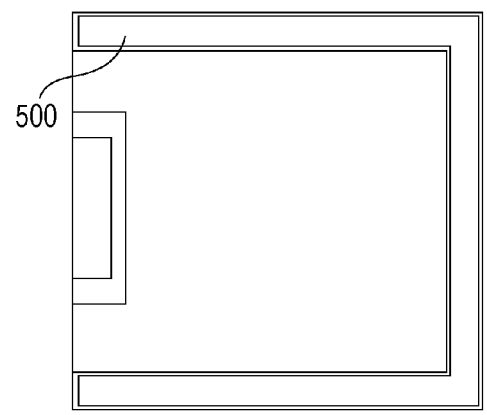
Figure 63F:
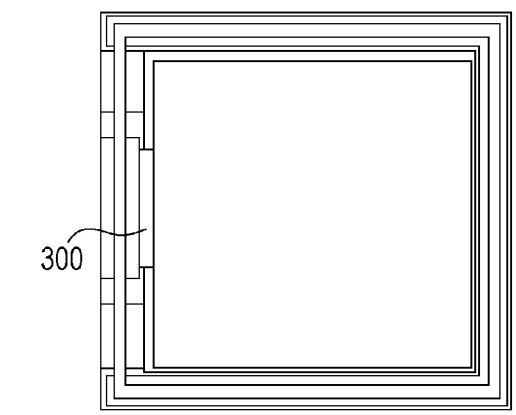

FIGS. 63A to 63F illustrate an example of a method for manufacturing the organic EL panel according to the present embodiment. This method differs from the methods of the sixteenth and seventeenth embodiments in that the second adhesion layer 700 is formed after the reflective film 500 is formed (FIG. 63D). Other steps are similar to those of the method of the sixteenth embodiment.

To ensure good adhesion between the reflective film 500 and the sealing member 2005, the second adhesion layer 700 is made of, for example, a silane coupling agent or an oxide-nitride buffer layer ($SiO_2$, $SiN$, $SiO_{2x}N_{1-2x}$, or ITO).

Nineteenth Embodiment

Figure 64A:
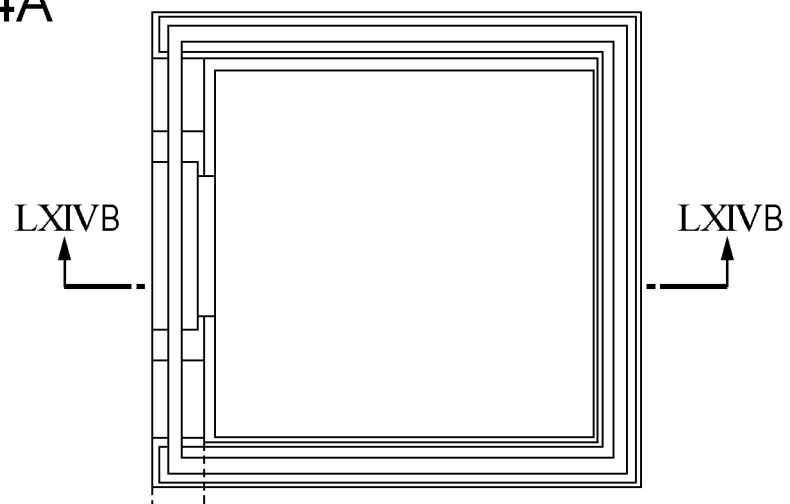
FIG. 64A is a plan view illustrating the structure of an organic EL panel according to a nineteenth embodiment.
Figure 64B:
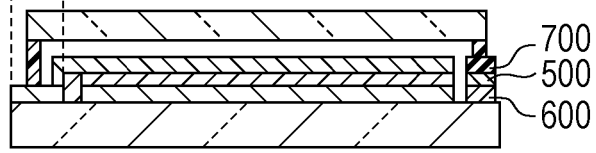
FIG. 64B is a sectional view of FIG. 64A taken along line LXIVB-LXIVB.

FIGS. 64A and 64B are diagrams illustrating the structure of an organic EL panel according to a nineteenth embodiment. FIG. 64A is a top view of the organic EL panel, and FIG. 64B is a sectional view of FIG. 64A taken along line LXIVB-LXIVB. In FIGS. 64A and 64B, components similar to those in FIGS. 56A and 56B are denoted by the same reference numerals, and descriptions thereof are thus omitted.

This embodiment differs from the sixteenth to eighteenth embodiments in that a first adhesion layer 600 is provided between the transparent substrate 2000 and the reflective film 500, and a second adhesion layer 700 is provided between the reflective film 500 and the sealing member 2005.

To ensure good adhesion between the transparent substrate 2000 and the reflective film 500, the first adhesion layer 600 is made of, for example, glass paste or an oxide buffer layer ($Al_2O_3$).

To ensure good adhesion between the reflective film and the sealing member, the second adhesion layer 700 is made of a silane coupling agent or an oxide-nitride buffer layer ($SiO_2$, SiN, $SiO_{2x}N_{1-2x}$, or ITO).

Figure 65A:
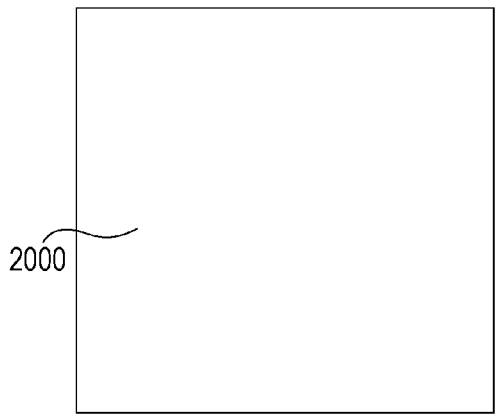
Figure 65A:
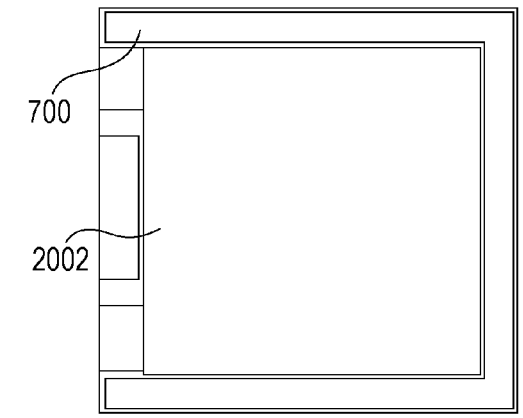
Figure 65B:
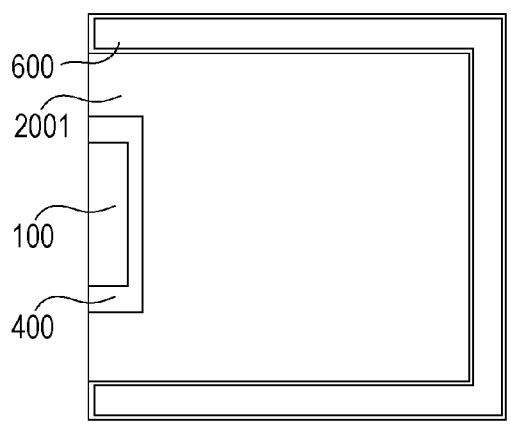
Figure 65E:
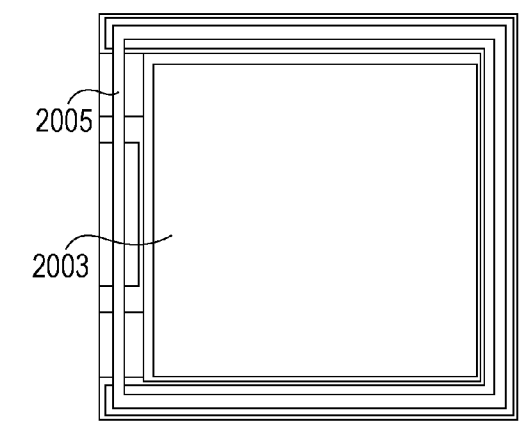
Figure 65C:
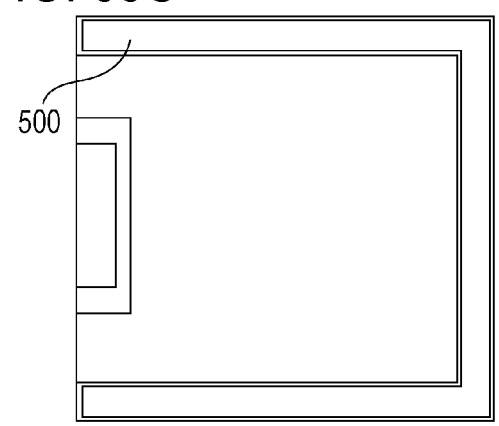
Figure 65F:
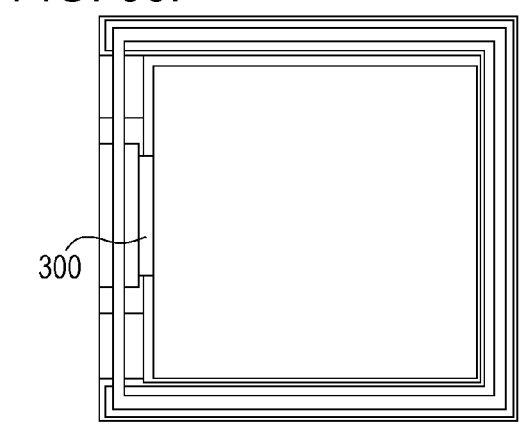

FIGS. 65A to 65F illustrate an example of a method for manufacturing the organic EL panel according to the present embodiment. This method differs from the method of the sixteenth to eighteenth embodiments in that the first adhesion layer 600 is formed between the transparent substrate and the reflective film 500 (FIG. 65B), and the second adhesion layer 700 is formed after the reflective film 500 is formed (FIG. 65D). Other steps are similar to those of the method of the sixteenth embodiment.

Twentieth Embodiment

In a twentieth embodiment, light that travels through the transparent substrate 2000 is used to make the boundary at the connecting portion between the organic EL panels less conspicuous. By changing the distance d between the central light emitting position of the light emitting layer included in the organic layer 2002 and the reflective electrode 2003, distribution pattern of light emitted from the light emitting layer can be changed so that the percentage of light that travels through the transparent substrate 2000 is increased.

A part of the light emitted from the light emitting layer directly travels toward the air layer, and another part of the light emitted from the light emitting layer travels toward the air layer after being reflected by the reflective electrode 2003. Since these light components interfere with each other, the pattern of the light emitted from the central light emitting position varies in accordance with the distance d between the central light emitting position and the reflective electrode 2003.

When the light emission direction is θ, the distance between the central light emitting position and the reflective electrode is d, and the center wavelength of the light is λ, the light intensity I(θ) in the θ direction can be expressed as follows:

$$I(\theta) \propto \sin^2(2\pi \cdot 2d \cos \theta / \lambda) \quad (4)$$

Figure 66A:
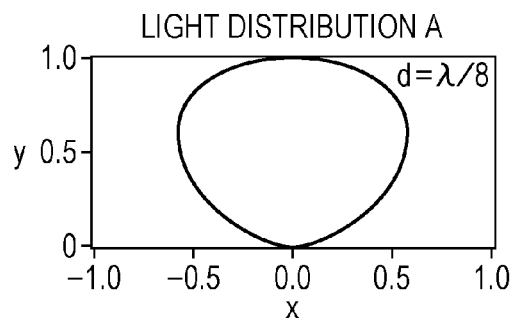
FIG. 66A illustrates a light distribution (light distribution A) expressed in polar coordinates.
Figure 66B:
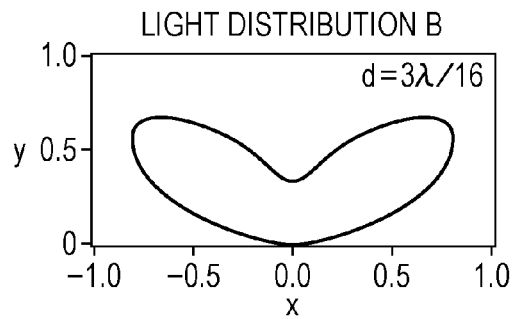
FIG. 66B illustrates a light distribution (light distribution B) expressed in polar coordinates.
Figure 66C:
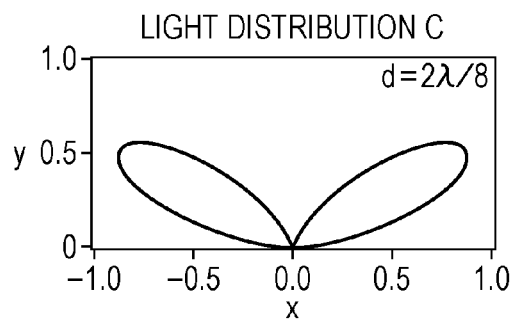
FIG. 66C illustrates a light distribution (light distribution C) expressed in polar coordinates.
Figure 66D:
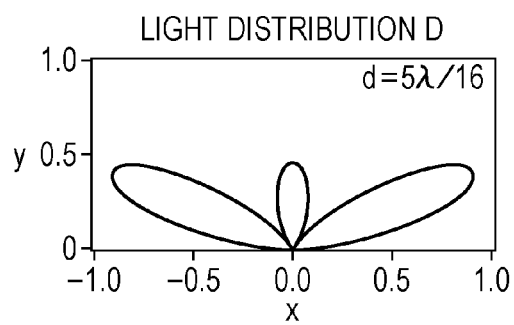
Figure 66E:
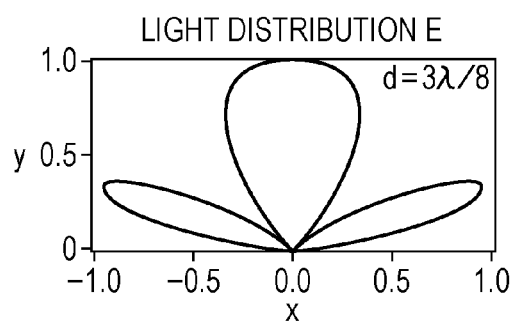

FIGS. 66A to 66E illustrate the distribution of light generated at the central light emitting position S expressed in polar coordinates in the cases where d/λ=⅛, 3/16, ⅜, 5/16, and ⅜, respectively. As illustrated in FIGS. 66A and 66E, for example, when d/λ=(2m+1)/8 (where m is an integer of 0 or more), the light emitted toward the front is enhanced as a result of interference. Also, as illustrated in FIG. 66C, for example, when d/λ=(2m)/8 (m is an integer of 1 or more), light emitted toward the front is weakened and light at the wide-angle sides are enhanced as a result of interference. The distribution of light generated at the central light emitting position S is those shown in FIGS. 66A to 66E irrespective of the presence or absence of a light extraction structure.

Accordingly, an organic EL panel in which the distance between the light emitting layer and the reflective electrode is greater than 3/16λ and light that travels through the transparent substrate 2000 is increased has been studied.

Figure 67:
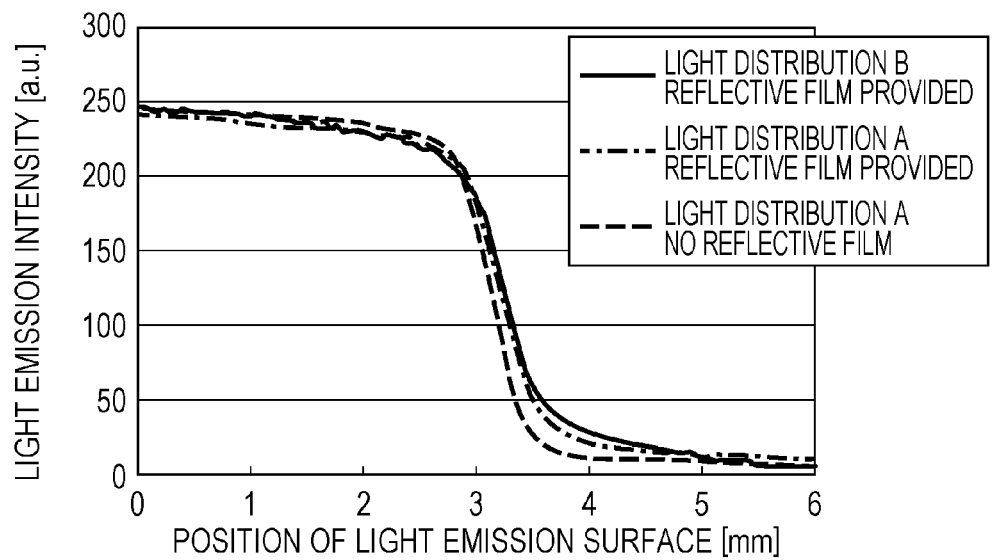

FIG. 67 is a graph showing the distribution of the amount of light at the boundary of the light emitting region in the cases where the light distribution is A and no Ag reflective film is provided (dashed line), the light distribution is A and an Ag reflective film is provided (one-dot chain line), and the light distribution is B and an Ag reflective film is provided (solid line). With light distribution B, the total amount of light that travels through the substrate is increased and the amount of light decreases more gradually in the region around the light-emitting region. Therefore, the positioning accuracy required when organic EL panels are stacked can be reduced. In addition, the width of the region in which the amount of light decreases in the region around the light emitting region, that is, the above-described fade region, is increased. As a result, the width of the sealing member can be increased, and the sealing performance of the organic EL panel can be further increased.

In the sixteenth to twelfth embodiments, structures in which a sealing member and a sealing substrate that are made of transparent materials are used to protect the organic layer from moisture and oxygen are described. However, the sealing method is not limited to this, and a similar effect can be achieved by any structure as long as the structure transmits light.

Figure 68:
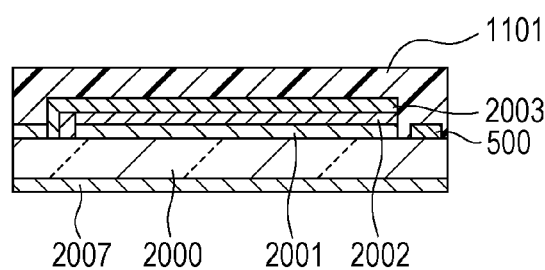

For example, as illustrated in FIG. 68, the sealing structure 2006 may be a transparent resin 1101 that functions as the sealing substrate 2004 and the sealing member 2005, and the organic EL panel may be sealed with the sealing structure 2006 having such an integral structure. In this case, the manufacturing steps can be simplified.

Any of the optical sheets or the light scattering layers according to the first to fifteenth embodiments may be provided on a surface of the transparent substrate 2000.

In general, the refractive indices of the organic layer 2002 and the transparent electrode 2001 are 1.8 or more, and total reflection occurs at the boundary between the transparent electrode 2001 and the transparent substrate 2000. To suppress the total reflection, a light extraction structure may be provided in the organic EL panel. Also with such an organic EL panel, the effect of making the connecting portion between the organic EL panel and another organic EL panel less conspicuous can be obtained by applying any of the structures of the sixteenth to twentieth embodiments. The light extraction structure may be, for example, an irregular structure including a diffraction grating, a microlens, or a pyramid structure with which the angle of light can be changed. In particular, a large effect can be expected when any of the light extraction structures according to the first to fifteenth embodiments is employed.

With the above-described structure, the organic EL panels according to the sixteenth to twentieth embodiments are useful in the case where a plurality of organic EL panels are arranged next to each other for use as a surface illumination apparatus that emits light in a desired shape. For example, the organic EL panels may be applied to a flat panel display, a backlight for a liquid crystal display apparatus, or an illumination light source. In addition, the organic EL panels according to the above-described embodiments may be applied not only to a single color light source but also to a white light emitting apparatus.

Twenty First Embodiment

Figure 69:
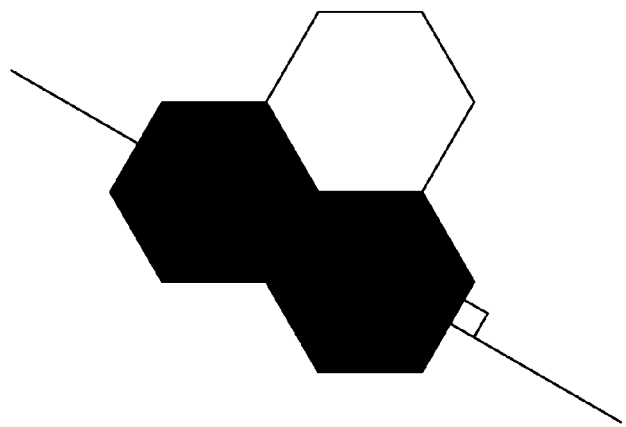

A twenty first embodiment will now be described. This embodiment differs from the first to thirteenth embodiments in that the cross-sectional area of the first small areas (projections) differs from that of the second small areas (recesses) in the light scattering layer. Here, the "cross-sectional area" means the area of cross section along a plane that is perpendicular to a surface of the light scattering layer (hereinafter also referred to as "layer surface") and that passes through the center of each projection or recess. For example, referring to FIG. 69, the area of a cross section of a projection or a recess along a plane that passes through the center of the projection or the recess and that is perpendicular to the side walls (that is, side faces) thereof (parallel to an arrangement direction) is the cross-sectional area of the projection or the recess. The "arrangement direction" means each of the directions in which the unit structures are two-dimensionally arranged. For example, in the irregular pattern including rectangular regions as illustrated in FIG. 2A, the x direction and the y direction are the "arrangement directions". In the irregular pattern including hexagonal regions as illustrated in FIG. 29A, three directions that are perpendicular to the sides of the hexagonal regions are the "arrangement directions".

Figure 70A:
Figure 70B:
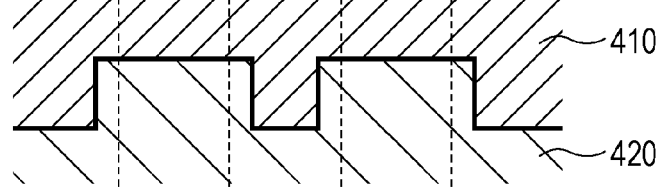
Figure 70C:
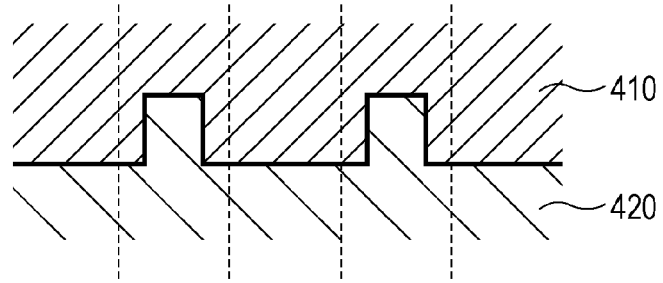

FIGS. 70A to 70C are diagrams for describing the cross sectional shapes of the irregular structure of the optical sheet according to the present embodiment. FIG. 70A illustrates an example of a cross sectional shape of any of the irregular structures according to the first to thirteenth embodiments, and FIGS. 70B and 70C are examples of cross sectional shapes of the irregular structure according to the present embodiment. In FIG. 70A, the recesses and projections have the same cross-sectional area. In contrast, in the present embodiment, as illustrated in FIGS. 70B and 70C, the recesses and projections have different cross-sectional areas. The light extraction efficiency in the case where the ratio between the cross-sectional areas of the recesses and projections is changed as illustrated in FIGS. 70B and 70C will now be described.

Each of the projections (referred to also as "projecting structures") according to the present embodiment is a portion that projects toward the light emission side, and includes an upper face, a lower face, and side faces (that is, side walls). Each of the recesses (referred to also as "recessed structures") is a portion located between the projections, and includes an upper face, a lower face, and side faces. The lower faces of the projections and the upper faces of the recesses are not necessarily interfaces between different media. The terms "upper face", "lower face", and "side face" refer to an upper face, a lower face, and a side face in the sectional views of FIGS. 70A to 70C. In other words, faces on which light from the light emitting layer is incident are referred to as "lower faces", and faces from which light is emitted are referred to as "upper faces".

Figure 71A:
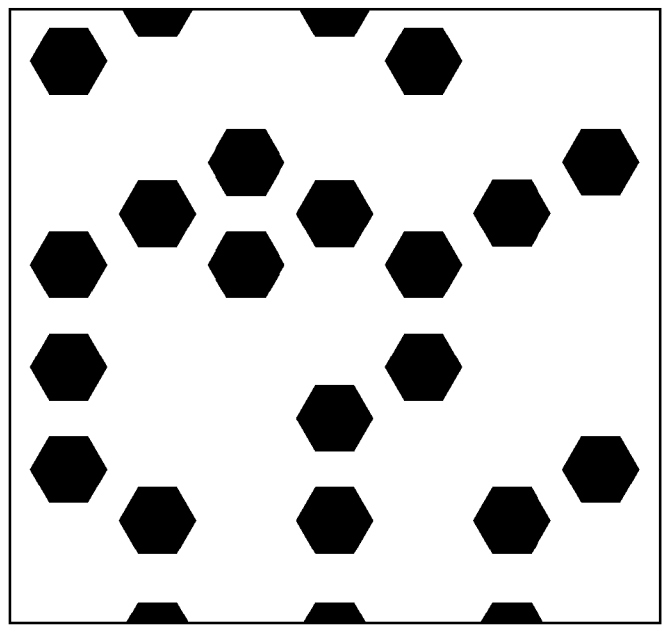
Figure 71B:
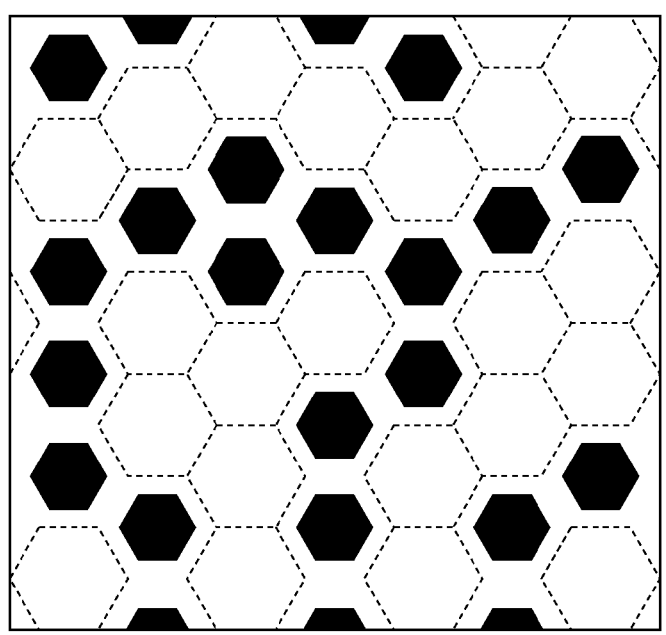

In the present embodiment, the cross-sectional areas of both the recesses and projections are changed while the side faces of the recesses and projections are maintained perpendicular to the light scattering layer. Here, the shapes of the recesses and projections are changed such that the centers of the recesses and projections are not shifted from the positions thereof before the cross sectional areas of the recesses and projections are changed. The terms "increase" and "decrease" in the cross sectional area mean as follows. The case in which the cross-sectional area of a high-refractive-index region 420 is increased (cross-sectional area of a low-refractive-index region 410 is reduced), as illustrated in FIG. 70B, is referred to as "increase". The case in which the cross-sectional area of the high-refractive-index region 420 is reduced, as illustrated in FIG. 70C, is referred to as "decrease". The structure in which the cross-sectional areas of the recesses and projections are changed corresponds to the structure in which the recesses are relatively large and the projections are relatively small, or the recesses are relatively small and the projections are relatively large, as illustrated in FIG. 71A. In FIG. 71B, the dotted lines show the unit structures of projections (white regions) in the case where the cross-sectional areas of the recesses and projections are not changed in the irregular pattern illustrated in FIG. 71A. As illustrated in FIG. 71B, in this example, the projections are enlarged and the recesses are reduced compared to those in the case where the cross-sectional areas of the recesses and projections are not changed. However, the positions of the centers of the projections and recesses on the light scattering layer are not changed. Thus, in the irregular pattern according to the present embodiment, the projections and recesses have different cross-sectional areas.

Figure 72A:
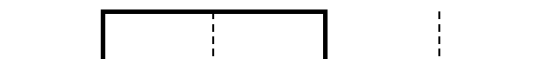
Figure 72B:
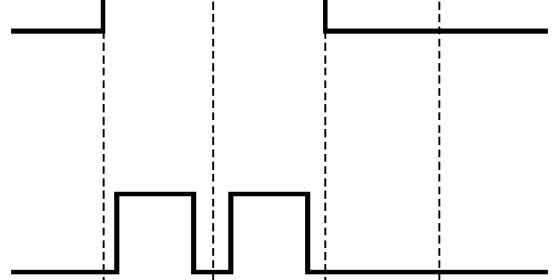
Figure 72C:
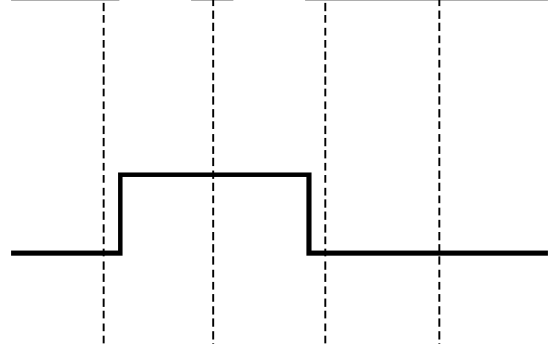
Figure 73:
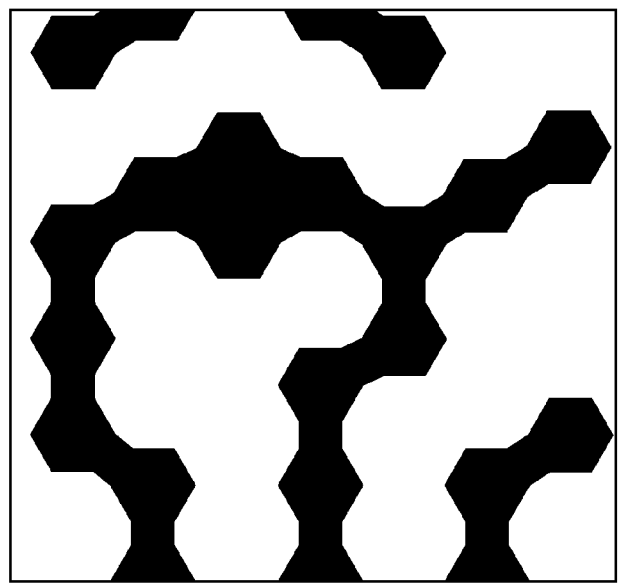

In the case where the cross-sectional area of projections or recesses that are adjacent to each other and that have the same height is changed, the space between two adjacent projections or two adjacent recesses may be formed so as to be flat. For example, in the case where the cross-sectional area of adjacent projecting structures illustrated in FIG. 72A is to be reduced, the cross-sectional area may be reduced as shown in FIG. 72C instead of FIG. 72B. When the cross-sectional area of each projecting structure is simply reduced, two adjacent projecting structures will be separated from each other, as illustrated in FIG. 72B. However, in this structure, contribution of the small recessed structure formed between the two adjacent projecting structures to increasing the light extraction efficiency is small. Therefore, in an actual irregular-structure manufacturing process, when the cross-sectional area of adjacent projecting structures is to be reduced, the cross-sectional area may be reduced at the boundaries between the projecting and recessed structures, as illustrated in FIG. 72C. In this case, the irregular structure can be easily manufactured. Although the case in which the projecting structures are reduced has been described, this also applies to the case in which the recessed structures are to be reduced. More specifically, small projecting structures between the adjacent recessed structures may be omitted. For example, an irregular structure illustrated in FIG. 73 may be employed.

In the calculations described below, when the cross-sectional area of the projecting structures is to be reduced, the projecting structures are not changed in regions between the adjacent projecting structures, and the cross-sectional area of the projecting structures is reduced only at the boundaries between the projecting structures and the recessed structures, as illustrated in FIG. 72C. However, the irregular structure is not limited to this, and a gap may be provided between the two adjacent projecting structures, as illustrated in FIG. 72B. Also in such a structure, when the width of the gap between the two projecting structures is about one-fourth of the wavelength or less, the gap only slightly affects the light, and therefore the influence on the light extraction efficiency is small.

Figure 74A:
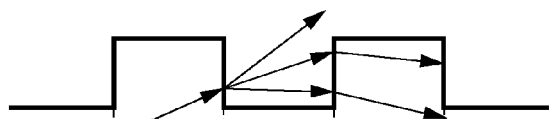
Figure 74B:
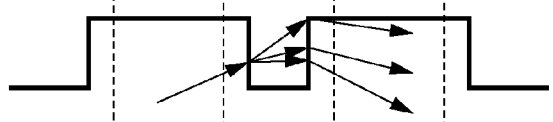
Figure 74C:
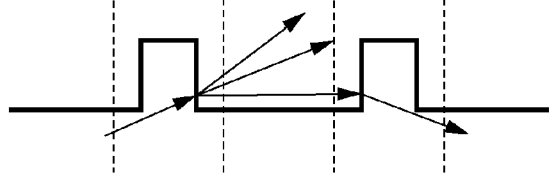

FIGS. 74A to 74C are diagrams for describing the effect of the present embodiment. FIGS. 74A to 74C respectively illustrate the manner in which light is transmitted in the case where the cross-sectional area of the irregular structure is not changed, in the case where the cross-sectional area of the projecting structures is increased, and in the case where the cross-sectional area of the projecting structures is reduced. In the case where the cross-sectional area of the projecting structures is increased, as illustrated in FIG. 74B, the effect that light transmitted through each projecting structure enters an adjacent projecting structure and returns toward the incident side is enhanced. Therefore, the percentage of light that passes through the irregular structure (transmittance) is reduced. In contrast, when the cross-sectional area of the projecting structures is reduced, as illustrated in FIG. 74C, the effect that light transmitted through each projecting structure enters an adjacent projecting structure and returns to the incident side is reduced. Therefore, the transmittance is increased.

Figure 75:
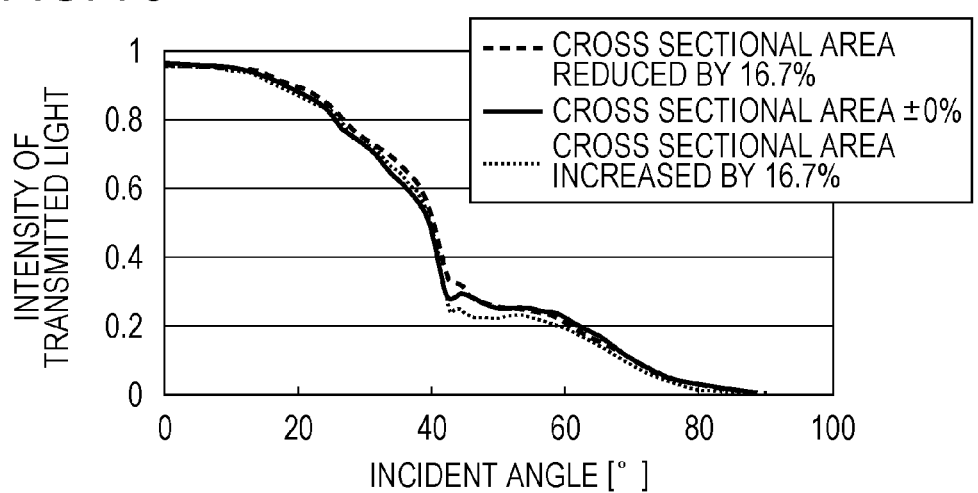

FIG. 75 is a graph showing the calculation result of transmittance characteristics in the case where the cross-sectional area of the projecting structures is changed in, for example, a light scattering layer having the pattern according to the eighth embodiment illustrated in FIG. 29A. In the calculation, it is assumed that the cross-sectional area of the projecting structures is changed in an optical sheet in which the diameter of an inscribed circle of each hexagon is 2 μm and the height of the irregular structure is 1 μm, and which is located between a substrate having a refractive index of 1.5 and air. In FIG. 75, the solid line shows the intensity of the transmitted light in the case where the cross-sectional area of the irregular structure is not changed, the dashed line shows the intensity of the transmitted light in the case where the cross-sectional area of the projecting structures is reduced by 16.7%, and the dotted line shows the intensity of the transmitted light in the case where the cross-sectional area of the projecting structures is increased by 16.7%. As is clear from FIG. 75, in the case where the cross-sectional area of the projecting structures is reduced by 16.7%, the intensity of the transmitted light is higher than that in the case where the cross-sectional area is not changed when the incident angle is in the range of 20 to 50 degrees. In the case where the cross-sectional area of the projecting structures is increased by 16.7%, the intensity of the transmitted light is lower than that in the case where the cross-sectional area is not changed when the incident angle is 42 degrees or more.

Next, the present inventors have calculated the total amount of light emitted into the air layer through the light scattering layer in the case where light present in the transparent substrate is isotropic. In the case where the cross-sectional area of the projecting structures is reduced by 16.7%, the amount of light is increased by 2.1% compared to that in the case where the cross-sectional area of the irregular structure is not changed. Thus, it is confirmed that the light extraction efficiency is increased. In contrast, in the case where the cross-sectional area of the projecting structures is increased by 16.7%, the amount of light is reduced by 4.1% compared to that in the case where the cross-sectional area of the irregular structure is not changed. Thus, in the structure of the present embodiment, it is confirmed that the light extraction efficiency can be increased when the cross-sectional area of the projections, in which the high-refractive-index layer has a relatively large thickness, is smaller than that of the recesses, in which the high-refractive-index layer has a relatively small thickness.

As described above, according to the present embodiment, the cross-sectional area of each projection along a first plane that is perpendicular to the light scattering layer and that passes through the center of the projection differs from the cross-sectional area of each recess along a second plane that is parallel to the first plane and that passes through the center of the recess. According to the present embodiment, the light extraction efficiency can be increased by setting the cross-sectional area of the projections to be smaller than that of the recesses.

In the present embodiment, the light extraction efficiency is reduced when the cross-sectional area of the projections is increased. However, as in a modification described later, even when the cross-sectional area of the projections is increased, there may be a case in which the light extraction efficiency can be increased. In the modification, the side walls of the irregular structure include portions that are inclined with respect to the direction perpendicular to the light extraction layer (thickness direction). Therefore, it is not necessary that the cross-sectional area of the projections be smaller than that of the recesses.

Twenty Second Embodiment

A twenty second embodiment will now be described. In this embodiment, the structure of the twenty first embodiment in which the cross-sectional area of the projecting structures is changed is applied to the light emitting apparatus 1C according to the second embodiment illustrated in FIG. 15A. In this embodiment, the light scattering layer in which the recesses and projections have different cross-sectional areas is located between a medium having a relatively high refractive index and the transparent substrate. In other words, referring to FIG. 76, the transmittance of light from a medium having a relatively high refractive index (high-refractive-index layer) 151b to a medium having a relatively low refractive index (low-refractive-index layer) 151a is important. Accordingly, the inventors considered a configuration in which a light scattering layer is located between the medium 151b having a refractive index of 1.75 and the medium 151a having a refractive index of 1.5. In the light scattering layer, the cross-sectional area of the irregular structure illustrated in FIG. 29A is changed.

FIG. 77 is a graph showing the dependence of the total amount of light emitted into the low-refractive-index layer from the high-refractive-index layer through the light scattering layer on the increase/decrease rate of the cross-sectional area in the above-described configuration. Here, it is assumed that the diameter of the inscribed circle of each hexagon is 2 μm, the height of each hexagon is 1 μm, and light present in the high-refractive-index layer is isotropic. As is clear from FIG. 77, in the case where the cross-sectional area of the projecting structures is reduced in the range of 0% to 16.7%, the total amount of light emitted into the low-refractive-index layer is higher than that in the case where the cross-sectional area of the irregular structure is not changed (0%). Thus, it is confirmed that the light extraction efficiency is increased.

When the thickness from the bottom parts of the recess structures to the top parts of the projecting structures is reduced, the possibility that light transmitted through each projecting structure will enter an adjacent projecting structure is reduced. This effect depends on the aspect ratio, which is the ratio between the height h from the bottom parts of the recess structures to the top parts of the projecting structures and the width w (diameter of inscribed circle) of the projecting structures. Here, the "width" used to determine the aspect ratio means the diameter of the inscribed circle of each unit structure before the cross-sectional area thereof is changed. For example, in the pattern including the regular hexagonal unit structures illustrated in FIG. 29A, the diameter of the inscribed circle of each regular hexagon corresponds to the "width". In the pattern including the square unit structures illustrated in FIG. 2A, the diameter of the inscribed circle of each square (that is, the above-described unit size w) corresponds to the "width". The present inventors have studied the effect of changing the aspect ratio by changing the size of the pattern in the layer direction while the height is fixed to 0.8 μm. Assuming that the light present in the high-refractive-index layer is isotropic, the total amount of light emitted into the low-refractive-index layer is calculated for each of the case in which the cross-sectional area of the projecting structures is not changed and the case in which the cross-sectional area of the projecting structures is reduced by 0.5%.

FIG. 78 is a graph showing the calculation result. In FIG. 78, the horizontal axis represents the aspect ratio, that is, the ratio of the height from the bottom parts of the recess structures to the top parts of the projecting structures to the diameter of the inscribed circle of each projecting structure before the cross-sectional area is changed. The vertical axis represents the ratio of the total amount of light obtained when the cross-sectional area of the projecting structures is reduced by 0.5% to the total amount of light obtained when the cross-sectional area of the irregular structure is not changed. As illustrated in FIG. 78, when the aspect ratio is higher than 1, the light extraction efficiency is not increased. This is because the percentage of light that is transmitted through a projecting structure and then enters an adjacent projecting structure is increased, and the effect obtained by reducing the thickness of the projecting structures cannot be obtained. The effect that cannot be obtained is reducing possibility that light transmitted through each projecting structure will enter an adjacent projecting structure. When the aspect ratio is lower than or equal to 1, the total amount of light is greater in the case where the cross-sectional area of the projecting structures is reduced by 0.5% than in the case where the cross-sectional area of the irregular structure is not changed. Thus, it is confirmed that the light extraction efficiency is increased.

Modifications of Twenty First and Twenty Second Embodiments

In the twenty first and twenty second embodiments, the shape of the irregular structure is not limited as long as the projections and recesses have different cross-sectional areas. Examples of irregular structures having other shapes will now be described.

Figure 79A:
Figure 79B:
Figure 79C:
Figure 79D:
Figure 79E:
Figure 79F:
Figure 79G:

FIGS. 79A to 79G are diagrams for describing other examples of the shapes of the recesses and projections. FIG. 79A illustrates the cross sectional shape of the irregular structure having the side walls perpendicular to the layer surface as in the irregular structure according to the first to thirteenth embodiments. FIGS. 79B to 79G illustrate other examples of irregular structures in which the cross-sectional area is changed. As illustrated in FIG. 79B to 79G, the side walls may include portions that are inclined with respect to the direction perpendicular to the layer surface. In the present specification, such a shape is referred to as a "tapered shape". FIG. 79B shows an example in which the entire side walls are linearly inclined so that the cross-sectional area of the projections is smaller than that of the recesses. FIG. 79C shows an example in which the entire side walls are linearly inclined so that the cross-sectional area of the projections is larger than that of the recesses. FIGS. 79D and 79E are examples in which lower portions of the projections and recesses are curved. The cross-sectional area of the projections is reduced in FIG. 79D, and increased in FIG. 79E. FIGS. 79F and 79G are examples in which upper portions of the projections and recesses are curved. The cross-sectional area of the projections is reduced in FIG. 79F, and increased in FIG. 79G.

The light extraction effect of the irregular structures having linear side walls, as in FIGS. 79B and 79C, are studied. More specifically, assuming that a light scattering layer having the irregular pattern illustrated in FIG. 29A is located between a medium having a refractive index of 1.75 and a medium having a refractive index of 1.45, the total amount of light emitted into the low-refractive-index layer through the light scattering layer is calculated. Here, it is assumed that the diameter of the inscribed circle of each hexagon in the irregular pattern is 2 μm, the height of the irregular pattern is 1 μm, and the irregular pattern has one of the cross sectional shapes of FIGS. 79B and 79C. It is also assumed that light present in the high-refractive-index layer is isotropic.

FIG. 80 shows the result of the calculation. In FIG. 80, the horizontal axis represents the increase/decrease rate (%) of the cross-sectional area of the projecting structures when the side faces of the irregular structure are inclined. Here, the inclination angle of the side walls is changed in accordance with the increase/decrease rate. For example, the case in which the increase/decrease rate is 0% corresponds to the structure illustrated in FIG. 79A, the case in which the increase/decrease rate is negative corresponds to the structure illustrated in FIG. 79B, and the case in which the increase/decrease rate is positive corresponds to the structure illustrated in FIG. 79C. The vertical axis represents the total amount of light that is normalized by that in the case where the cross-sectional area of the irregular structure is not changed (increase/decrease rate is 0%).

It is clear from the result illustrated in FIG. 80 that, when the cross-sectional area of the projecting structures is reduced in the range of 0% to 53%, the total amount of light is increased compared to that in the case where the cross-sectional area of the irregular structure is not changed. Thus, the light extraction efficiency is increased. In the case where the side walls of the irregular structure are perpendicular to the layer, the light extraction efficiency is increased when the cross-sectional area of the projecting structures is reduced in the range of 0% to 16.7%. In the present embodiment, with regard to the decrease rate of the cross-sectional area of the projecting structures, the upper limit of the decrease rate of the cross-sectional area at which the effect can obtained is increased to 53%. This is because in addition to the effect that the possibility that light incident on each projecting structure will enter an adjacent projecting structure and return to the incident side can be reduced, an effect that the light extraction efficiency can be increased by making the corners of the irregular structure gentle can be obtained. This effect will now be described.

FIGS. 81A, 81B, 82A, and 82B are diagrams for describing the influence of the inclination of the side walls on the intensity distribution of the diffracted light. FIGS. 81A and 81B illustrate an example in which the incident angle of the light incident on an optical sheet is an intermediate angle at which total reflection does not occur. FIGS. 82A and 82B illustrate an example in which the incident angle of the light incident on the optical sheet is an angle at which total reflection occurs. FIGS. 81A and 82A illustrate the manner in which light is diffracted by an optical sheet 15a including a light scattering layer having projections and recesses with side walls that are not inclined, and FIGS. 81B and 82B illustrate the manner in which light is diffracted by an optical sheet 15b including a light scattering layer having projections and recesses with side walls that are inclined. In each figure, the thickness of each arrow shows the intensity of the emitted light.

As is clear from FIGS. 81A and 81B, when the angle of the side walls of the irregular structure is reduced, high-order (for example, second-order or more) diffraction components can be weakened and low-order (for example, first-order) diffraction components can be enhanced. In the case where the incident angle of the light incident on the irregular structure is an intermediate angle at which the zeroth-order light is not totally reflected, in the structure in which the tapered shape is employed (see FIG. 81B), high-order diffraction components that are reflected because the sum of the incident angle and the diffraction angle exceeds 90° can be weakened. As a result, the percentage of light that passes through the irregular structure (transmittance) can be increased compared to that in the case where the side walls of the irregular structure are perpendicular to the layer surface (see FIG. 81A).

In the case where the incident angle of the light incident on the irregular structure is large and is greater than the angle at which total reflection of the zeroth-order light occurs, even in the structure in which the tapered shape is employed (FIG. 82B), low-order (first-order) diffraction components are reflected. Therefore, the effect obtained by changing the intensity proportion between the diffraction orders is small.

FIG. 83 is a graph showing the incident angle dependence of light transmittance in each of the case where the side faces of the irregular structure are perpendicular to the layer surface and the case where the side faces are inclined and the cross-sectional area of the projecting structures is reduced by 26%. When the incident angle is in the range of 24 degrees or more and 56 degrees or less, the transmittance is higher in the case where the cross-sectional area of the projecting structures is reduced by 26% than in the case where the cross-sectional area of the irregular structure is not changed (case in which the side faces are perpendicular to the layer surface).

As is clear from FIG. 80, according to the present embodiment, also when the cross-sectional area of the projecting structures is increased in the range of 0% to 30%, the total amount of light is greater than that in the case where the cross-sectional area of the irregular structure is not changed. Thus, the light extraction efficiency is increased. This is because the effect obtained by making the corners of the irregular structure gentle that the high-order diffraction components are weakened and the light extraction efficiency is increased is greater than the effect caused by increasing the cross-sectional area of the projecting structures that light incident on and transmitted through each projecting structure enters an adjacent projecting structure and the light extraction efficiency is reduced.

Also when the shapes illustrated in FIGS. 79D to 79G are employed, the light extraction efficiency is increased. Similar to the above-described calculation, assuming that a light scattering layer having the irregular pattern illustrated in FIG. 29A is located between a medium having a refractive index of 1.75 and a medium having a refractive index of 1.45, the total amount of light emitted into the low-refractive-index layer through the light scattering layer is calculated. Here, it is assumed that the diameter of the inscribed circle of each hexagon in the irregular pattern is 2 μm, the height of the irregular pattern is 1 μm, and the irregular pattern has one of the cross sectional shapes of FIGS. 79D to 79G. It is also assumed that light present in the high-refractive-index layer is isotropic. Although the calculation result is not illustrated, compared to the case where the cross-sectional area of the irregular structure is not changed and the side faces are perpendicular, the total amount of light is increased by +3% with the shape illustrated in FIG. 79D, by +0.4% with the shape illustrated in FIG. 79E, by +1.6% with the shape illustrated in FIG. 79F, and by +1.2% with the shape illustrated in FIG. 79G. Thus, it is confirmed that also when the irregular structures illustrated in FIGS. 79D to 79G are employed, the light extraction efficiency is increased.

Also for the tapered shapes illustrated in FIGS. 79B to 79G, the aspect ratio can be defined as the ratio between the height from the bottom parts of the recess structures to the top parts of the projecting structures and the diameter of the inscribed circle of each projecting structure. In this case, the inscribed circle is the same as that of a basic shape before the tapered shape is formed (for example, the shape illustrated in FIG. 79A). Also in the tapered irregular structures, the aspect ratio can be set to, for example, 1 or less.

In the twenty first and twenty second embodiments and the above-described modifications, the cross-sectional area of the recesses or projections is changed from that in a basic irregular pattern, for example, the pattern illustrated in FIG. 29A, without changing the center positions of the recesses and projections. However, the present disclosure is not limited to this. The recesses and projections may instead be formed so as to have different cross-sectional areas without using a basic irregular pattern. Furthermore, the cross-sectional area of at least the projections or recesses may be changed in any of the above-described irregular patterns other than the irregular pattern illustrated in FIG. 29A.

In the calculations in the twenty second embodiment and the modifications thereof, it is assumed that light present in the high-refractive-index layer is isotropic. However, in practice, the intensity of light emitted from a light emitting apparatus is closer to the calculation result obtained when it is assumed that the emitted light has a Lambertian distribution, as illustrated in FIG. 84. Accordingly, the calculation result obtained when it is assumed that the emitted light has a Lambertian distribution in the configuration of the twenty second embodiment will now be described.

FIG. 85 is a graph showing the calculation result of the total amount of light under the same conditions as those of the calculation in FIG. 77 except that it is assumed that the light has a Lambertian distribution in the high-refractive-index layer. It is clear from FIG. 85 that, when the cross-sectional area of the projecting structures is reduced in the range of 0% to 50%, the total amount of light emitted into the air layer is greater than that in the case where the cross-sectional area of the irregular structure is not changed. Thus, it is confirmed that the light extraction efficiency is increased.

FIG. 86 is a graph showing the calculation result of the dependence of the total amount of light on the ratio between the height and width (aspect ratio) of the projecting structures and recess structures under the same conditions as those of the calculation in FIG. 78 except that it is assumed that the light has a Lambertian distribution in the high-refractive-index layer. The vertical axis represents the ratio of the total amount of light obtained when the cross-sectional area of the projecting structures is reduced by 0.5% to the total amount of light obtained when the cross-sectional area of the irregular structure is not changed. As is clear from FIG. 86, it is confirmed that even when the aspect ratio is more than 1, the effect of increasing the light extraction efficiency can be obtained when the aspect ratio is 2 or less.

The total amount of light is also calculated for the modifications illustrated in FIGS. 79D to 79G on the assumption that the light emitted in the high-refractive-index layer has a Lambertian distribution. In this case, compared to the case where the cross-sectional area of the irregular structure is not changed, the total amount of light is increased by +2.8% with the shape illustrated in FIG. 79D, by +1.4% with the shape illustrated in FIG. 79E, by +2.5% with the shape illustrated in FIG. 79F, and by +1.5% with the shape illustrated in FIG. 79G. Thus, it is confirmed that the light extraction efficiency is increased.

Although optical sheets, light emitting apparatuses, optical sheet manufacturing methods, and light emitting apparatus manufacturing methods according to one or more aspects of the present disclosure have been described by way of embodiments, the present disclosure is not limited to the above-described embodiments. Various modifications of the embodiments that may be conceived by a person skilled in the art or embodiments obtained by combining constituent elements of different embodiments may be included in one or more aspects of the present disclosure as long as they do not depart from the spirit of the present disclosure.

In the above-described embodiments, a layer into which light is emitted from a light emitting apparatus is an air layer or a protecting layer. However, the layer is not limited to this, and may instead be, for example, a liquid layer.

In the above-described first to fifteenth, twenty first, and twenty second embodiments, to generate a phase difference between light that passes through each of the first small areas and light that passes through each of the second small areas, the first small areas are formed of projections and the second small areas are formed of recesses. However, the first small areas and the second small areas may instead be respectively formed of first media and second media having the same height and different refractive indices.

In the above-described first to twelfth, fourteenth, fifteenth, twenty first, and twenty second embodiments, only one optical sheet or light scattering layer is provided. However, in the case where there are more than one interfaces at which loss of light is caused by total reflection, a plurality of optical sheets or light scattering layers may be provided. When at least one of the optical sheets or light scattering layers is similar to any of the optical sheets or light scattering layers according to the above-described embodiments, that optical sheet or light scattering layer is included in the scope of the present disclosure. A plurality of optical sheets or light scattering layers may be located in the light emitting apparatus.

The first small areas and the second small areas have a rectangular shape in plan view in the first to seventh, ninth, and eleventh to thirteenth embodiments, and a hexagonal shape in plan view in the eighth, fourteenth, fifteenth, twenty first, and twenty second embodiments. However, the shape of each of the first small areas and the second small areas may be changed as appropriate. For example, the first small areas and the second small areas may each have a truncated conical shape or a conical shape. Alternatively, the first small areas and the second small areas may each have a cross sectional shape in which the corners are rounded. In practice, when structures having a size on the order of micrometers are formed by, for example, a cutting process or a semiconductor process, there may be a case in which corners are rounded or steps are inclined. Even if this occurs when the light scattering layer is processed, as long as the above-described characteristics of the patterns are present, optical sheets having first and second small areas with rounded corners are also included in the scope of the present disclosure.

The light emitting apparatuses according to the present disclosure may be applied to, for example, flat panel displays, backlights for liquid crystal display devices, or illumination light sources. The optical sheets according to the present disclosure maybe applied to the above-described light emitting apparatuses.

What is claimed is:

1. An optical sheet comprising:
a light scattering layer that scatters at least a part of light incident on the light scattering layer by diffraction and that includes first areas and second areas,
wherein each of the first areas is a projection and each of the second areas is a recess,
wherein each of at least the projections or the recesses has a tapered shape,
wherein, when a center wavelength of the light incident on the light scattering layer is $\lambda$ and a refractive index of a layer that is in contact with the light scattering layer at a light emission side is n, spatial frequency components of a pattern formed by the first areas and the second areas have a maximum peak at a spatial frequency in a range of $0.068/(\lambda \times n)$ or more and $2.8/(\lambda \times n)$ or less,
wherein each of the first areas is the projection having a flat surface and each of the second areas is the recess having a flat surface, and
wherein an average height from bottom parts of the recesses to top parts of the projections is 1.5 μm or less.

2. The optical sheet according to claim 1, wherein each of the projections includes an upper face, a lower face having an area larger than an area of the upper face, and a side face including a portion that is inclined with respect to a thickness direction of the light scattering layer.

3. The optical sheet according to claim 1, wherein, in a cross section of each projection or each recess taken along a plane that is perpendicular to the light scattering layer and that passes through a center of the projection or the recess, a portion corresponding to a side face of the projection or the recess is at least partially linear.

4. The optical sheet according to claim 1, wherein, in a cross section of each projection or each recess taken along a plane that is perpendicular to the light scattering layer and that passes through a center of the projection or the recess, a portion corresponding to a side face of the projection or the recess is at least partially curved.

5. The optical sheet according to claim 4, wherein, in the cross section of each projection or each recess, at least one of a connecting portion that connects the portion corresponding to the side face and a portion corresponding to an upper face of the projection and a connecting portion that connects the portion corresponding to the side face and a portion corresponding to a lower face of the recess is curved.

6. The optical sheet according to claim 1, wherein a cross-sectional area of each projection along a first plane that is perpendicular to the light scattering layer and that passes through a center of the projection is equal to a cross-sectional area of each recess along a second plane that is parallel to the first plane and that passes through a center of the recess.

7. The optical sheet according to claim 1, wherein a first cross-sectional area, which is a cross-sectional area of each projection along a first plane that is perpendicular to the light scattering layer and that passes through a center of the projection, differs from a second cross-sectional area, which is a cross-sectional area of each recess along a second plane that is parallel to the first plane and that passes through a center of the recess.

8. The optical sheet according to claim 7, wherein the first cross-sectional area is smaller than the second cross-sectional area.

9. The optical sheet according to claim 7, wherein the first cross-sectional area is larger than the second cross-sectional area.

10. The optical sheet according to claim 7, wherein, when a width of each of the projections and the recesses is w and a height from a bottom part of the recess to a top part of the projection is h, an aspect ratio h/w is 2 or less.

11. The optical sheet according to claim 10, wherein, the aspect ratio h/w is 1 or less.

12. The optical sheet according to claim 1, wherein a unit size of each of the first areas is 250 nm or more and 0.6 μm or less, and a unit size of each of the second areas is 250 nm or more and 0.6 μm or less.

13. A light emitting apparatus comprising:
a transparent substrate;
a first electrode;
a second electrode;
an organic EL light emitting layer that is provided between the first electrode and the second electrode and that emits light; and
a light scattering layer that is provided between the transparent substrate and the first electrode, that scatters at least a part of the light emitted from the organic EL light emitting layer by diffraction, and that includes first areas and second areas,
wherein each of the first areas is a projection and each of the second areas is a recess,
wherein each of at least the projections or the recesses has a tapered shape,
wherein, when a center wavelength of the light that is emitted from the organic EL light emitting layer toward the light scattering layer is $\lambda$ and a refractive index of a layer that is in contact with the light scattering layer at a light emission side is n, spatial frequency components of a pattern formed by the first areas and the second areas have a maximum peak at a spatial frequency in a range of $0.068/(\lambda \times n)$ or more and $2.8/(\lambda \times n)$ or less, wherein each of the first areas is the projection having a flat surface and each of the second areas is the recess having a flat surface, and wherein an average height from bottom parts of the recesses to top parts of the projections is 1.5 μm or less.

14. The light emitting apparatus according to claim 13, wherein a first cross-sectional area, which is a cross-sectional area of each projection along a first plane that is perpendicular to the light scattering layer and that passes through a center of the projection, differs from a second cross-sectional area, which is a cross-sectional area of each recess along a second plane that is parallel to the first plane and that passes through a center of the recess.

15. The light emitting apparatus according to claim 13, wherein each of the projections includes an upper face, a lower face having an area larger than an area of the upper face, and a side face including a portion that is inclined with respect to a thickness direction of the light scattering layer.

16. The light emitting apparatus according to claim 13, wherein, in a cross section of each projection or each recess taken along a plane that is perpendicular to the light scattering layer and that passes through a center of the projection or the recess, a portion corresponding to a side face of the projection or the recess is at least partially curved.

17. The light emitting apparatus according to claim 13, wherein, in the cross section of each projection or each recess, at least one of a connecting portion that connects the portion corresponding to the side face and a portion corresponding to an upper face of the projection and a connecting portion that connects the portion corresponding to the side face and a portion corresponding to a lower face of the recess is curved.

* * * * *